US012672348B2

(12) United States Patent
You et al.

(10) Patent No.: US 12,672,348 B2
(45) Date of Patent: Jun. 30, 2026

(54) SEMICONDUCTOR DEVICES

(71) Applicant: Samsung Electronics Co., Ltd.,
Suwon-si (KR)

(72) Inventors: Junggun You, Suwon-si (KR); Gigwan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 468 days.

(21) Appl. No.: 18/334,099

(22) Filed: Jun. 13, 2023

(65) Prior Publication Data

US 2024/0072056 A1     Feb. 29, 2024

(30) Foreign Application Priority Data

Aug. 24, 2022     (KR) ......................... 10-2022-0106105

(51) Int. Cl.
*H10D 84/85*        (2025.01)
*H10D 30/01*        (2025.01)
        (Continued)

(52) U.S. Cl.
CPC ......... *H10D 84/853* (2025.01); *H10D 30/014* (2025.01); *H10D 30/024* (2025.01); *H10D 30/43* (2025.01); *H10D 30/6211* (2025.01); *H10D 30/6735* (2025.01); *H10D 30/6757* (2025.01); *H10D 62/121* (2025.01); *H10D 62/151* (2025.01); *H10D 64/017* (2025.01);
        (Continued)

(58) Field of Classification Search
CPC .. H10D 84/853; H10D 30/014; H10D 30/024; H10D 30/43; H10D 30/6211; H10D 30/6735; H10D 30/6757; H10D 62/121; H10D 62/151; H10D 64/017; H10D 64/514; H10D 64/518; H10D 84/0167; H10D 84/017; H10D 84/0179; H10D 84/0181; H10D 84/0188; H10D 84/0193; H10D 84/038; H10D 84/856; H10D 30/6736; H10D 30/797; H10D 30/62; H10D 62/822; H10D 84/83; H10D 84/85; H10D 84/0142; H10D 84/0158; H10D 84/834; H10D 64/517; B82Y 10/00
See application file for complete search history.

(56) References Cited

U.S. PATENT DOCUMENTS

| | | | |
|---|---|---|---|
| 8,629,477 B2 | 1/2014 | Lochtefeld et al. | |
| 8,629,478 B2 | 1/2014 | Ko et al. | |

(Continued)

*Primary Examiner* — Fernando L Toledo
*Assistant Examiner* — Shawn Shaw Muslim
(74) *Attorney, Agent, or Firm* — Muir Patent Law, PLLC

(57) ABSTRACT

A semiconductor device includes first and second active fins on first and second regions of a substrate, an isolation pattern on a boundary between the first and second regions and portions of the first and second regions adjacent thereto and separating the first and second active fins, a first gate structure on the first active fin and the isolation pattern on the first region, a second gate structure on the second active fin and the isolation pattern on the second region, a first source/drain layer on the first active fin adjacent to the first gate structure, and a second source/drain layer on the second active fin adjacent to the second gate structure. A width of a portion of the first gate structure overlapping the first active fin is greater than that of a portion of the second gate structure overlapping the second active fin.

20 Claims, 71 Drawing Sheets

(51) Int. Cl.

| | |
|---|---|
| *H10D 30/43* | (2025.01) |
| *H10D 30/62* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 64/27* | (2025.01) |
| *H10D 84/01* | (2025.01) |
| *H10D 84/03* | (2025.01) |

(52) U.S. Cl.

CPC ......... *H10D 64/514* (2025.01); *H10D 64/518* (2025.01); *H10D 84/0167* (2025.01); *H10D 84/017* (2025.01); *H10D 84/0179* (2025.01); *H10D 84/0181* (2025.01); *H10D 84/0188* (2025.01); *H10D 84/0193* (2025.01); *H10D 84/038* (2025.01); *H10D 84/856* (2025.01); *H10D 30/6736* (2025.01)

(56) References Cited

U.S. PATENT DOCUMENTS

| | | | |
|---|---|---|---|
| 8,656,322 | B1 | 2/2014 | Dechene et al. |
| 9,691,775 | B1 | 6/2017 | Licausi et al. |
| 9,768,305 | B2 | 9/2017 | Ko et al. |
| 9,853,029 | B2 | 12/2017 | You et al. |
| 10,374,072 | B2 | 8/2019 | Nuzzo et al. |
| 10,605,859 | B2 | 3/2020 | Salem et al. |
| 10,672,890 | B2 | 6/2020 | Lee et al. |
| 10,847,514 | B2 | 11/2020 | Yoo et al. |
| 11,183,497 | B2 | 11/2021 | Lee et al. |
| 11,211,453 | B1 | 12/2021 | Gu et al. |
| 2018/0254338 | A1* | 9/2018 | Kim ..................... H10D 30/024 |
| 2021/0118985 | A1* | 4/2021 | Li ........................ H10D 84/834 |

* cited by examiner

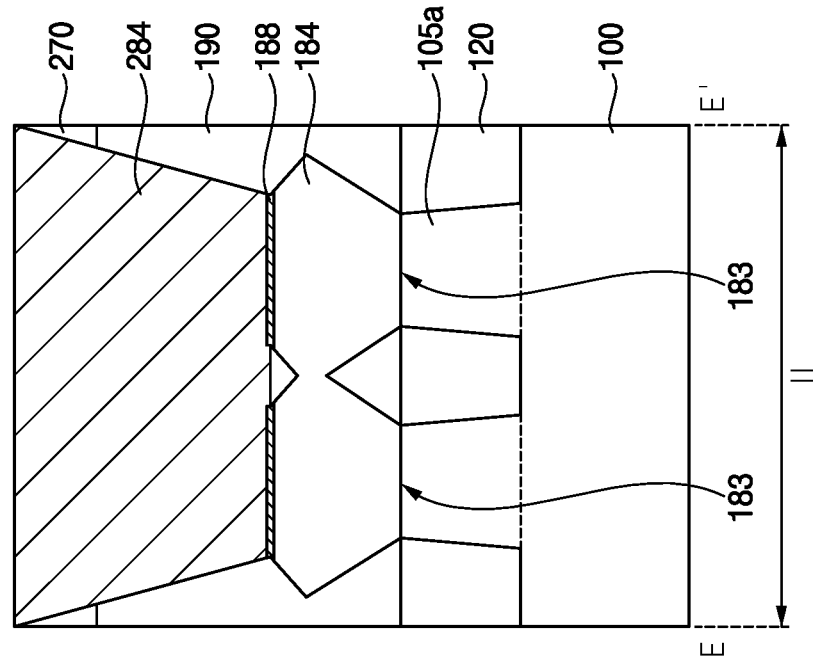
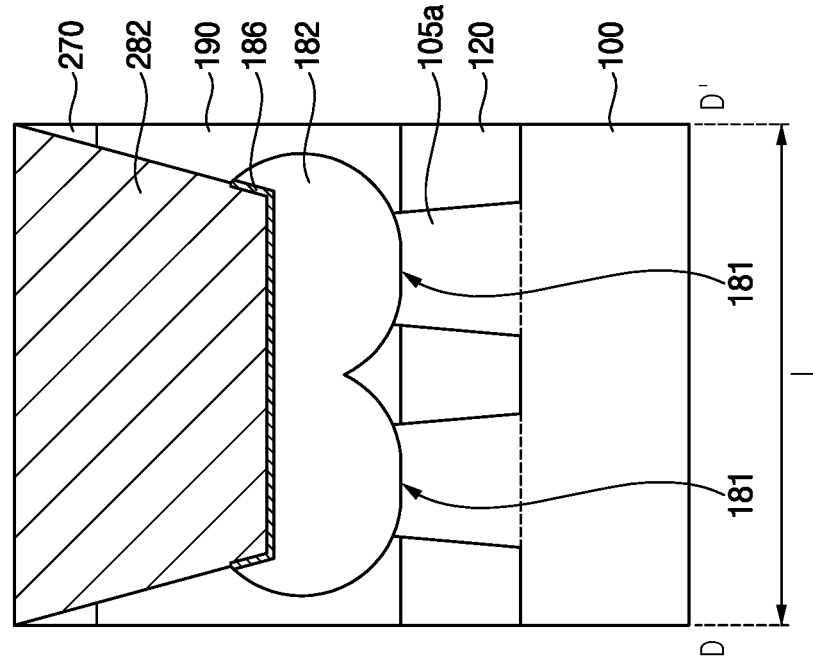
FIG. 33
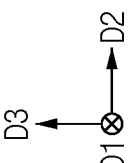

SEMICONDUCTOR DEVICES

CROSS-REFERENCE TO RELATED APPLICATION

This application claims priority under 35 USC § 119 to Korean Patent Application No. 10-2022-0106105, filed on Aug. 24, 2022 in the Korean Intellectual Property Office (KIPO), the contents of which are herein incorporated by reference in their entirety.

BACKGROUND

1. Field

Example embodiments relate to semiconductor devices. More particularly, example embodiments relate to semiconductor devices including a CMOS transistor.

2. Description of the Related Art

As a transistor has been highly integrated, sizes of gate electrodes and channels included in the transistor decrease. Thus, it is not easy for the transistor to have a desired threshold voltage, and new methods are needed.

SUMMARY

Example embodiments provide a semiconductor device having enhanced characteristics.

According to example embodiments, there is provided a semiconductor device. The semiconductor device may include first and second active fins on first and second regions, respectively, of a substrate, an isolation pattern on a boundary between the first and second regions of the substrate and portions of the first and second regions of the substrate adjacent to the boundary and separating the first and second active fins from each other, a first gate structure on the first active fin and the isolation pattern on the first region of the substrate, a second gate structure on the second active fin and the isolation pattern on the second region of the substrate, a first source/drain layer on a portion of the first active fin adjacent to the first gate structure, and a second source/drain layer on a portion of the second active fin adjacent to the second gate structure. A width of a portion of the first gate structure overlapping the first active fin in a vertical direction perpendicular to an upper surface of the substrate may be greater than a width of a portion of the second gate structure overlapping the second active fin in the vertical direction.

According to example embodiments, there is provided a semiconductor device. The semiconductor device may include first and second active fins on first and second regions, respectively, of a substrate, each of may extend in a first direction parallel to an upper surface of the substrate, an isolation pattern on a boundary between the first and second regions of the substrate and portions of the first and second regions of the substrate adjacent to the boundary and separating the first and second active fins from each other and having first and second sidewalls facing each other in the first direction on the first and second regions, respectively, of the substrate, a first gate structure extending in a second direction parallel to the upper surface of the substrate and crossing the first direction on the first active fin and the isolation pattern on the first region of the substrate, a second gate structure extending in the second direction on the second active fin and the isolation pattern on the second region of the substrate, a first source/drain layer on a portion of the first active fin adjacent to the first gate structure, and a second source/drain layer on a portion of the second active fin adjacent to the second gate structure. A distance in the first direction from the boundary to the first sidewall of the isolation pattern may be less than a distance in the first direction from the boundary to the second sidewall of the isolation pattern.

According to example embodiments, there is provided a semiconductor device. The semiconductor device may include first and second active fins on first and second regions, respectively, of a substrate, each of which may extend in a first direction parallel to an upper surface of the substrate, an isolation pattern on a boundary between the first and second regions of the substrate and portions of the first and second regions of the substrate adjacent to the boundary and separating the first and second active fins from each other and having first and second sidewalls facing each other in the first direction on the first and second regions, respectively, of the substrate, a first gate structure extending in a second direction parallel to the upper surface of the substrate and crossing the first direction on the first active fin and the isolation pattern on the first region of the substrate, a second gate structure extending in the second direction on the second active fin and the isolation pattern on the second region of the substrate, a first source/drain layer on a portion of the first active fin adjacent to the first gate structure, a second source/drain layer on a portion of the second active fin adjacent to the second gate structure, a third gate structure on the first active fin on the first region of the substrate and extending in the second direction and being spaced apart from the first gate structure in the first direction, and a fourth gate structure on the second active fin on the second region of the substrate and extending in the second direction and being spaced apart from the second gate structure in the first direction, a third source/drain layer on a portion of the first active fin adjacent to the third gate structure, and a fourth source/drain layer on a portion of the second active fin adjacent to the fourth gate structure. A width of a portion of the first gate structure overlapping the first active fin in a vertical direction perpendicular to an upper surface of the substrate may be greater than a width of a portion of the second gate structure overlapping the second active fin in the vertical direction.

According to example embodiments, there is provided a semiconductor device. The semiconductor device may include first and second active fins on first and second regions, respectively, of a substrate, an isolation pattern on a boundary between the first and second regions of the substrate and portions of the first and second regions of the substrate adjacent to the boundary and separating the first and second active fins from each other, a first gate structure on the first active fin and the isolation pattern on the first region of the substrate, first channels spaced apart from each other in a vertical direction perpendicular to an upper surface of the substrate on the first active fin, each of which may at least partially extend through the first gate structure, a second gate structure on the second active fin and the isolation pattern on the second region of the substrate, second channels spaced apart from each other in the vertical direction on the second active fin, each of which may at least partially extend through the second gate structure, a first source/drain layer on a portion of the first active fin adjacent to the first gate structure and contacting the first channels, and a second source/drain layer on a portion of the second active fin adjacent to the second gate structure, the second source/drain layer contacting the second channels. A width of a portion of the first gate structure overlapping the first active fin in the vertical direction may be greater than a width of a portion of the second gate structure overlapping the second active fin in the vertical direction.

According to example embodiments, there is provided a semiconductor device. The semiconductor device may include first and second active fins on first and second regions, respectively, of a substrate, each of which may extend in a first direction parallel to an upper surface of the substrate, an isolation pattern on a boundary between the first and second regions of the substrate and portions of the first and second regions of the substrate adjacent to the boundary and separating the first and second active fins from each other and having first and second sidewalls facing each other in the first direction on the first and second regions, respectively, of the substrate, a first gate structure extending in a second direction parallel to the upper surface of the substrate and crossing the first direction on the first active fin and the isolation pattern on the first region of the substrate, first channels spaced apart from each other in a vertical direction perpendicular to an upper surface of the substrate on the first active fin, each of which may at least partially extend through the first gate structure, a second gate structure may extend in the second direction on the second active fin and the isolation pattern on the second region of the substrate, second channels spaced apart from each other in the vertical direction on the second active fin, each of which may at least partially extend through the second gate structure, a first source/drain layer on a portion of the first active fin adjacent to the first gate structure and contacting the first channels, and a second source/drain layer on a portion of the second active fin adjacent to the second gate structure and contacting the second channels. A distance in the first direction from the boundary to the first sidewall of the isolation pattern may be less than a distance in the first direction from the boundary to the second sidewall of the isolation pattern.

According to example embodiments, there is provided a semiconductor device. The semiconductor device may include first and second active fins on first and second regions, respectively, of a substrate, each of which may extend in a first direction parallel to an upper surface of the substrate, an isolation pattern on a boundary between the first and second regions of the substrate and portions of the first and second regions of the substrate adjacent to the boundary and separating the first and second active fins from each other and having first and second sidewalls facing each other in the first direction on the first and second regions, respectively, of the substrate, a first gate structure extending in a second direction parallel to the upper surface of the substrate and crossing the first direction on the first active fin and the isolation pattern on the first region of the substrate, first channels spaced apart from each other in a vertical direction perpendicular to the upper surface of the substrate on the first active fin, each of which may at least partially extend through the first gate structure, a second gate structure extending in the second direction on the second active fin and the isolation pattern on the second region of the substrate, second channels spaced apart from each other in the vertical direction on the second active fin, each of which may at least partially extend through the second gate structure, a first source/drain layer on a portion of the first active fin adjacent to the first gate structure, a second source/drain layer on a portion of the second active fin adjacent to the second gate structure, a third gate structure on the first active fin on the first region of the substrate and extending in the second direction and being spaced apart from the first gate structure in the first direction, third channels spaced apart from each other in the vertical direction on the first active fin, each of which may at least partially extend through the third gate structure, a fourth gate structure on the second active fin on the second region of the substrate and extending in the second direction and being spaced apart from the second gate structure in the first direction, fourth channels spaced apart from each other in the vertical direction on the second active fin, each of the which may at least partially extend through the fourth gate structure, a third source/drain layer on a portion of the first active fin adjacent to the third gate structure, and a fourth source/drain layer on a portion of the second active fin adjacent to the fourth gate structure. A width of a portion of the first gate structure overlapping the first active fin in the vertical direction may be greater than a width of a portion of the second gate structure overlapping the second active fin in the vertical direction.

In the transistor of the semiconductor device in accordance with example embodiments, the width of the gate structure overlapping the active fin may be adjusted so that the transistor may have a desired threshold voltage.

BRIEF DESCRIPTION OF THE DRAWINGS

FIGS. 5 to 16 are plan views and cross-sectional views illustrating a method of manufacturing a semiconductor device in accordance with example embodiments.

FIGS. 17 and 18 are a plan view and a cross-sectional view, respectively, illustrating a semiconductor device in accordance with example embodiments.

FIGS. 19 and 20 are a plan view and a cross-sectional view, respectively, illustrating a semiconductor device in accordance with example embodiments.

FIG. 24 is a plan view illustrating a semiconductor device in accordance with example embodiments.

FIGS. 25 and 26 are a plan view and a cross-sectional view, respectively, illustrating a semiconductor device in accordance with example embodiments.

FIGS. 27 and 28 are a plan view and a cross-sectional view, respectively, illustrating a semiconductor device in accordance with example embodiments.

FIGS. 29 and 30 are a plan view and a cross-sectional view, respectively, illustrating a semiconductor device in accordance with example embodiments.

FIG. 31 is a plan view illustrating a semiconductor device in accordance with example embodiments.

FIGS. 32 and 33 are cross-sectional views illustrating a semiconductor device in accordance with example embodiments.

FIGS. 34 to 37 are a plan view and cross-sectional views illustrating a semiconductor device in accordance with example embodiments.

FIGS. 38 to 49 are plan views and cross-sectional views illustrating a method of manufacturing a semiconductor device in accordance with example embodiments.

FIGS. 50 and 51 are a plan view and a cross-sectional view, respectively, illustrating a semiconductor device in accordance with example embodiments.

FIGS. 58 and 59 are a plan view and a cross-sectional view, respectively, illustrating a semiconductor device in accordance with example embodiments.

FIGS. 60 and 61 are a plan view and a cross-sectional view, respectively, illustrating a semiconductor device in accordance with example embodiments.

FIG. 64 is a plan view illustrating a semiconductor device in accordance with example embodiments.

FIGS. 67 and 68 are cross-sectional views illustrating semiconductor devices in accordance with example embodiments.

DESCRIPTION OF EMBODIMENTS

A semiconductor device and a method of manufacturing the same in accordance with example embodiments will be described more fully hereinafter with reference to the accompanying drawings. Hereinafter in the specifications (and not necessarily in the claims), two directions substantially parallel to an upper surface of a substrate and crossing each other may be referred to as first and second directions D1 and D2, respectively, and a direction substantially perpendicular to the upper surface of the substrate may be referred to as a third direction D3. In example embodiments, the first and second directions D1 and D2 may be substantially perpendicular to each other.

Figure 1:
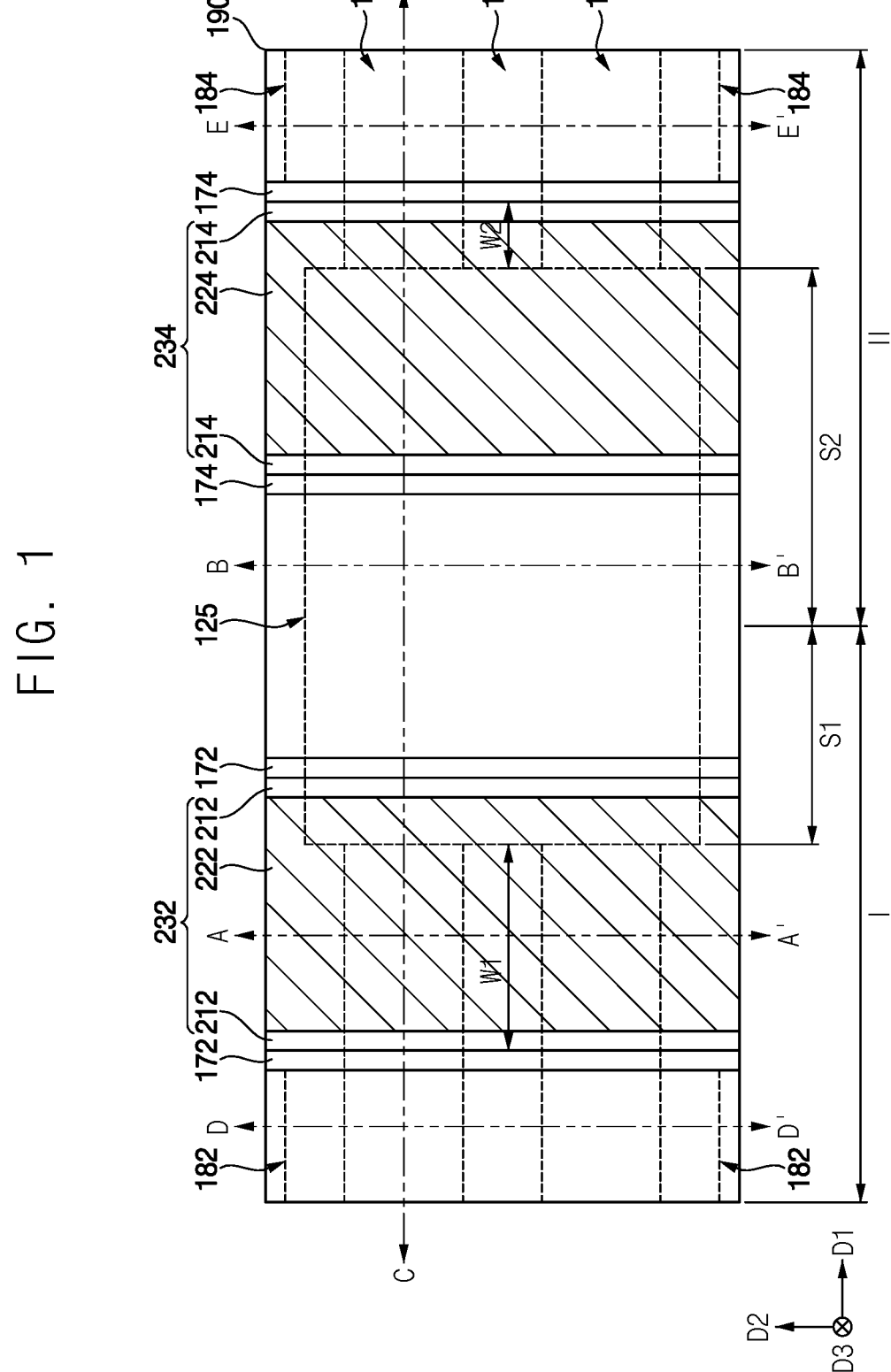
FIGS. 1 to 4 are a plan view and cross-sectional views illustrating a semiconductor device in accordance with example embodiments.
Figure 2:
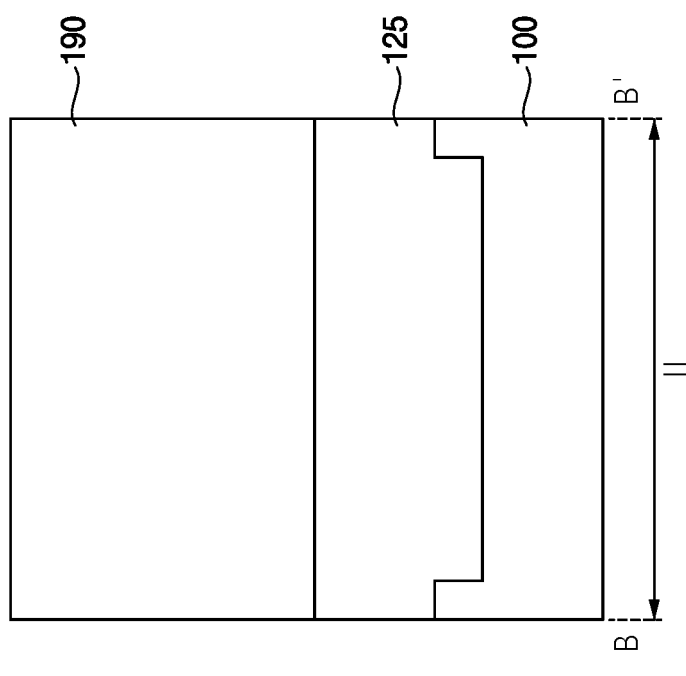
Figure 2:
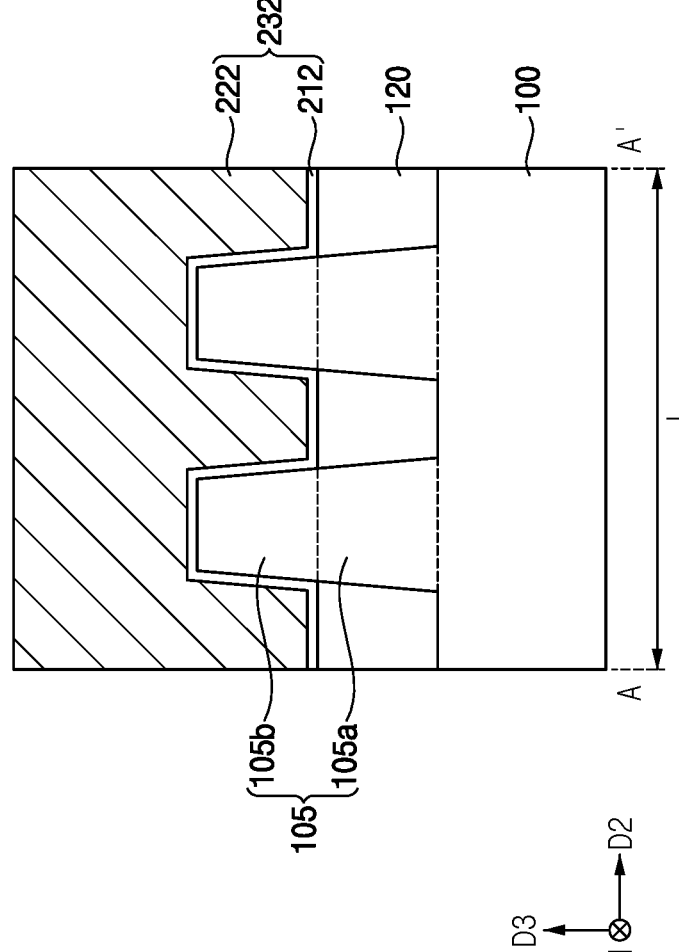
Figure 3:
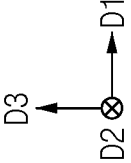
Figure 4:
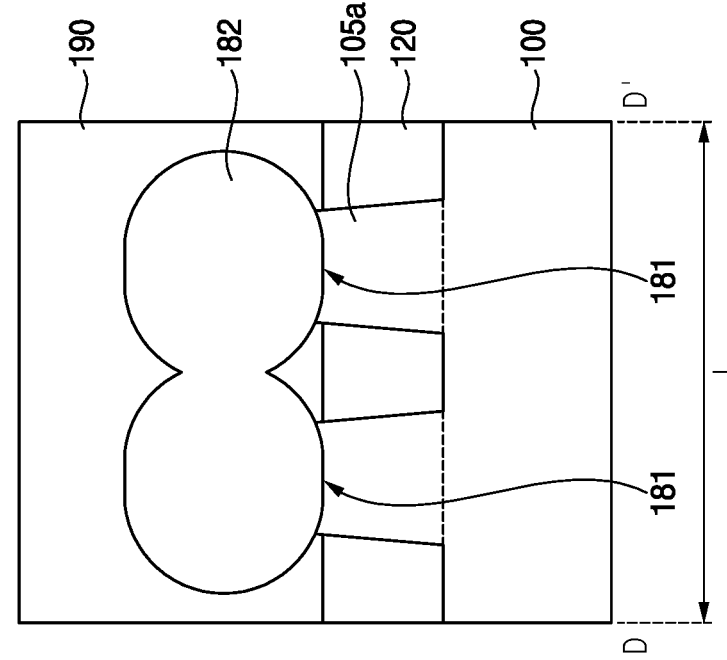
Figure 4:
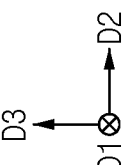

FIGS. 1 to 4 are a plan view and cross-sectional views illustrating a semiconductor device in accordance with example embodiments. Particularly, FIG. 1 is the plan view, and FIGS. 2 to 4 are the cross-sectional views. FIG. 2 includes cross-sectional views taken along lines A-A' and B-B' of FIG. 1, FIG. 3 is a cross-sectional view taken along line C-C' of FIG. 1, and FIG. 4 includes cross-sectional views taken along lines D-D' and E-E' of FIG. 1.

Referring to FIGS. 1 to 4, the semiconductor device may include an active pattern 105, first and second isolation patterns 120 and 125, first and second gate structures 232 and 234, first and second source/drain layers 182 and 184, first and second gate spacers 172 and 174, and a first insulating interlayer 190 on a first substrate 100. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification or section could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The first substrate 100 may include a semiconductor material, e.g., silicon, germanium, silicon-germanium, etc., or III-V semiconductor compounds, e.g., GaP, GaAs, GaSb, etc. In some embodiments, the first substrate 100 may include a silicon-on-insulator (SOI) substrate or a germanium-on-insulator (GOI) substrate.

The first substrate 100 may include first and second regions I and II. In example embodiments, the first region I may be an NMOS region in which NMOS transistors are formed, and the second region II may be a PMOS region in which PMOS transistors are formed.

FIGS. 1 to 4 show the first and second regions I and II of the first substrate 100 are disposed in the first direction D1, however, aspects of the inventive concept may not be limited thereto, and in some embodiments, the first and second regions I and II of the first substrate 100 may be disposed in the second direction D2.

The active pattern 105 may have a fin-like shape protruding from an upper surface of the first substrate 100, and thus may also be referred to as an active fin. The active pattern 105 may include a lower active pattern 105a of which a sidewall is covered by the first isolation pattern 120 and an upper active pattern 105b of which a sidewall is not covered by the first isolation pattern 120. In example embodiments, the active pattern 105 may extend in the first direction D1, and a plurality of active patterns 105 may be spaced apart from each other in the second direction D2.

The active fins 105 each of which may extend in the first direction D1 on the first and second regions I and II of the first substrate 100 may be spaced apart from each other by the second isolation pattern 125. Hereinafter, if needed, a portion of the active fin 105 on the first region I of the first substrate 100 may be referred to as a first active fin, and a portion of the active fin 105 on the second region II of the first substrate 100 may be referred to as a second active fin.

The active pattern 105 may include a material substantially the same as that of the first substrate 100, and the first isolation pattern 120 may include an oxide, e.g., silicon oxide.

In example embodiments, the second isolation pattern 125 may be formed on portions of the first and second regions I and II of the first substrate 100 adjacent to a boundary between the first and second regions I and II of the first substrate 100, and may contact end portions in the first direction D1 of the active pattern 105 and the first isolation pattern 120. In example embodiments, a lower surface of the second isolation pattern 125 may be lower than or substantially coplanar with an upper surface of the first substrate 100 or a lower surface of the first isolation pattern 120.

In example embodiments, a first distance S1 from the boundary between the first and second regions I and II of the first substrate 100 to a first sidewall of the second isolation pattern 125 on the first region I of the first substrate 100 may be less than a second distance S2 from the boundary between the first and second regions I and II of the first substrate 100 to a second sidewall of the second isolation pattern 125 on the second region II of the first substrate 100.

In an example embodiment, a lower surface of a portion of the second isolation pattern 125 on the first region I of the first substrate 100 adjacent to the first sidewall may be lower than that of other portions of the second isolation pattern 125. This lower surface of the portion of the second isolation pattern 125 may be referred to as a protrusion portion 125a.

In example embodiments, an upper surface of the second isolation pattern 125 may be substantially coplanar with an upper surface of the first isolation pattern 120, however, aspects of the inventive concept may not be limited thereto. The second isolation pattern 125 may include an oxide, e.g., silicon oxide, and in some embodiments, may be merged with the first isolation pattern 120.

In example embodiments, the first and second gate structures 232 and 234 may extend in the second direction D2 on the active fin 105 and the first and second isolation patterns 120 and 125 on the first and second regions I and II, respectively, of the first substrate 100.

The first gate spacer 172 may be formed on each of opposite sidewalls in the first direction D1 of the first gate structure 232, and the second gate spacer 174 may be formed on each of opposite sidewalls in the first direction D1 of the second gate structure 234. Each of the first and second gate spacers 172 and 174 may include an insulating nitride, e.g., silicon nitride, silicon oxynitride, silicon oxycarbonitride, etc.

In example embodiments, the first gate structure 232 may include a first gate insulation pattern 212 and a first gate electrode 222 stacked on the first active fin 105 and the first and second isolation patterns 120 and 125, and the second gate structure 234 may include a second gate insulation pattern 214 and a second gate electrode 224 stacked on the second active fin 105 and the first and second isolation patterns 120 and 125.

In example embodiments, the first gate insulation pattern 212 may be formed on an upper surface and a sidewall in the second direction D2 of an upper portion of the first active fin 105 on the first region I of the first substrate 100, an upper surface of a portion of the first isolation pattern 120 on the first region I of the first substrate 100, sidewalls in the first direction D1 of end portions in the first direction D1 of the first active fin 105 and the portion of the first isolation pattern 120, an upper surface of a portion of the second isolation pattern 125 on the first region I of the first substrate 100, and an inner sidewall of the first gate spacer 172, and a lower surface and a sidewall of the first gate electrode 222 may be covered by the first gate insulation pattern 212.

Additionally, the second gate insulation pattern 214 may be formed on an upper surface and a sidewall in the second direction D2 of an upper portion of the second active fin 105 on the second region II of the first substrate 100, an upper surface of a portion of the first isolation pattern 120 on the second region II of the first substrate 100, sidewalls in the first direction D1 of end portions in the first direction D1 of the second active fin 105 and the portion of the first isolation pattern 120, an upper surface of a portion of the second isolation pattern 125 on the second region II of the first substrate 100, and an inner sidewall of the second gate spacer 174, and a lower surface and a sidewall of the second gate electrode 224 may be covered by the second gate insulation pattern 214.

In example embodiments, a first width W1 in the first direction D1 of a portion of the first gate structure 232 on the first active fin 105 on the first region I of the first substrate 100 may be greater than a second width W2 in the first direction D1 of a portion of the second gate structure 234 on the second active fin 105 on the second region II of the first substrate 100. In example embodiments, the first width W1 may be greater than half a width in the first direction D1 of the first gate structure 232, and the second width W2 may be less than half a width in the first direction D1 of the second gate structure 234.

In example embodiments, the first and second gate structures 232 and 234, which may be formed on the first and second regions I and II, respectively, of the first substrate 100, may have substantially the same width in the first direction D1, and may be spaced apart by the same distance from the boundary between the first and second regions I and II of the first substrate 100. The first distance S1 from the boundary between the first and second regions I and II of the first substrate 100 to the first sidewall of the second isolation pattern 125 may be less than the second distance S2 from the boundary between the first and second regions I and II of the first substrate 100 to the second sidewall of the second isolation pattern 125.

Thus, the first width W1 of a portion of the first gate structure 232 overlapping the first active fin 105 in the third direction D3 may be greater than the second width W2 of a portion of the second gate structure 234 overlapping the second active fin 105 in the third direction D3.

Each of the first and second gate insulation patterns 212 and 214 may include a metal oxide having a high dielectric constant, e.g., hafnium oxide, tantalum oxide, zirconium oxide, etc.

Each of the first and second gate electrodes 222 and 224 may include a metal nitride, e.g., titanium nitride, titanium aluminum nitride, tantalum nitride, tantalum aluminum nitride, etc., a metal alloy, e.g., titanium aluminum, titanium aluminum carbide, titanium aluminum oxynitride, titanium aluminum carbonitride, titanium aluminum oxycarbonitride, etc., a metal carbide, a metal oxynitride, a metal carbonitride, a metal oxycarbonitride, or a low resistance metal, e.g., tungsten, aluminum, copper, tantalum.

In an example embodiment each of the first and second gate electrodes 222 and 224 may include a barrier pattern and a conductive pattern.

The first and second source/drain layers 182 and 184 may be formed on upper surfaces of portions of the first and second active fins 105, respectively, adjacent to the first and second gate structures 232 and 234, respectively, and may contact lower sidewalls of the first and second gate spacers 172 and 174, respectively.

In an example embodiment, a cross-section in the second direction D2 of the first source/drain layer 182 may have a shape of a rectangle with rounded corners or a circle, and a cross-section in the second direction D2 of the second source/drain layer 184 may have a shape of a pentagon or a rhombus.

If a distance between neighboring ones of the active patterns 105 in the second direction D2 is small, the first source/drain layers 182 grown from the first active fins 105 on the first region I of the first substrate 100 may be merged with each other, and likewise, the second source/drain layers 184 grown from the second active fins 105 on the second region II of the first substrate 100 may be merged with each other.

In example embodiments, the first source/drain layer 182 may include single crystalline silicon or single crystalline silicon carbide doped with n-type impurities, and thus may serve as a source/drain region of an n-channel metal oxide semiconductor (NMOS) transistor. Additionally, the second source/drain layer 184 may include single crystalline silicon-germanium doped with p-type impurities, and thus may serve as a source/drain region of a p-channel metal oxide semiconductor (PMOS) transistor.

Upper surfaces of the first and second source/drain layers 182 and 184 and the second isolation pattern 125 may be covered by the first insulating interlayer 190. The first insulating interlayer 190 may include an insulating material, e.g., silicon oxycarbide, silicon oxide, silicon nitride, silicon oxynitride, silicon carbonitride, silicon oxycarbonitride, etc.

The semiconductor device may further include contact plugs and wirings electrically connected to the first and second gate electrodes 222 and 224 and the first and second source/drain layers 182 and 184.

The semiconductor device may include an NMOS transistor having the first active fin 105 serving as a channel, the first gate structure 232 on the first active fin 105, and the first source/drain layer 182 on the portion of the first active fin 105 adjacent to the first gate structure 232 on the first region I of the first substrate 100. Additionally, the semiconductor device may include a PMOS transistor having the second active fin 105 serving as a channel, the second gate structure 234 on the second active fin 105, and the second source/ drain layer 184 on the portion of the second active fin 105 adjacent to the second gate structure 234 on the second region II of the first substrate 100.

Thus, the semiconductor device may include a CMOS transistor having the NMOS transistor and the PMOS transistor, and each of the NMOS transistor and the PMOS transistor may be a finFET.

As illustrated above, the first width W1 in the first direction D1 of the portion of the first gate structure 232 overlapping the first active fin 105 in the third direction D3 may be greater than half the width in the first direction D1 of the first gate structure 232, and thus the NMOS transistor may have a decreased threshold voltage. Additionally, the second width W2 in the first direction D1 of the portion of the second gate structure 234 overlapping the second active fin 105 in the third direction D3 may be less than half the width in the first direction D1 of the second gate structure 234, and thus the PMOS transistor may have an increased threshold voltage.

Accordingly, the width of the portion of the gate structure overlapping the active fin in each transistor may be adjusted so that each transistor may have a desired threshold voltage.

Additionally, the width of the portion of each of the first and second gate structures 232 and 234 overlapping the active fin 105 in the third direction D3 may be adjusted by changing the widths of the portions of the second isolation pattern 125 on the first and second regions I and II, respectively, which is illustrated below with reference to FIGS. 5 to 16.

FIGS. 5 to 16 are plan views and cross-sectional views illustrating a method of manufacturing a semiconductor device in accordance with example embodiments. Particularly, FIGS. 5, 7, 10 and 13 are the plan views, and FIGS. 6, 8-9, 11-12 and 14-16 are the cross-sectional views.

Figure 6:
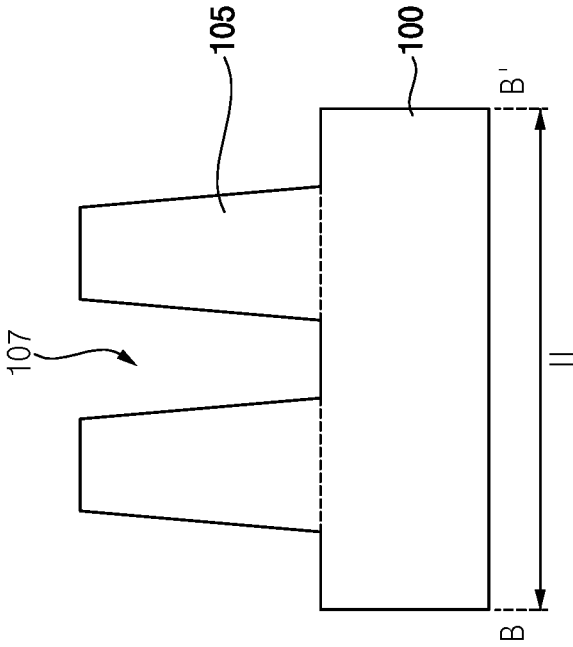
Figure 6:
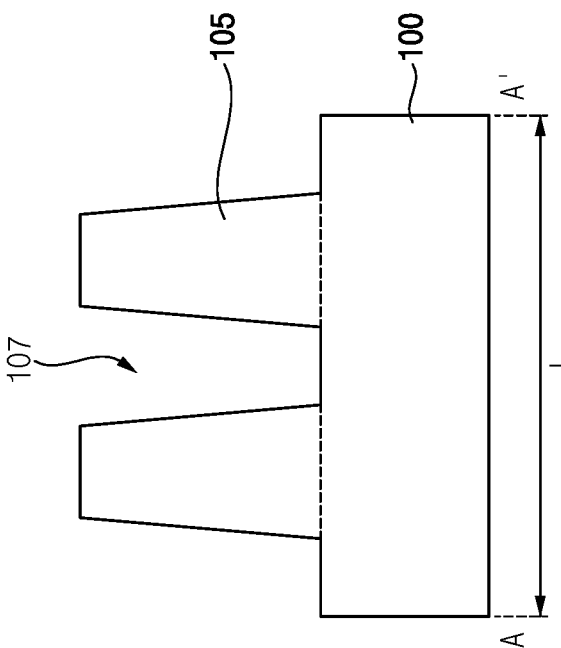
Figure 6:
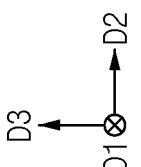
Figure 8:
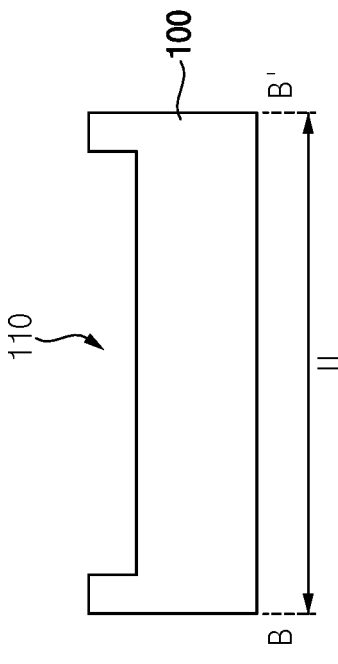
Figure 8:
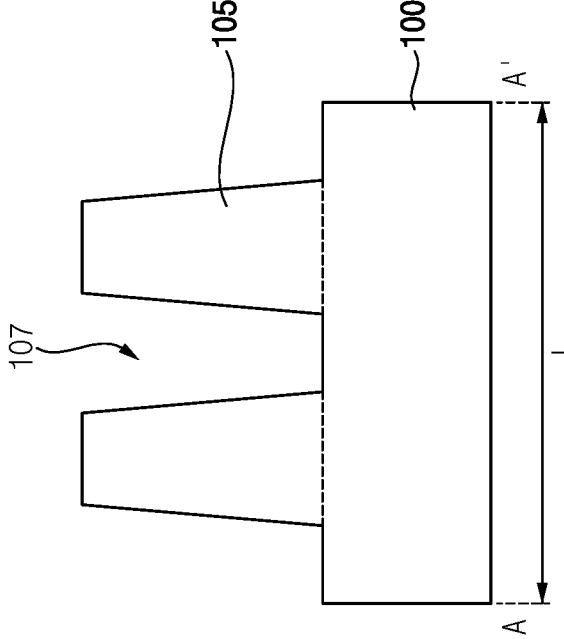
Figure 8:
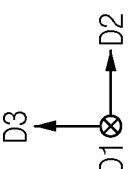
Figure 11:
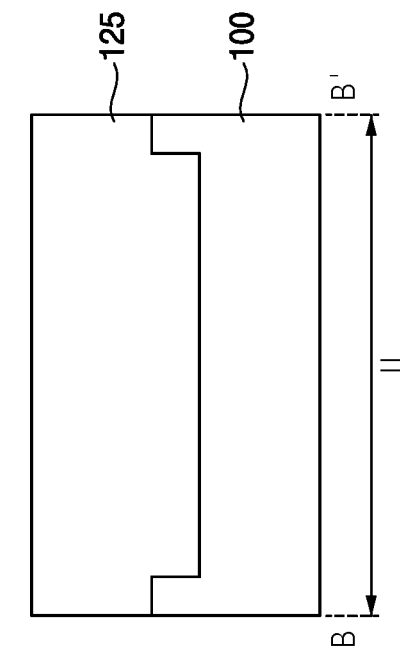
Figure 11:
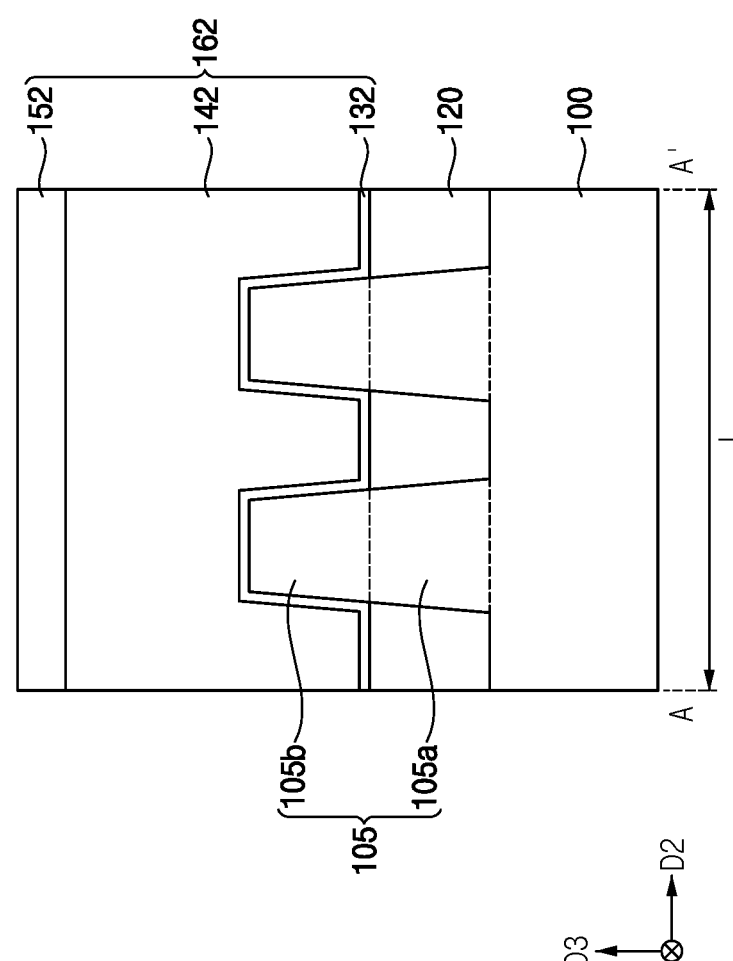
Figure 14:
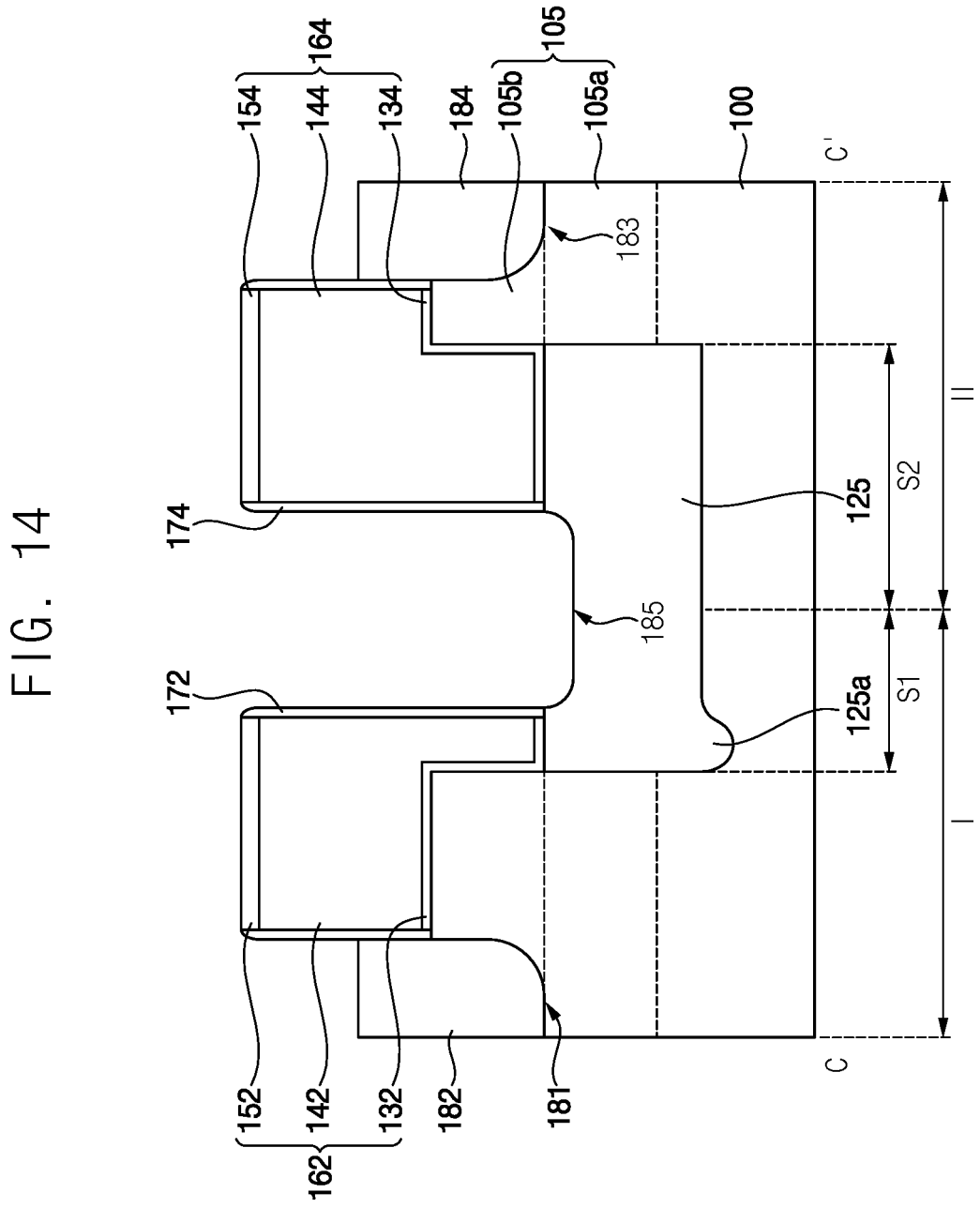
Figure 15:
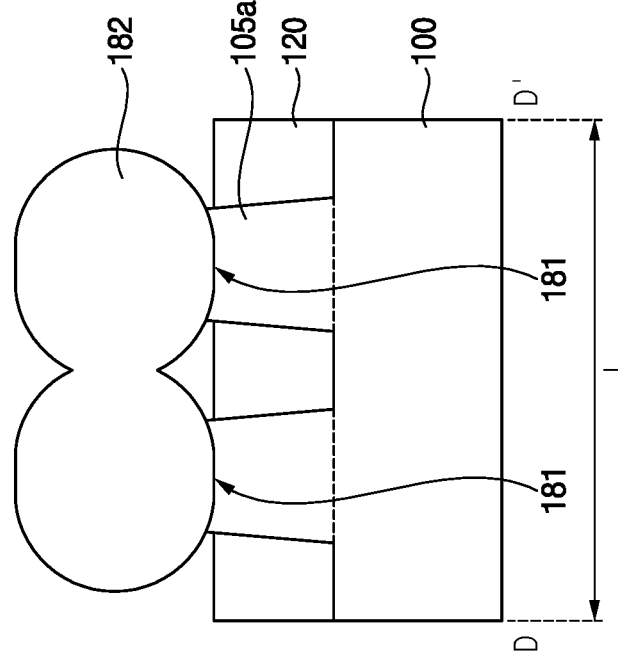
Figure 15:
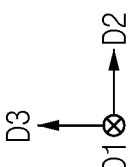

FIGS. 6, 8 and 11 include cross-sectional views taken along lines A-A' and B-B' of corresponding plan views, respectively, FIGS. 9, 12, 14 and 16 are cross-sectional views taken along lines C-C' of corresponding plan views, respectively, and FIG. 15 includes cross-sectional views taken along lines D-D' and E-E' of a corresponding plan view.

Figure 5:
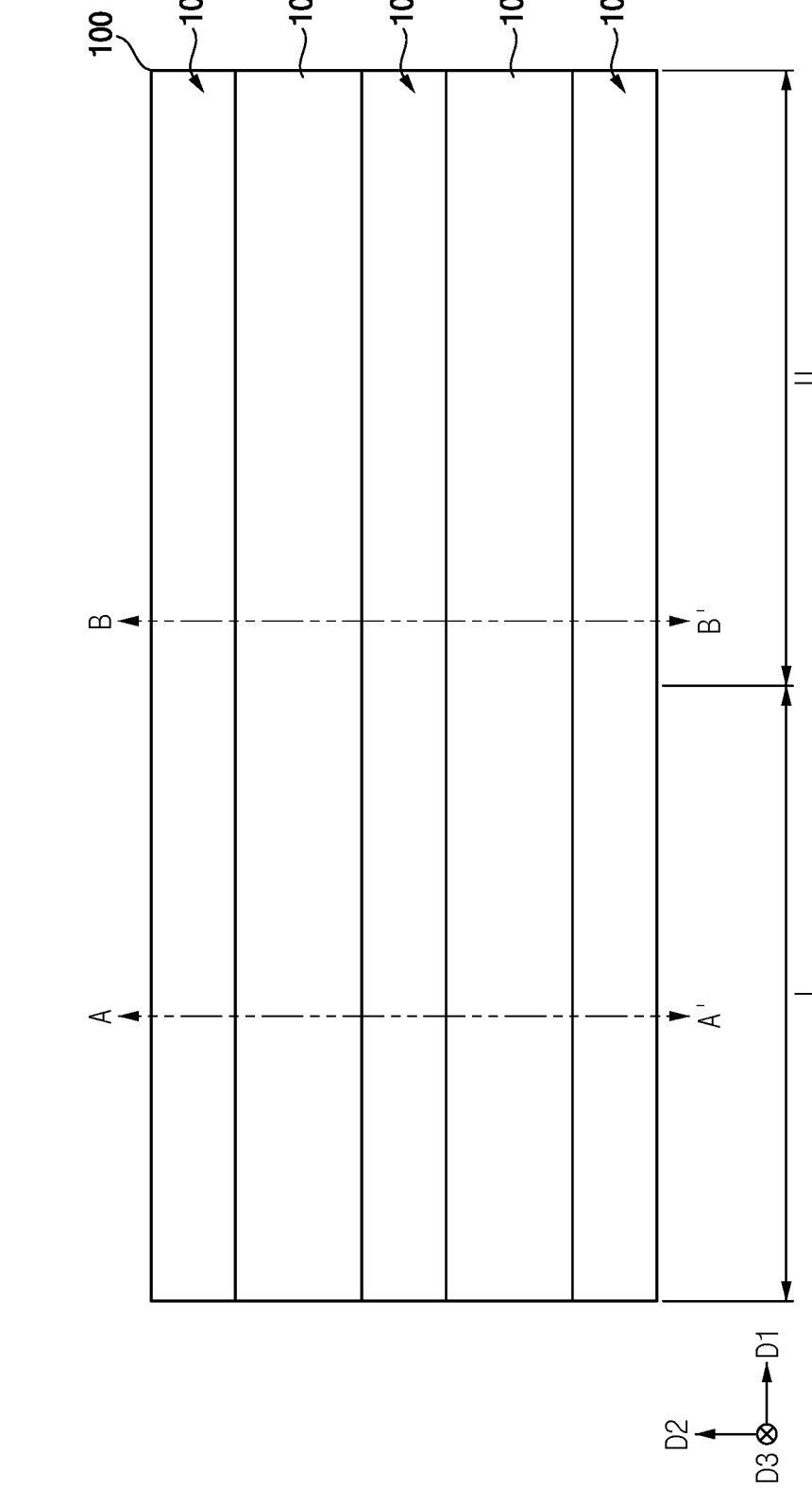

Referring to FIGS. 5 and 6, an upper portion of a first substrate 100 including first and second regions I and II may be removed to form a first trench 107, and thus an active pattern 105 may be formed.

In example embodiments, the active pattern 105 may extend in the first direction D1, and a plurality of active patterns 105 may be spaced apart from each other in the second direction D2. The active pattern 105 may protrude from the first substrate 100 upwardly (e.g., in the third direction D3), and thus may also be referred to as an active fin 105.

Figure 7:
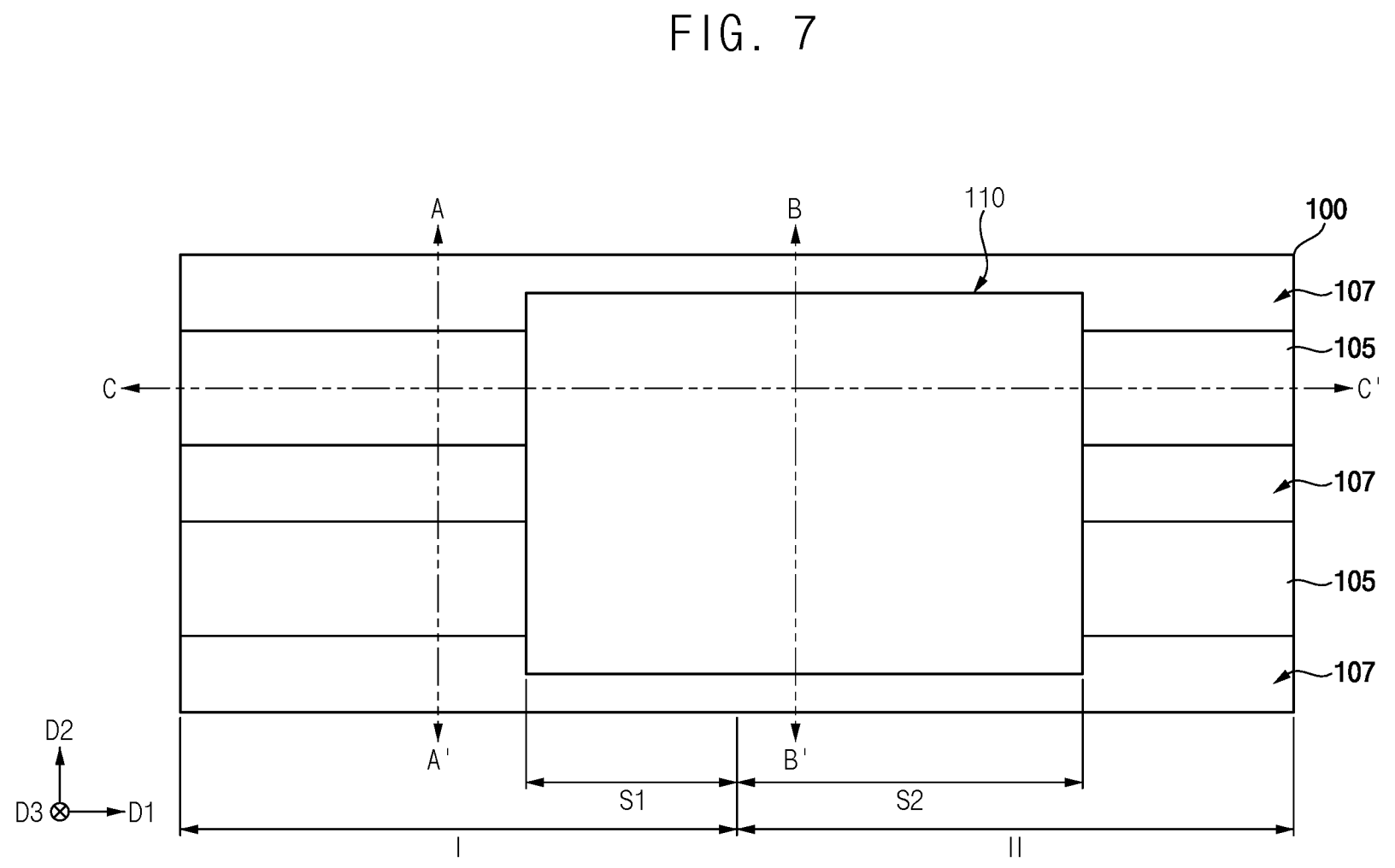
Figure 9:
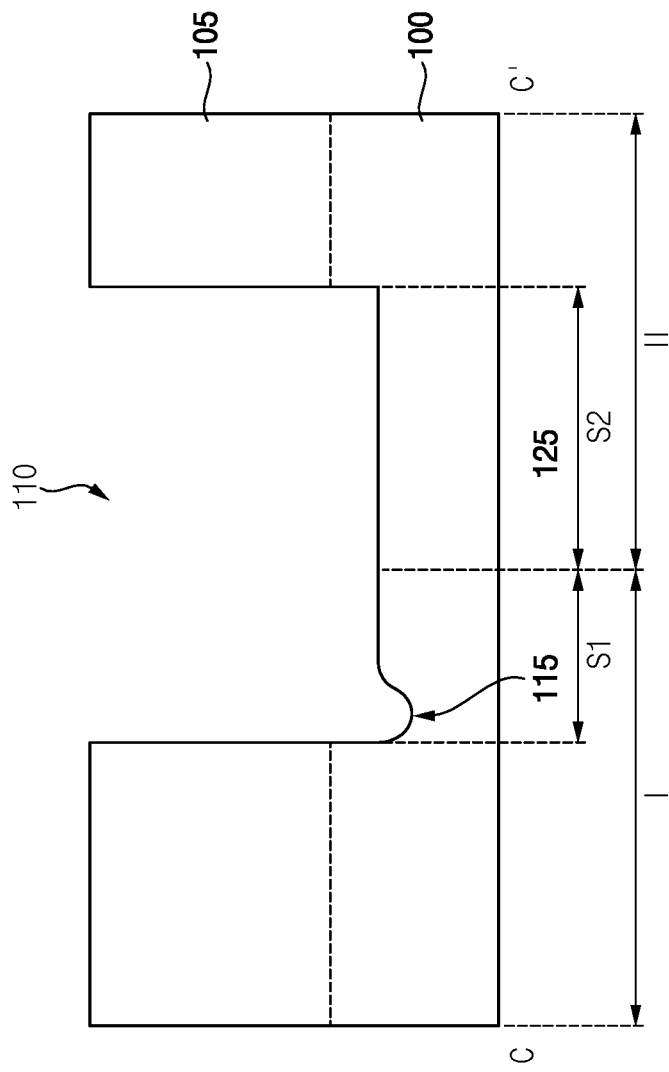

FIGS. 7 to 9, a portion of the active fin 105 adjacent to a boundary between the first and second regions I and II of the first substrate 100 may be removed to form a second trench 110.

Thus, the active fin 105 extending in the first direction D1 on the first and second regions I and II of the first substrate 100 may be divided into two portions on the first and second regions I and II, respectively, of the first substrate 100. If needed, a portion of the active fin 105 on the first region I of the first substrate 100 may be referred to as a first active fin, and a portion of the active fin 105 on the second region II of the first substrate 100 may be referred to as a second active fin.

The second trench 110 may be formed by removing one or a plurality of active fins 105 disposed in the second direction D2 on the first and second regions I and II of the first substrate 100, and a lower surface of the second trench 110 may be lower or substantially coplanar with an upper surface of the first substrate 100.

In example embodiments, a first distance S1 from the boundary between the first and second regions I and II of the first substrate 100 to a first sidewall of the second trench 110 on the first region I of the first substrate 100 may be less than a second distance S2 from the boundary between the first and second regions I and II of the first substrate 100 to a second sidewall of the second trench 110 on the second region II of the first substrate 100.

In an example embodiment, a lower surface of a portion of the second trench 110 on the first region I of the first substrate 100 adjacent to the first sidewall may be lower than that of other portions of the second trench 110, which may be referred to as a third trench 115.

Figure 10:
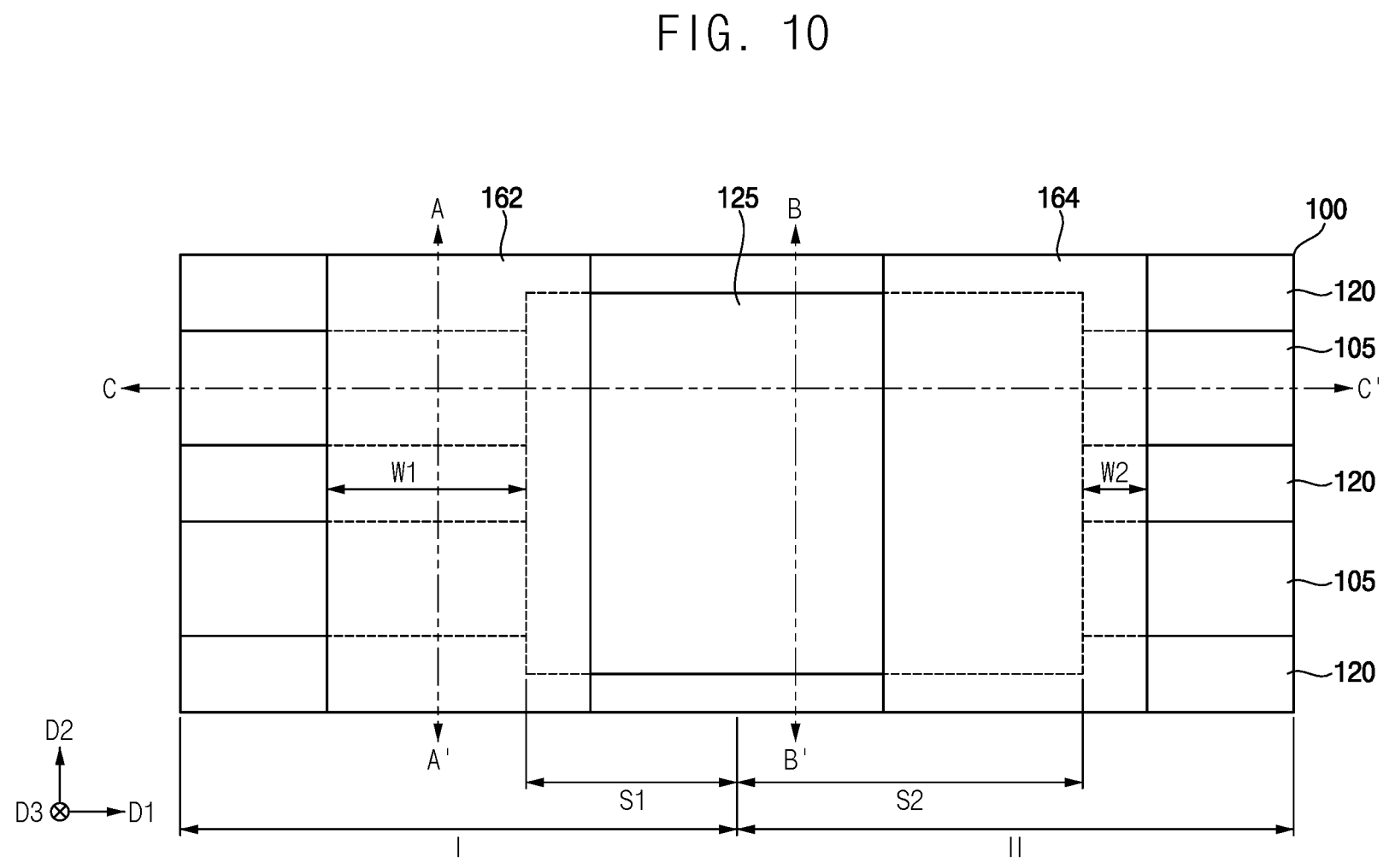
Figure 12:
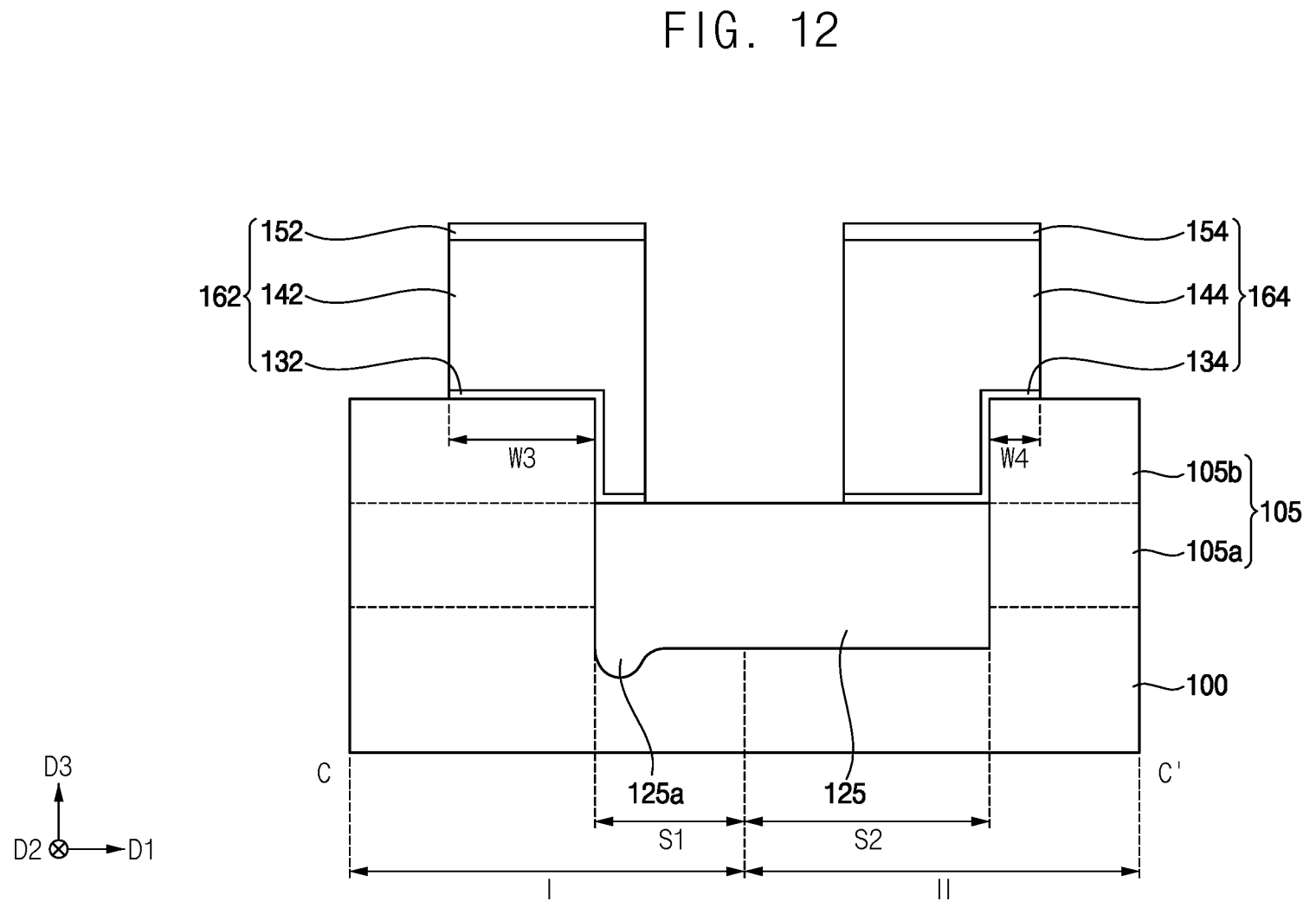

Referring to FIGS. 10 to 12, a first isolation layer may be formed on the first substrate 100 having the active fin 105 thereon, and an upper portion of the first isolation layer may be removed to form first and second isolation patterns 120 and 125.

The upper portion of the first isolation layer may be removed by, e.g., a chemical mechanical polishing (CMP) process and/or an etch back process.

In example embodiments, the first isolation pattern 120 may be formed on an upper surface of the first substrate 100 between the active fins 105 spaced apart from each other in the second direction D2 to fill a lower portion of the first trench 107, and thus an upper surface of the first isolation pattern 120 may be lower than upper surfaces of the active fins 105. A portion of the active fin 105 of which a sidewall is covered by the first isolation pattern 120 may be referred to as a lower active pattern 105*a*, and a portion of the active fin 105 of which a sidewall is not covered by the first isolation pattern 120 and protrudes upwardly may be referred to as an upper active pattern 105*b*.

The second isolation pattern 125 may fill a lower portion of the second trench 110 and the third trench 115, and thus an upper surface of the second isolation pattern 125 may be lower than the upper surfaces of the active fins 105. A portion of the second isolation pattern 125 filling the third trench 115 may be referred to as a protrusion portion 125*a*.

In example embodiments, the upper surfaces of the first and second isolation patterns 120 and 125 may be substantially coplanar with each other, however, aspects of the inventive concept may not be limited thereto.

First and second dummy gate structures 162 and 164 may be formed on the first and second regions I and II, respectively, of the first substrate 100 having the active pattern 105 and the first and second isolation patterns 120 and 125 thereon.

The first dummy gate structure 162 may include a first dummy gate insulation pattern 132, a first dummy gate electrode 142 and a first dummy gate mask 152 sequentially stacked in the third direction D3, and the second dummy gate structure 164 may include a second dummy gate insulation pattern 134, a second dummy gate electrode 144 and a second dummy gate mask 154 sequentially stacked in the third direction D3.

In example embodiments, each of the first and second dummy gate structures 162 and 164 may extend in the second direction D2. The first dummy gate structure 162 may be formed on the first active fin 105 and the first and second isolation patterns 120 and 125 on the first region I of the first substrate 100, and the second dummy gate structure 164 may be formed on the second active fin 105 and the first and second isolation patterns 120 and 125 on the second region II of the first substrate 100.

In example embodiments, a first width W1 in the first direction D1 of a portion of the first dummy gate structure 162 on the first active fin 105 on the first region I of the first substrate 100 may be greater than a second width W2 in the first direction D1 of a portion of the second dummy gate structure 164 on the second active fin 105 on the second region II of the first substrate 100.

In example embodiments, the first and second dummy gate structures 162 and 164 on the first and second regions I and II, respectively, of the first substrate 100 may have substantially the same width in the first direction D1, and may be spaced apart by the same distance from the boundary between the first and second regions I and II of the first substrate 100. The first distance S1 from the boundary between the first and second regions I and II of the first substrate 100 to the first sidewall of the second isolation pattern 125 may be less than the second distance S2 from the boundary between the first and second regions I and II of the first substrate 100 to the second sidewall of the second isolation pattern 125. Thus, the first width W1 in the first direction D1 of the portion of the first dummy gate structure 162 overlapping the first active fin 105 in the third direction D3 may be greater than the second width W2 in the first direction D1 of the portion of the second dummy gate structure 164 overlapping the second active fin 105 in the third direction D3.

Each of the first and second dummy gate insulation patterns 132 and 134 may include an oxide, e.g., silicon oxide, each of the first and second dummy gate electrodes 142 and 144 may include, e.g., polysilicon, and each of the first and second dummy gate masks 152 and 154 may include an insulating nitride, e.g., silicon nitride.

Figure 13:
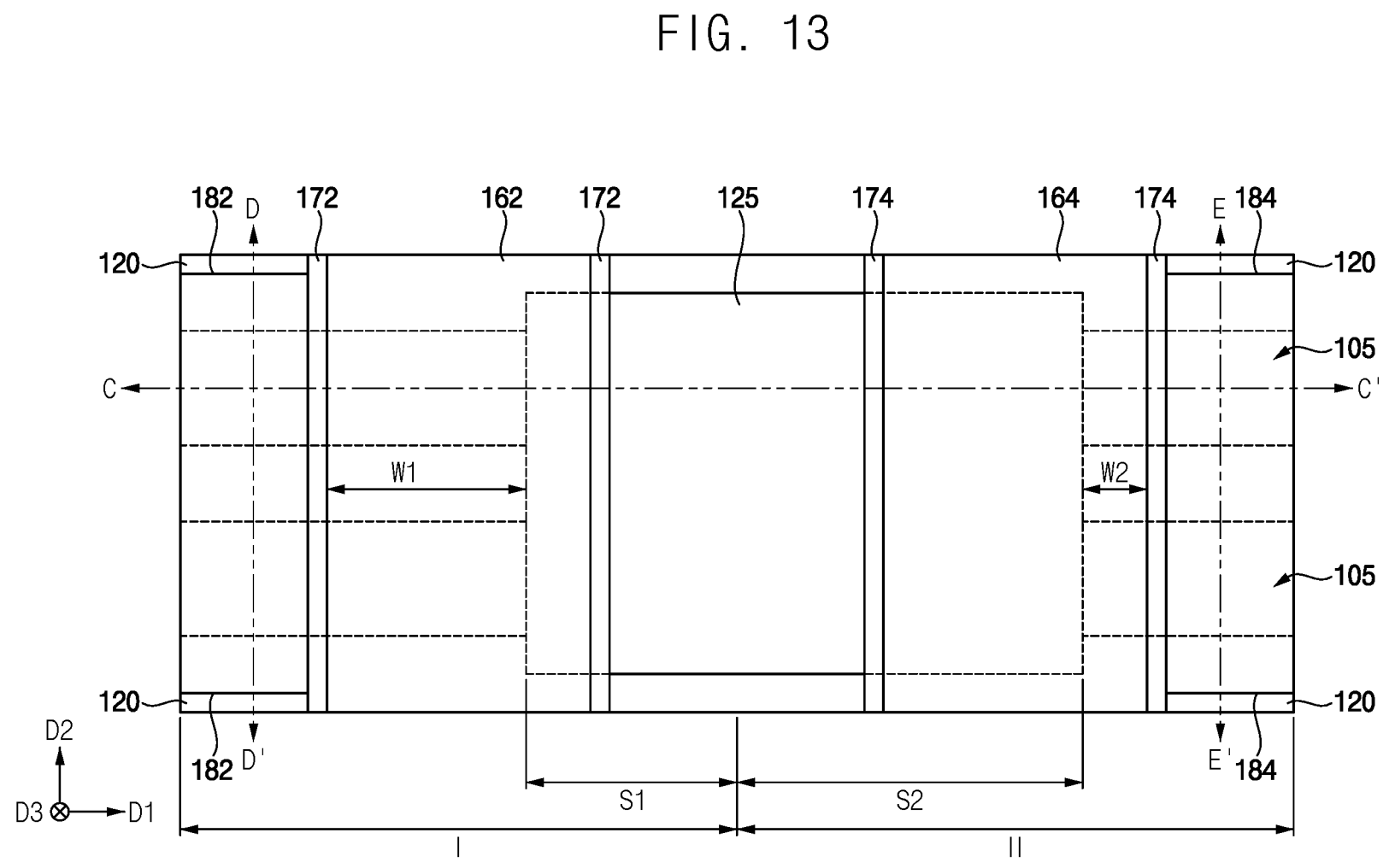

Referring to FIGS. 13 to 15, first and second gate spacers 172 and 174 may be formed on each of opposite sidewalls in the first direction D1 of the first and second dummy gate structures 162 and 164, respectively.

The first and second gate spacers 172 and 174 may be formed by forming a first spacer layer on the first substrate 100 having the active fin 105, the first and second isolation patterns 120 and 125, and the first and second dummy gate structures 162 and 164 thereon, and anisotropically etching the first spacer layer.

Upper portions of the active pattern 105 may be etched using the first and second dummy gate structures 162 and 164 and the first and second gate spacers 172 and 174 as an etching mask to form first and second recesses 181 and 183, respectively, on the first and second regions I and II, respectively, of the first substrate 100.

FIG. 15 shows that each of the first and second recesses 181 and 183 is formed by partially removing the upper active pattern 105b, however, aspects of the inventive concept may not be limited thereto, and each of the first and second recesses 181 and 183 may be formed by partially removing the lower active pattern 105a as well as the upper active pattern 105b.

During the etching process, an upper portion of the second isolation pattern 125 between the first and second dummy gate structures 162 and 164 may also be removed to form a third recess 185.

In example embodiments, the etching process for forming the first and second recesses 181 and 183 and the anisotropic etching process for forming the first and second gate spacers 172 and 174 may be performed in-situ.

First and second selective epitaxial growth (SEG) processes may be performed using upper surfaces of the active pattern 105 exposed by the first and second recesses 181 and 183 as a seed to form first and second source/drain layers 182 and 184, respectively, on portions of the first and second active fins 105 on the first and second regions I and II, respectively, of the first substrate 100.

In an example embodiment, the first SEG process may be performed using a silicon source gas, e.g., disilane $(Si_2H_6)$ gas and a carbon source gas, e.g., $SiH_3CH_3$, and thus a single crystalline silicon carbide layer may be formed as the first source/drain layer 182. An n-type impurity source gas, e.g., $PH_3$, $POCl_3$, $P_2O_5$, etc., may also be used so that a single crystalline silicon carbide layer doped with n-type impurities may be formed as the first source/drain layer 182. Alternatively, the first SEG process may be performed using the silicon source gas and the impurity source gas so that a single crystalline silicon layer doped with n-type impurities may be formed as the first source/drain layer 182.

In an example embodiment, the second SEG process may be performed using a silicon source gas, e.g., dichlorosilane $(SiH_2Cl_2)$ gas, a germanium source gas, e.g., germane $(GeH_4)$ gas, and thus a single crystalline silicon-germanium layer may be formed as the second source/drain layer 184. A p-type impurity source gas, e.g., diborane $(B_2H_6)$ gas may also be used so that a single crystalline silicon-germanium layer doped with p-type impurities may be formed as the second source/drain layer 184.

The first and second source/drain layers 182 and 184 may fill the first and second recesses 181 and 183, respectively, and may further grow to contact lower sidewalls of the first and second gate spacers 172 and 174, respectively. Each of the first and second source/drain layers 182 and 184 may grow in a horizontal direction as well as a vertical direction.

Figure 16:
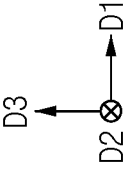

Referring to FIG. 16, a first insulating interlayer 190 may be formed on the first substrate 100 having the active fin 105, the first and second dummy gate structures 162 and 164, the first and second gate spacers 172 and 174, the first and second source/drain layers 182 and 184, and the first and second isolation patterns 120 and 125 thereon, and a planarization process may be performed until upper surfaces of the first and second dummy gate electrodes 142 and 144 included in each of the first and second dummy gate structures 162 and 164 are exposed to remove an upper portion of the first insulating interlayer 190 and the first and second dummy gate masks 152 and 154 included in each of the first and second dummy gate structures 162 and 164, and upper portions of the first and second gate spacers 172 and 174 may also be removed.

The planarization process may include a CMP process and/or an etch back process.

The first and second dummy gate electrodes 142 and 144 and the first and second dummy gate insulation patterns 132 and 134 may be removed to form first and second openings 202 and 204 on the first and second regions I and II, respectively, of the first substrate 100, which may expose an upper surface of the active pattern 105 and upper surfaces of the first and second isolation patterns 120 and 125.

In example embodiments, the first and second dummy gate electrodes 142 and 144, and the first and second dummy gate insulation patterns 132 and 134 may be removed by sequentially performing a dry etching process and a wet etching process. The wet etching process may be performed using, e.g., hydrofluoric acid (HF) as an etching solution.

Referring to FIGS. 1 to 4 again, a first gate insulation layer may be formed on bottoms and sidewalls of the first and second openings 202 and 204, an upper surface of the first insulating interlayer 190, and upper surfaces of the first and second gate spacers 172 and 174, a first gate electrode layer may be formed on the first gate insulation layer to fill remaining portions of the first and second openings 202 and 204, and the first gate electrode layer and the first gate insulation layer may be planarized until the upper surface of the first insulating interlayer 190 is exposed.

Thus, a first gate structure 232 including a first gate electrode 222 and a first gate insulation pattern 212 covering a lower surface and a sidewall of the first gate electrode 222 may be formed in the first opening 202, and a second gate structure 234 including a second gate electrode 224 and a second gate insulation pattern 214 covering a lower surface and a sidewall of the second gate electrode 224 may be formed in the second opening 204.

Contact plugs and wirings may be further formed to be electrically connected to the first and second gate electrodes 222 and 224 and the first and second source/drain layers 182 and 184 to complete the fabrication of the semiconductor device.

As illustrated above, the portion of the active fin 105 adjacent to the boundary between the first and second regions I and II of the first substrate 100 may be removed to form the second trench 110, and the second isolation pattern 125 may be formed in the second trench 110. The width of the portion of the second isolation pattern 125 on the first region I of the first substrate 100 may be adjusted to be less than the width of the portion of the second isolation pattern 125 on the second region II of the first substrate 100.

Thus, the width of the first gate structure 232 overlapping the first active fin 105 in the third direction D3 on the first region I of the first substrate 100 may be greater than the width of the second gate structure 234 overlapping the second active fin 105 in the third direction D3 on the second region II of the first substrate 100. Accordingly, the NMOS transistor including the first gate structure 232 may have a decreased threshold voltage, and the PMOS transistor including the second gate structure 234 may have an increased threshold voltage.

Figure 17:
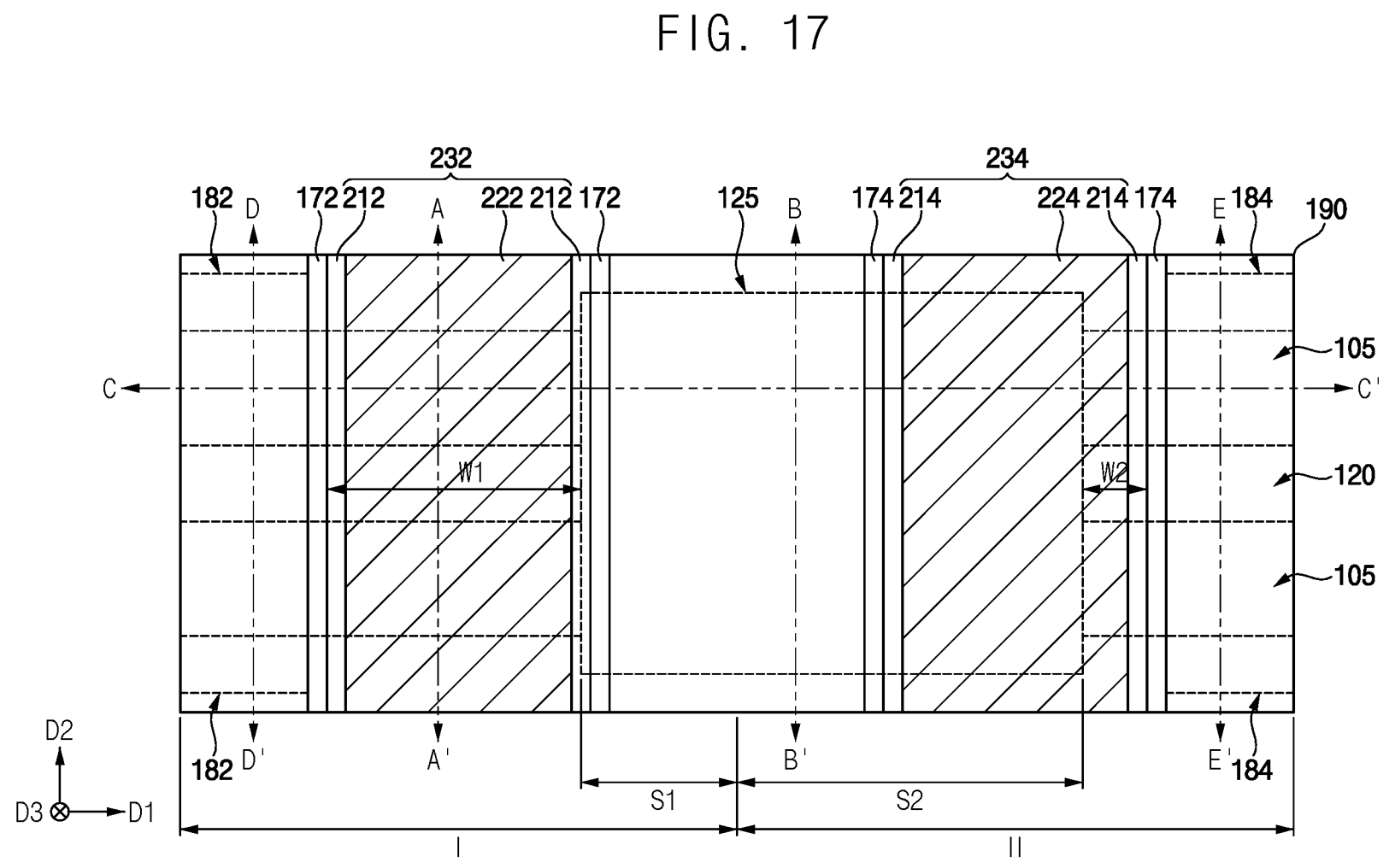
Figure 18:
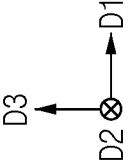

FIGS. 17 and 18 are a plan view and a cross-sectional view, respectively, illustrating a semiconductor device in accordance with example embodiments, and may correspond to FIGS. 1 and 3, respectively.

This semiconductor device may be substantially the same as or similar to that of FIGS. 1 to 4, except for the position and shape of the first gate structure 232, and thus repeated explanations thereof are omitted herein.

Referring to FIGS. 17 and 18, the first gate electrode 222 included in the first gate structure 232 may not cover the sidewall in the first direction D1 of the end portion in the first direction D1 of the first active fin 105, and thus the first gate electrode 222 may be formed only on the upper surface and the sidewall in the second direction D2 of the end portion of the first active fin 105.

The first gate insulation pattern 212 included in the first gate structure 232 may be, or may not be formed on the sidewall in the first direction D1 of the end portion in the first direction D1 of the first active fin 105.

The first gate spacer 172 on the sidewall of the first gate structure 232 facing the second isolation pattern 125 may be formed on the sidewall in the first direction D1 of the end portion in the first direction D1 of the first active fin 105.

Figure 19:
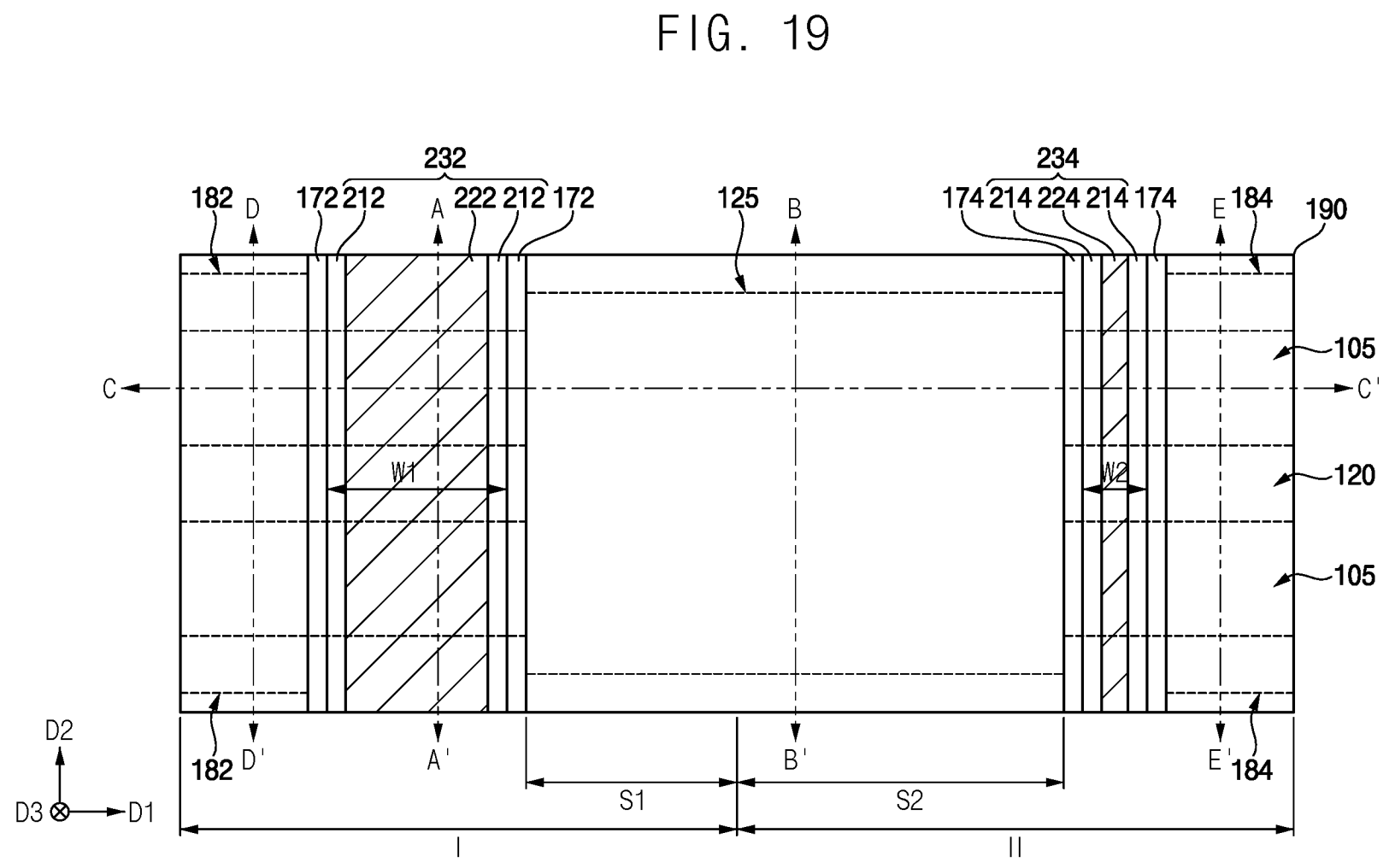
Figure 20:
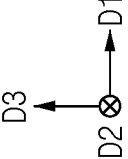

FIGS. 19 and 20 are a plan view and a cross-sectional view, respectively, illustrating a semiconductor device in accordance with example embodiments, and may correspond to FIGS. 1 and 3, respectively.

This semiconductor device may be substantially the same as or similar to that of FIGS. 1 to 4, except for the position and shape of the first and second gate structures 232 and 234, and thus repeated explanations thereof are omitted herein.

Referring to FIGS. 19 and 20, the first and second gate structures 232 and 234 may be formed on the upper surfaces and sidewalls in the second direction D2 of the first and second fins 105, respectively, on the first and second regions I and II, respectively, of the first substrate 100, and may not be formed on the sidewalls in the first direction D1 of the end portions in the first direction D1 of the first and second active fins 105, respectively.

The first and second gate spacers 172 and 174 may be formed on the upper surfaces and the sidewalls in the second direction D2 of the first and second active fins 105, respectively, and may not be formed on the sidewalls in the first direction D1 of the end portions in the first direction D1 of the first and second active fins 105, respectively.

In example embodiments, the width in the first direction D1 of the first gate structure 232 may be greater than the width in the first direction D1 of the second gate structure 234, and thus the first width W1 of the portion of the first gate structure 232 overlapping the first active fin 105 in the third direction D3 may be greater than the second width W2 in the first direction D1 of the second gate structure 234 overlapping the second active fin 105 in the third direction D3.

Figure 21:
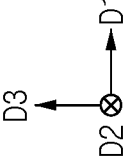
FIGS. 21 to 23 are cross-sectional views illustrating semiconductor devices in accordance with example embodiments.
Figure 22:
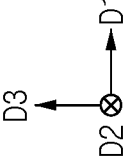
Figure 23:
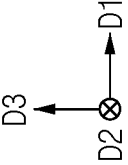

FIGS. 21 to 23 are cross-sectional views illustrating semiconductor devices in accordance with example embodiments, and may correspond to FIG. 3.

These semiconductor devices may be substantially the same as or similar to that of FIGS. 1 to 4, except for the protrusion portion, and thus repeated explanations thereof are omitted herein.

Referring to FIG. 21, the protrusion portion 125a may be formed at a portion of the second isolation pattern 125 adjacent to the second sidewall thereof on the second region II of the first substrate 100, and the lower surface of the protrusion portion 125a may be lower than that of other portions of the second isolation pattern 125.

Referring to FIG. 22, the protrusion portions 125a may be formed at respective portions of the second isolation pattern 125 adjacent to the first sidewall thereof on the first region I of the first substrate 100 and the second sidewall thereof on the second region II of the first substrate 100, and the lower surface of each of the protrusion portions 125a may be lower than that of other portions of the second isolation pattern 125.

In example embodiments, the lower surfaces of the protrusion portions 125a on the first and second regions I and II, respectively, of the first substrate 100 may be substantially coplanar with each other.

Alternatively, referring to FIG. 23, the lower surface of the protrusion portion 125*a* on the first region I of the first substrate 100 may be lower than that of the protrusion portion 125*a* on the second region II of the first substrate 100.

Figure 24:
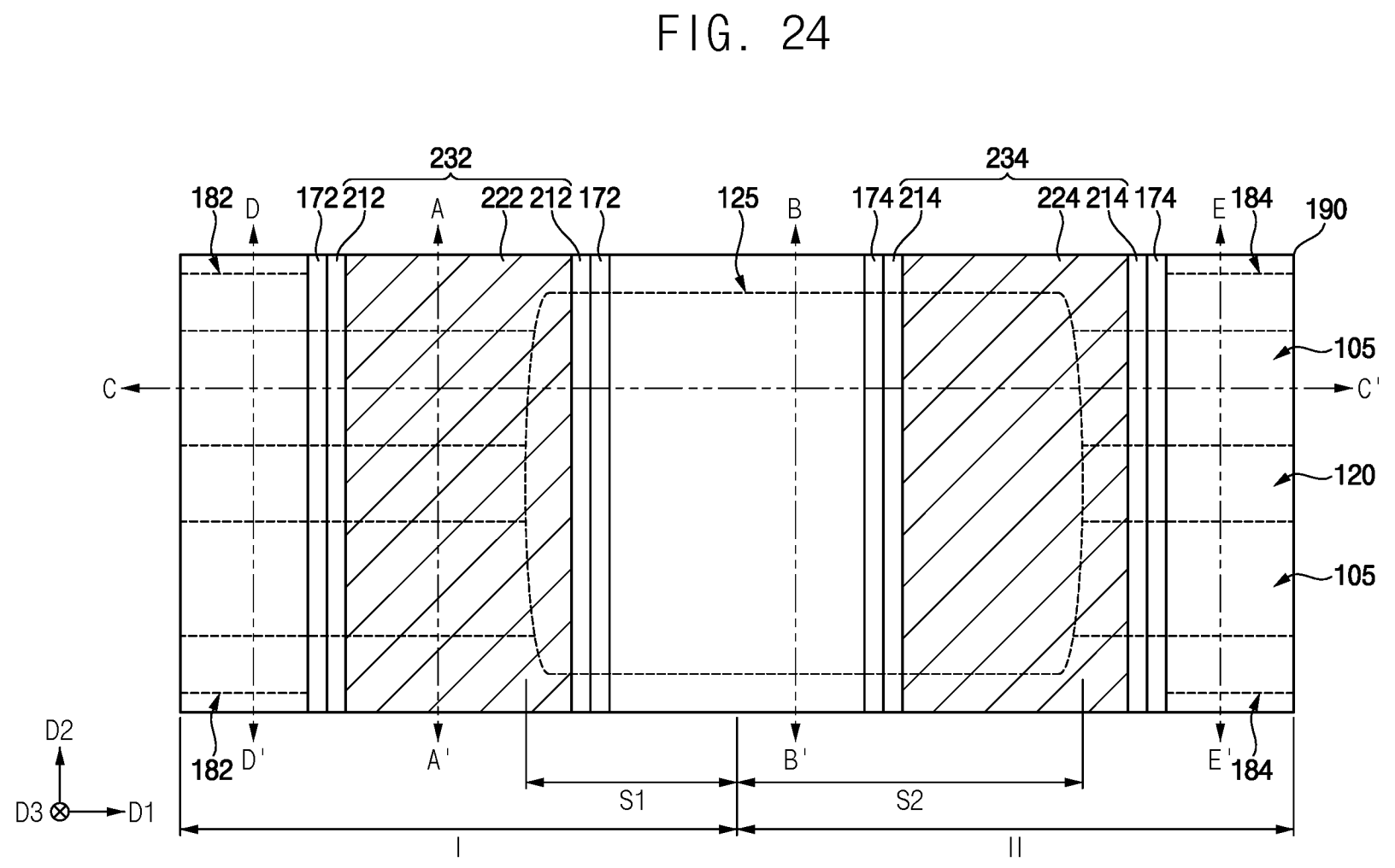

FIG. 24 is a plan view illustrating a semiconductor device in accordance with example embodiments, and may correspond to FIG. 1.

This semiconductor device may be substantially the same as or similar to that of FIGS. 1 to 4, except for the shape of the second isolation pattern, and thus repeated explanations thereof are omitted herein.

Referring to FIG. 24, each of the sidewalls in the first direction D1 of the second isolation pattern 125 may have a shape of a convex shape from the boundary between the first and second regions I and II of the first substrate 100 toward a central portion of the first region I or the second region II of the first substrate 100, instead of a line shape, in a plan view.

Figure 25:
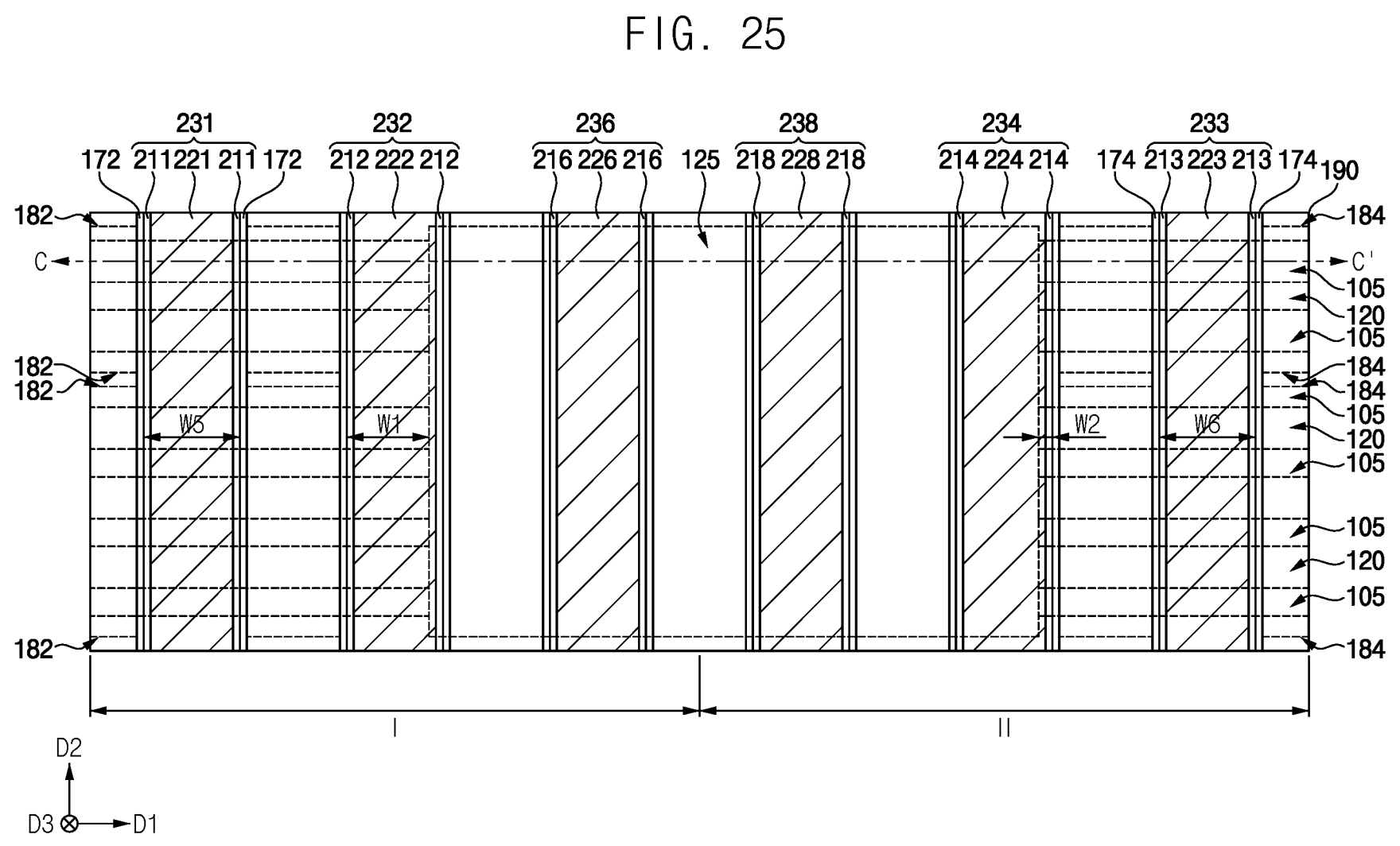
Figure 26:
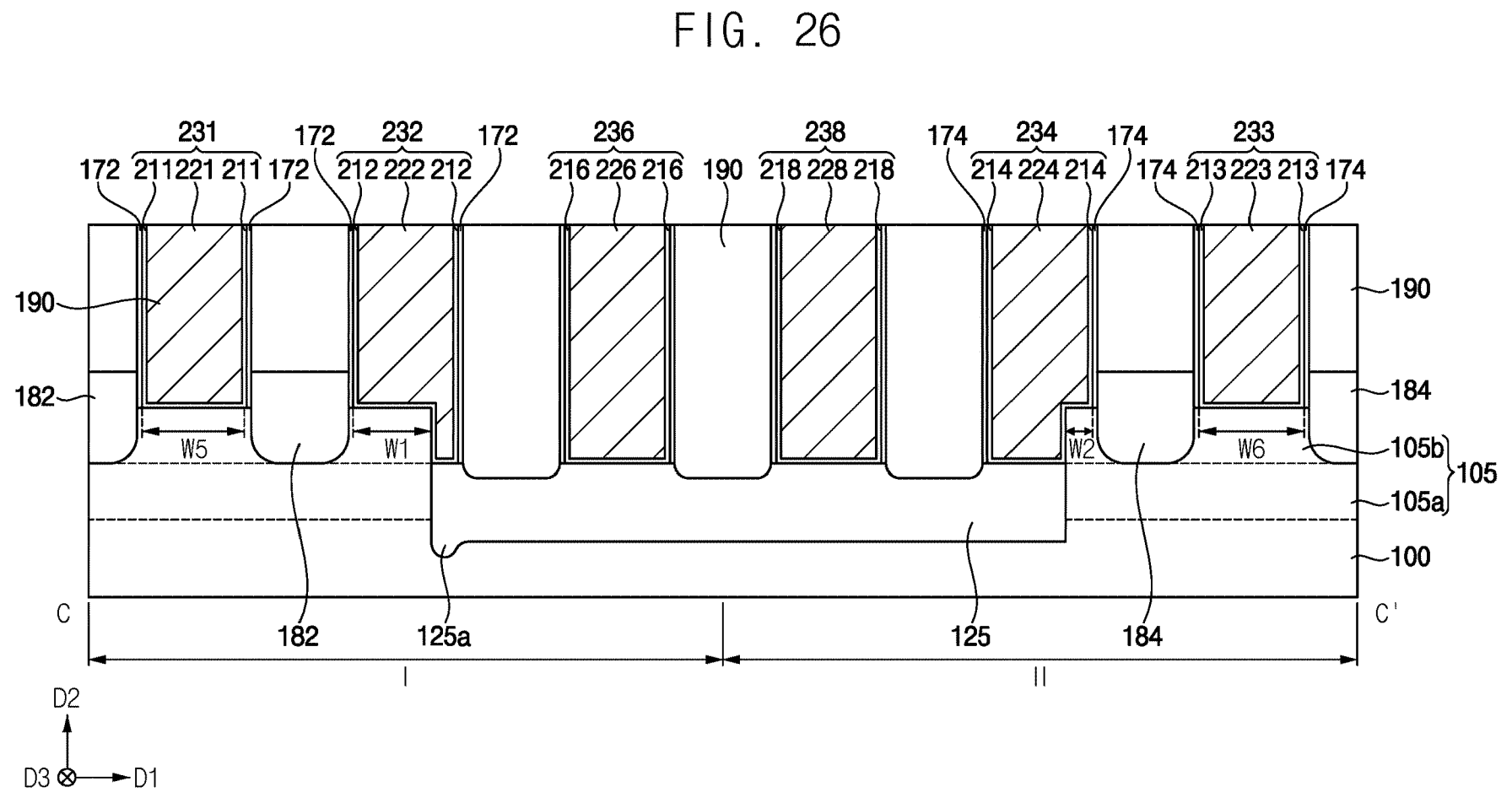

FIGS. 25 and 26 are a plan view and a cross-sectional view, respectively, illustrating a semiconductor device in accordance with example embodiments, and may correspond to FIGS. 1 and 3, respectively.

This semiconductor device may be substantially the same as or similar to that of FIGS. 1 to 4, except for further comprising gate structures, and thus repeated explanations thereof are omitted herein.

Referring to FIGS. 25 and 26, the semiconductor device may further include a fifth gate structure 231 and a fifth dummy gate structure 236 on the first region I of the first substrate 100, and a sixth gate structure 233 and a sixth dummy gate structure 238 on the second region II of the first substrate 100, in addition to the first and second gate structures 232 and 234.

FIGS. 25 and 26 show one of a fifth gate structure 231 and one of a fifth dummy gate structure 236 on the first region I of the first substrate 100, however, aspects of the inventive concept may not be limited thereto, and a plurality of fifth gate structures 231 and a plurality of fifth dummy gate structures 236 may be disposed on the first region I of the first substrate 100.

Likewise, FIGS. 25 and 26 show one of a sixth gate structure 233 and one of a sixth dummy gate structure 238 on the second region II of the first substrate 100, however, aspects of the inventive concept may not be limited thereto, and a plurality of sixth gate structures 233 and a plurality of sixth dummy gate structures 238 may be disposed on the second region II of the first substrate 100.

The fifth gate structure 231 may include a fifth gate insulation pattern 211 and a fifth gate electrode 221 stacked on the first active fin 105 and the first isolation pattern 120, and the sixth gate structure 233 may include a sixth gate insulation pattern 213 and a sixth gate electrode 223 stacked on the second active fin 105 and the first isolation pattern 120.

Additionally, the fifth dummy gate structure 236 may include a fifth dummy gate insulation pattern 216 and a fifth dummy gate electrode 226 stacked on the first and second isolation patterns 120 and 125, and the sixth dummy gate structure 238 may include a sixth dummy gate insulation pattern 218 and a sixth dummy gate electrode 228 stacked on the first and second isolation patterns 120 and 125.

In example embodiments, the fifth gate insulation pattern 211 may be formed on the upper surface and the sidewall in the second direction D2 of the upper portion of the first active fin 105 on the first region I of the first substrate 100, the upper surface of the portion of the first isolation pattern 120 on the first region I of the first substrate 100, and the inner sidewall of the first gate spacer 172, and a lower surface and a sidewall of the fifth gate electrode 221 may be covered by the fifth gate insulation pattern 211.

Additionally, the sixth gate insulation pattern 213 may be formed on the upper surface and the sidewall in the second direction D2 of the upper portion of the second active fin 105 on the second region II of the first substrate 100, the upper surface of the portion of the first isolation pattern 120 on the second region II of the first substrate 100, and the inner sidewall of the second gate spacer 174, and a lower surface and a sidewall of the sixth gate electrode 223 may be covered by the sixth gate insulation pattern 213.

In example embodiments, the fifth dummy gate insulation pattern 216 may be formed on the upper surfaces of the portions of the first and second isolation patterns 120 and 125 on the first region I of the first substrate 100 and the inner sidewall of the first gate spacer 172, and a lower surface and a sidewall of the fifth dummy gate electrode 226 may be covered by the fifth dummy gate insulation pattern 216.

Additionally, the sixth dummy gate insulation pattern 218 may be formed on the upper surfaces of the portions of the first and second isolation patterns 120 and 125 on the second region II of the first substrate 100 and the inner sidewall of the second gate spacer 174, and a lower surface and a sidewall of the sixth dummy gate electrode 228 may be covered by the sixth dummy gate insulation pattern 218.

The fifth and sixth gate structures 231 and 233 on the first and second regions I and II, respectively, of the first substrate 100 may overlap the first and second active fins 105, respectively, in the third direction D3 by fifth and sixth widths W5 and W6, respectively, when compared to the first and second gate structures 232 and 234 on the portions of the first and second regions I and II, respectively, of the first substrate 100 adjacent to the boundary between the first and second regions I and II of the first substrate 100, which may overlap the first and second active fins 105 in the third direction D3 by the first and second widths W1 and W2, respectively.

In example embodiments, the fifth and sixth widths W5 and W6 may be substantially equal to each other, however, aspects of the inventive concept may not be limited thereto. The first width W1 may be less than or equal to the fifth width W5 and greater than half the fifth width W5. The second width W2 may be less than half the sixth width W6. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 27:
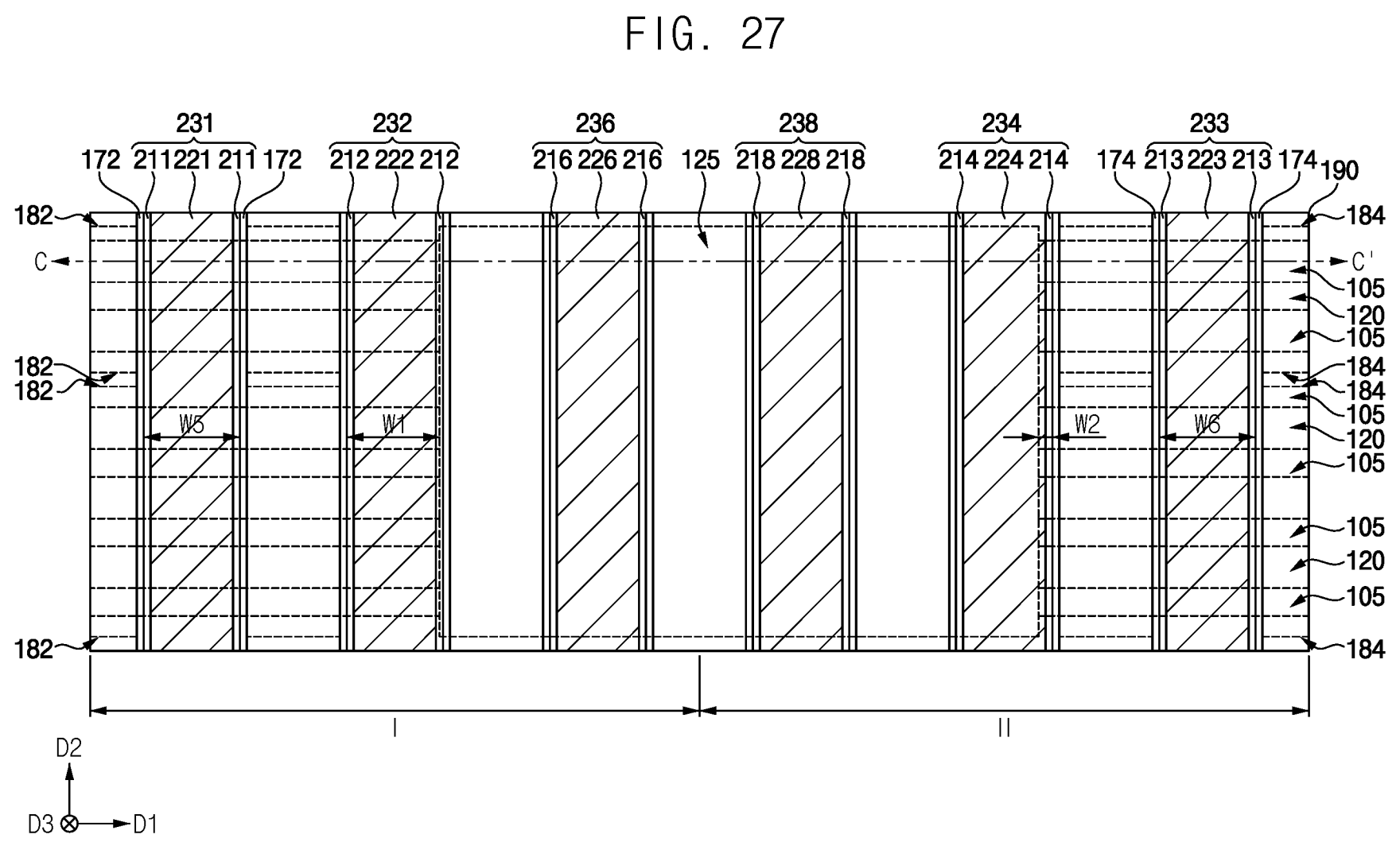
Figure 28:
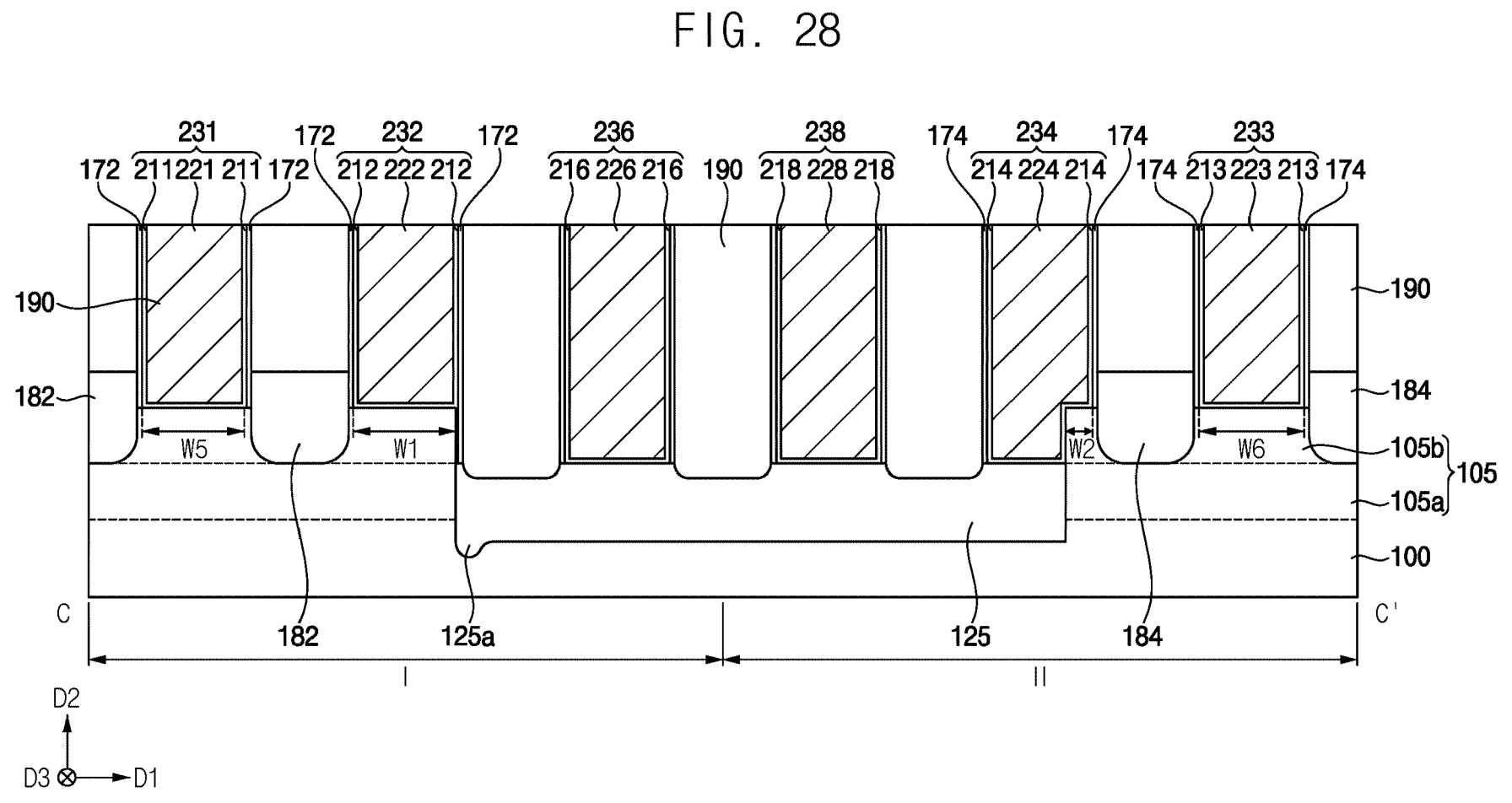

FIGS. 27 and 28 are a plan view and a cross-sectional view, respectively, illustrating a semiconductor device in accordance with example embodiments, and may correspond to FIGS. 25 and 26, respectively.

This semiconductor device may be substantially the same as or similar to that of FIGS. 25 to 26, except for the position and shape of the first gate structure 232, and thus repeated explanations thereof are omitted herein.

Referring to FIGS. 27 and 28, as in the semiconductor device illustrated with reference to FIGS. 17 and 18, the first gate electrode 222 included in the first gate structure 232 may not cover the sidewall in the first direction D1 of the end portion in the first direction D1 of the first active fin 105, and thus the first gate electrode 222 may be formed only on the upper surface and the sidewall in the second direction D2 of the end portion of the first active fin 105.

Figure 29:
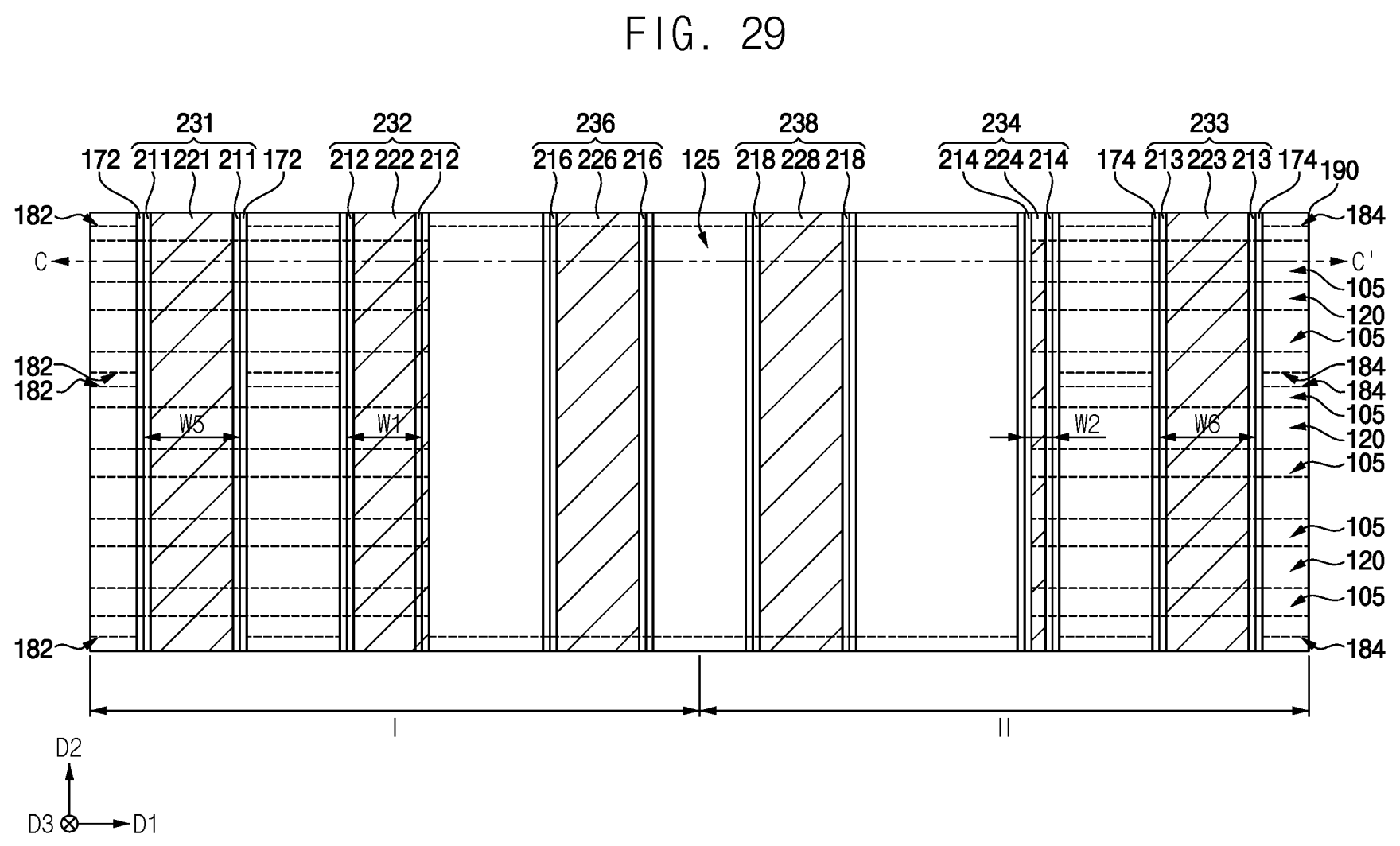
Figure 30:
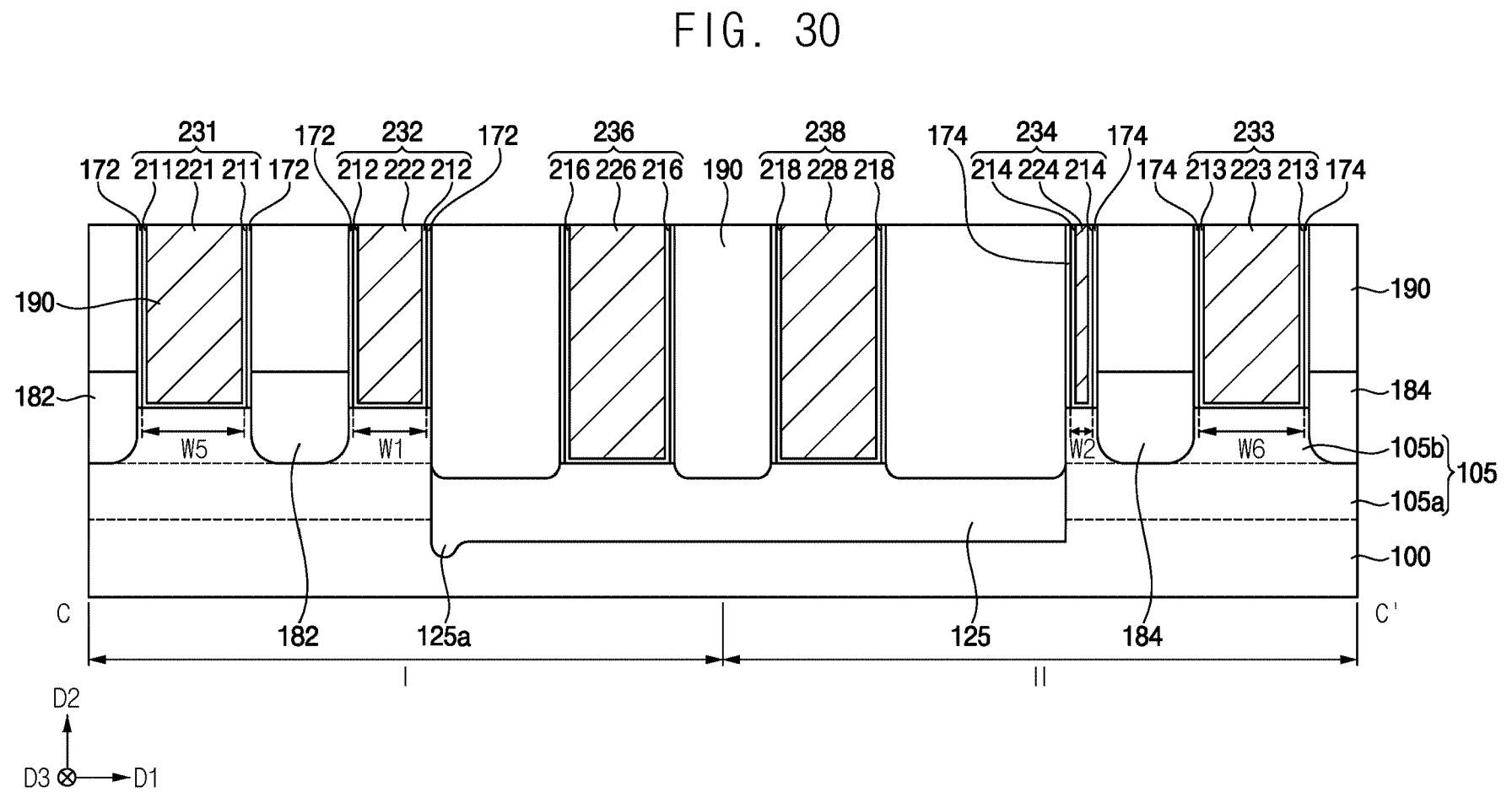

FIGS. 29 and 30 are a plan view and a cross-sectional view, respectively, illustrating a semiconductor device in accordance with example embodiments, and may correspond to FIGS. 25 and 26, respectively.

This semiconductor device may be substantially the same as or similar to that of FIGS. 25 to 26, except for the position and shape of the first and second gate structures 232 and 234, and thus repeated explanations thereof are omitted herein.

Referring to FIGS. 29 and 30, as in the semiconductor device illustrated with reference to FIGS. 19 and 20, the first and second gate structures 232 and 234 may be formed on the upper surfaces and sidewalls in the second direction D2 of the first and second fins 105, respectively, on the first and second regions I and II, respectively, of the first substrate 100, and may not be formed on the sidewalls in the first direction D1 of the end portions in the first direction D1 of the first and second active fins 105, respectively.

The width in the first direction D1 of the first gate structure 232 may be greater than the width in the first direction D1 of the second gate structure 234, and thus the first width W1 of the portion of the first gate structure 232 overlapping the first active fin 105 in the third direction D3 may be greater than the second width W2 in the first direction D1 of the second gate structure 234 overlapping the second active fin 105 in the third direction D3.

Figure 31:
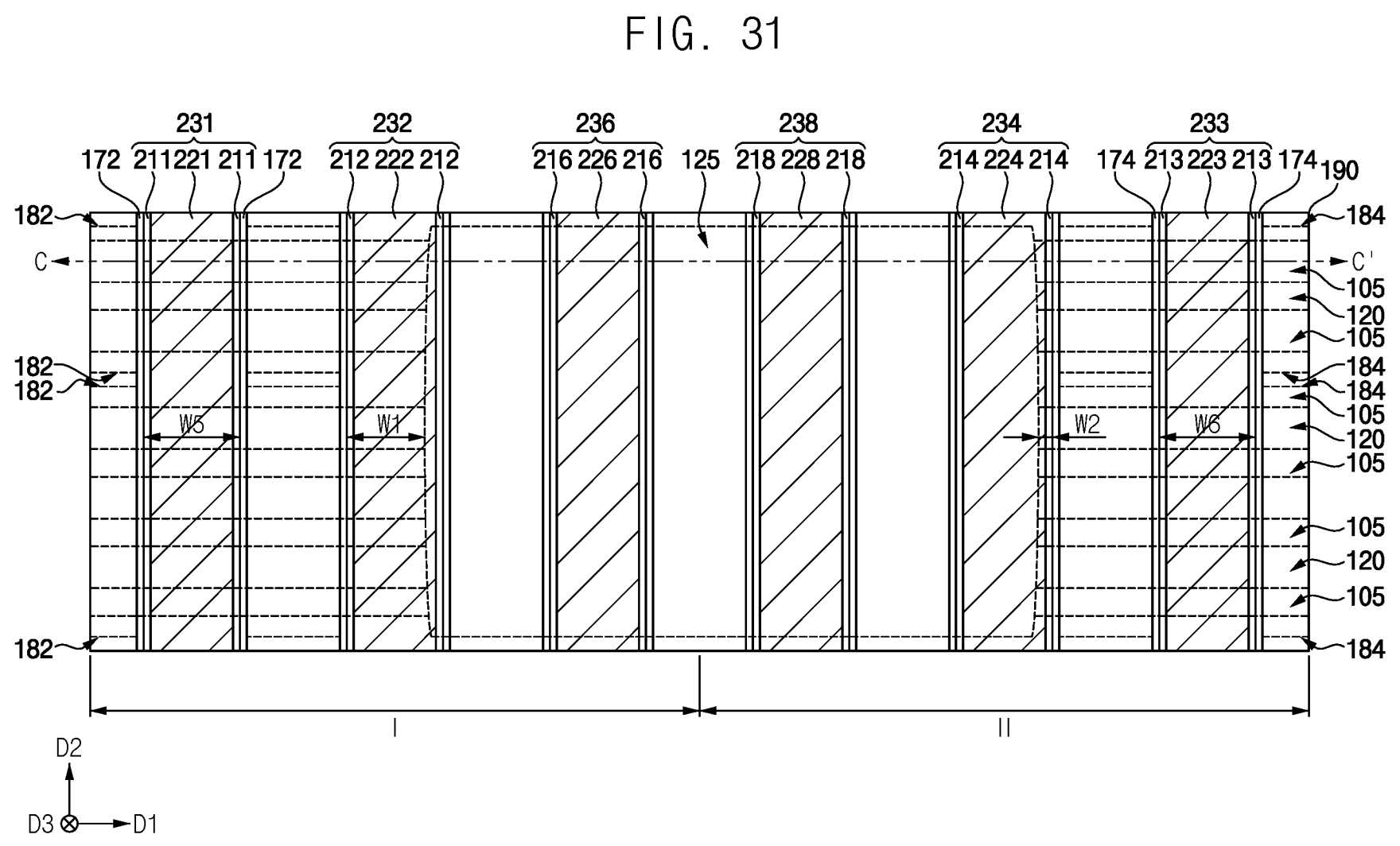

FIG. 31 is a plan view illustrating a semiconductor device in accordance with example embodiments, and may correspond to FIG. 25.

This semiconductor device may be substantially the same as or similar to that of FIGS. 25 to 26, except for the shape of the second isolation pattern, and thus repeated explanations thereof are omitted herein.

Referring to FIG. 31, each of the sidewalls in the first direction D1 of the second isolation pattern 125 may have a shape of a convex shape from the boundary between the first and second regions I and II of the first substrate 100 toward the first region I or the second region II of the first substrate 100, instead of a line shape, in a plan view.

In an example embodiment, a curvature of each of the first and second sidewalls of the second isolation pattern 125 shown in FIG. 31 may be less than a curvature of each of the first and second sidewalls of the second isolation pattern 125 shown in FIG. 24.

FIG. 31 shows the second isolation pattern 125 extends through five active fins 105 disposed in the second direction D2, however, aspects of the inventive concept may not be limited thereto, and the second isolation pattern 125 may extend through a plurality of active fins 105 less than or more than five active fins 105. In an example embodiment, as the number of the active fins 105 through which the second isolation pattern 125 increases, the curvature of each of the first and second sidewalls of the second isolation pattern 125 may decrease.

Figure 32:
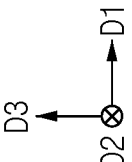

FIGS. 32 and 33 are cross-sectional views illustrating a semiconductor device in accordance with example embodiments, and may correspond to FIGS. 3 and 4, respectively.

This semiconductor device may be substantially the same as or similar to that of FIGS. 1 to 4, except for further comprising capping patterns, contact plugs, ohmic contacts and an insulating interlayer, and thus repeated explanations thereof are omitted herein.

Referring to FIGS. 32 and 33, the semiconductor device may further include a first capping pattern 262 on the first gate structure 232 and the first gate spacer 172 and a second capping pattern 264 on the second gate structure 234 and the second gate spacer 174.

Each of the first and second capping patterns 262 and 264 may include an insulating nitride, e.g., silicon nitride, silicon oxynitride, etc.

Additionally, the semiconductor device may further include a third insulating interlayer 270 on the first insulating interlayer 190, first and second contact plugs 282 and 284 extending through the first and third insulating interlayers 190 and 270 to contact the first and second source/drain layers 182 and 184, respectively, and third and fourth contact plugs 292 and 294 extending through the third insulating interlayer 270 and the first and second capping patterns 262 and 264, respectively, to contact the first and second gate electrodes 222 and 224, respectively.

Each of the first to fourth contact plugs 282, 284, 292 and 294 may include a conductive pattern and a barrier pattern covering a lower surface and a sidewall of the conductive pattern.

A first ohmic contact pattern 186 may be formed between the first source/drain layer 182 and the first contact plug 282, and a second ohmic contact pattern 188 may be formed between the second source/drain layer 184 and the second contact plug 284. Each of the first and second ohmic contact patterns 186 and 188 may include a metal silicide, e.g., cobalt silicide, nickel silicide, titanium silicide, etc.

The third insulating interlayer 270 may include an oxide, e.g., silicon oxide, and each of the first to fourth contact plugs 282, 284, 292 and 294 may include, e.g., a metal, a metal nitride, a metal silicide, etc.

Figure 34:
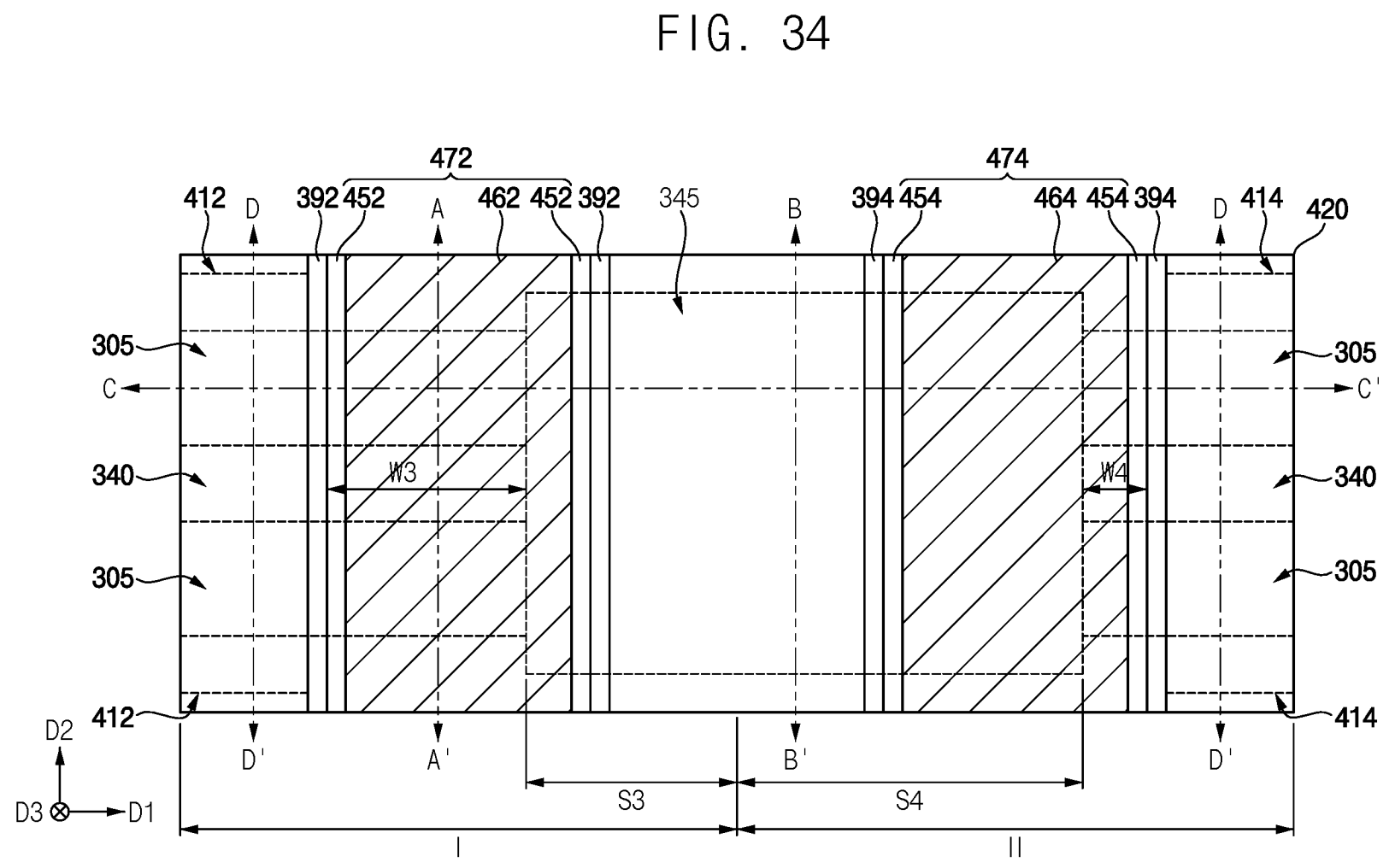
Figure 35:
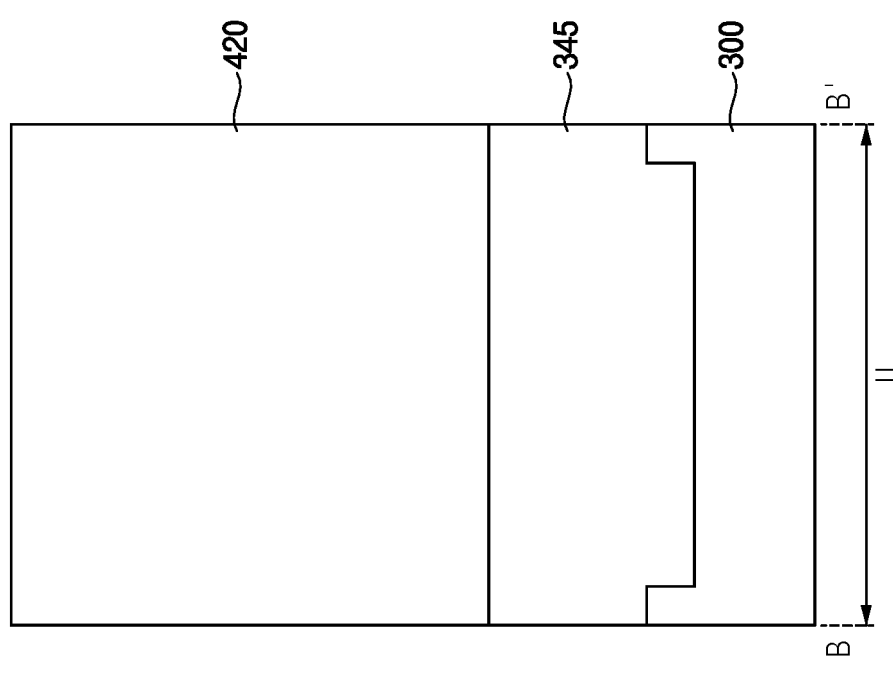
Figure 35:
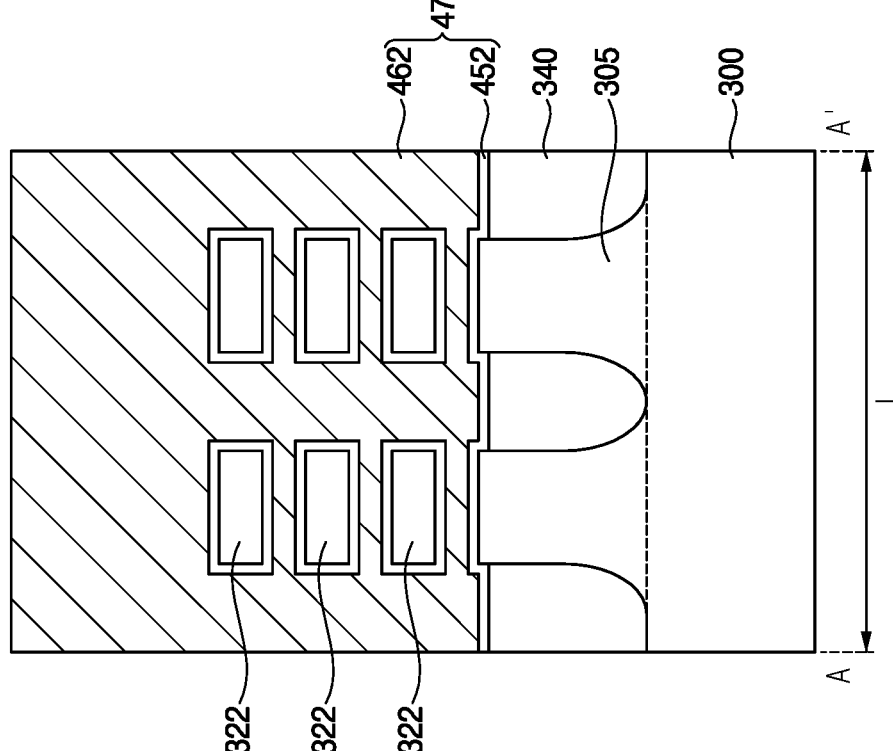
Figure 35:
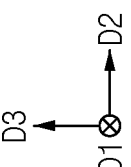
Figure 36:
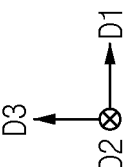
Figure 37:
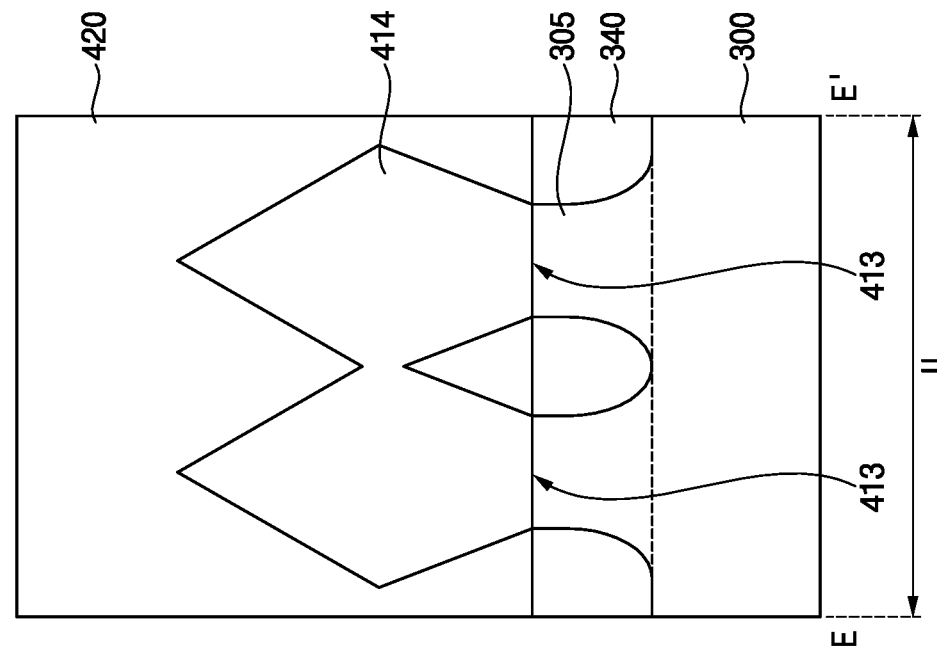
Figure 37:
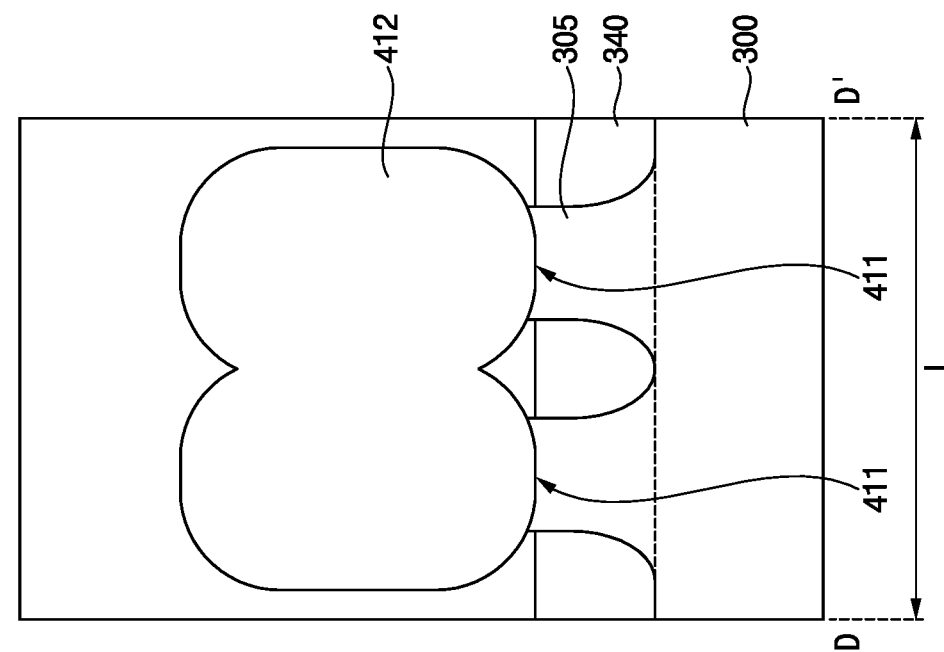
Figure 37:
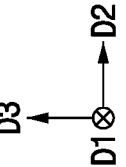

FIGS. 34 to 37 are a plan view and cross-sectional views illustrating a semiconductor device in accordance with example embodiments. Particularly, FIG. 34 is the plan view, and FIGS. 35 to 37 are the cross-sectional views. FIG. 35 includes cross-sectional views taken along lines A-A' and B-B' of FIG. 34, FIG. 36 is a cross-sectional view taken along line C-C' of FIG. 34, and FIG. 37 includes cross-sectional views taken along lines D-D' and E-E' of FIG. 34.

This semiconductor device may include elements substantially the same as or similar to those illustrated with reference to FIGS. 1 to 4, and thus repeated explanations thereof are omitted herein.

As illustrated below, the semiconductor device may be a multi-bridge channel field effect transistor (MBCFET) including first semiconductor patterns 322 spaced apart from each other in the third direction D3 and serving as channels, respectively, and second semiconductor patterns 324 spaced apart from each other in the third direction D3 and serving as channels, respectively. Thus, other elements except for the first and second semiconductor patterns 322 and 324 may have similar functions and structures to corresponding elements included in the finFET of FIGS. 1 to 4.

Referring to FIGS. 34 to 37, the semiconductor device may include an active pattern 305, third and fourth isolation patterns 340 and 345, third and fourth gate structures 472 and 474, first and second semiconductor patterns 322 and 324, third and fourth source/drain layers 412 and 414, third and fourth gate spacers 392 and 394, a first inner spacer 400 and a second insulating interlayer 420 on a second substrate 300 including first and second regions I and II.

The active pattern 305 may have a fin-like shape protruding from an upper surface of the second substrate 300, and thus may also be referred to as an active fin 305. A sidewall in the second direction D2 of the active pattern 305 may be partially covered by the third isolation pattern 340 on the second substrate 300. In example embodiments, the active pattern 305 may extend in the first direction D1, and a plurality of active patterns 305 may be spaced apart from each other in the second direction D2. Hereinafter, if needed, a portion of the active fin 305 on the first region I of the second substrate 300 may be referred to as a third active fin, and a portion of the active fin 305 on the second region II of the second substrate 300 may be referred to as a fourth active fin.

In example embodiments, the fourth isolation pattern 345 may be formed on portions of the first and second regions I and II of the second substrate 300 adjacent to a boundary between the first and second regions I and II of the second substrate 300, and may contact end portions in the first direction D1 of the active pattern 305 and the third isolation pattern 340. In example embodiments, a lower surface of the fourth isolation pattern 345 may be lower than or substantially coplanar with an upper surface of the second substrate 300 or a lower surface of the third isolation pattern 340.

In example embodiments, a third distance S3 from the boundary between the first and second regions I and II of the second substrate 300 to a first sidewall of the fourth isolation pattern 345 on the first region I of the second substrate 300 may be less than a fourth distance S4 from the boundary between the first and second regions I and II of the second substrate 300 to a second sidewall of the fourth isolation pattern 345 on the second region II of the second substrate 300.

In an example embodiment, a lower surface of a portion of the fourth isolation pattern 345 on the first region I of the second substrate 300 adjacent to the first sidewall may be lower than that of other portions of the fourth isolation pattern 345, which may be referred to as a protrusion portion 345a.

In example embodiments, an upper surface of the fourth isolation pattern 345 may be substantially coplanar with an upper surface of the third isolation pattern 340, however, aspects of the inventive concept may not be limited thereto. Each of the third and fourth isolation patterns 340 and 345 may include an oxide, e.g., silicon oxide, and in some embodiments, may be merged with each other.

A plurality of first semiconductor patterns 322 may be formed at a plurality of levels, respectively, and may be spaced apart from each other in the third direction D3 from an upper surface of the active pattern 305. Each of the plurality of the first semiconductor patterns 322 may extend in the first direction D1. Additionally, a plurality of second semiconductor patterns 324 may be formed at a plurality of levels, respectively, and may be spaced apart from each other in the third direction D3 from the upper surface of the active pattern 305. Each of the plurality of the second semiconductor patterns 324 may extend in the first direction D1. FIGS. 35 and 36 show three first semiconductor patterns 322 at three levels, respectively, and three second semiconductor patterns 234 at three levels, respectively, however, aspects of the inventive concept may not be limited thereto.

In example embodiments, each of the plurality of first and second semiconductor patterns 322 and 324 may be a nano-sheet or nano-wire including a semiconductor material, e.g., silicon, germanium, etc. In example embodiments, each of the plurality of first and second semiconductor patterns 322 and 324 may serve as a channel in a transistor, and thus may also be referred to as a channel.

The first inner spacer 400 may be formed between neighboring ones of the first semiconductor patterns 322 in the third direction D3, and may contact an upper surface or a lower surface of an end portion in the first direction D1 of each of the first semiconductor patterns 322. Additionally, the first inner spacer 400 may contact a sidewall of the third source/drain layer 412 and a sidewall of the third gate structure 472. The first inner spacer 400 may include an insulating nitride, e.g., silicon nitride.

FIG. 36 shows the first inner spacer 400 is formed only between the first semiconductor patterns 322, however, aspects of the inventive concept may not be limited thereto, and may also be formed between the second semiconductor patterns 324.

In example embodiments, the third and fourth gate structures 472 and 474 may extend in the second direction D2 on the active pattern 305 and the third and fourth isolation patterns 340 and 345, respectively, on the first and second regions I and II, respectively, of the second substrate 300.

The third gate spacer 392 may be formed on each of opposite sidewalls in the first direction D1 of the third gate structure 472, and the fourth gate spacer 394 may be formed on each of opposite sidewalls in the first direction D1 of the fourth gate structure 474. Each of the third and fourth gate spacers 392 and 394 may include an insulating nitride, e.g., silicon nitride, silicon oxynitride, silicon oxycarbonitride, etc.

In example embodiments, the third gate structure 472 may cover lower and upper surfaces and sidewalls in the second direction D2 of each of the first semiconductor patterns 322, and also a sidewall in the first direction D1 of each of the first semiconductor patterns 322. Additionally, the fourth gate structure 474 may cover lower and upper surfaces and sidewalls in the second direction D2 of each of the second semiconductor patterns 324, and also a sidewall in the first direction D1 of each of the second semiconductor patterns 324.

In example embodiments, the third gate structure 472 may include a third gate insulation pattern 452 and a third gate electrode 462 stacked on the active fin 305 and the third and fourth isolation patterns 340 and 345, and the fourth gate structure 474 may include a fourth gate insulation pattern 454 and a fourth gate electrode 464 stacked on the active fin 305 and the third and fourth isolation patterns 340 and 345.

In example embodiments, the third gate insulation pattern 452 may be formed on an upper surface and a sidewall in the second direction D2 of the third active fin 305 on the first region I of the second substrate 300, an upper surface of a portion of the third isolation pattern 340 on the first region I of the second substrate 300, sidewalls in the first direction D1 of end portions in the first direction D1 of the third active fin 305 and the portion of the third isolation pattern 340, an upper surface of a portion of the fourth isolation pattern 345 on the first region I of the second substrate 300, a surface of each of the first semiconductor patterns 322 and an inner sidewall of the third gate spacer 392, and a lower surface and a sidewall of the third gate electrode 462 may be covered by the third gate insulation pattern 452.

Additionally, the fourth gate insulation pattern 454 may be formed on an upper surface and a sidewall in the second direction D2 of the fourth active fin 305 on the second region II of the second substrate 300, an upper surface of a portion of the third isolation pattern 340 on the second region II of the second substrate 300, sidewalls in the first direction D1 of end portions in the first direction D1 of the fourth active fin 305 and the portion of the third isolation pattern 340, an upper surface of a portion of the fourth isolation pattern 345 on the second region II of the second substrate 300, a surface of each of the second semiconductor patterns 324 and an inner sidewall of the fourth gate spacer 394, and a lower surface and a sidewall of the fourth gate electrode 464 may be covered by the fourth gate insulation pattern 454.

In example embodiments, a third width W3 in the first direction D1 of a portion of the third gate structure 472 on the third active fin 305 on the first region I of the second substrate 300 may be greater than a fourth width W4 in the first direction D1 of a portion of the fourth gate structure 474 on the fourth active fin 305 on the second region II of the second substrate 300. In example embodiments, the third width W3 may be greater than half a width in the first direction D1 of the third gate structure 472, and the fourth width W4 may be less than half a width in the first direction D1 of the fourth gate structure 474.

In example embodiments, the third and fourth gate structures 472 and 474, which may be formed on the first and second regions I and II, respectively, of the second substrate 300, may have substantially the same width in the first direction D1, and may be spaced apart by the same distance from the boundary between the first and second regions I and II of the second substrate 300. The third distance S3 from the boundary between the first and second regions I and II of the second substrate 300 to the first sidewall of the fourth isolation pattern 345 may be less than the fourth distance S4 from the boundary between the first and second regions I and II of the second substrate 300 to the second sidewall of the fourth isolation pattern 345.

Thus, the third width W3 of a portion of the third gate structure 472 overlapping the third active fin 305 in the third direction D3 may be greater than the fourth width W4 of a portion of the fourth gate structure 474 overlapping the fourth active fin 305 in the third direction D3.

The third and fourth source/drain layers 412 and 414 may be formed on upper surfaces of portions of the third and fourth active fins 305, respectively, adjacent to the third and fourth gate structures 472 and 474, respectively, and may contact lower sidewalls of the third and fourth gate spacers 392 and 394, respectively.

In an example embodiment, a cross-section in the second direction D2 of the third source/drain layer 412 may have a shape of a rectangle with rounded corners or a circle, and a cross-section in the second direction D2 of the fourth source/drain layer 414 may have a shape of a pentagon or a rhombus.

If a distance between neighboring ones of the active patterns 305 in the second direction D2 is small, the third source/drain layers 412 grown from the third active fins 305 on the first region I of the second substrate 300 may be merged with each other, and likewise, the fourth source/drain layers 414 grown from the fourth active fins 305 on the second region II of the second substrate 300 may be merged with each other.

In example embodiments, the third source/drain layer 412 may include single crystalline silicon or single crystalline silicon carbide doped with n-type impurities, and thus may serve as a source/drain region of an NMOS transistor. Additionally, the fourth source/drain layer 414 may include single crystalline silicon-germanium doped with p-type impurities, and thus may serve as a source/drain region of a PMOS transistor.

Upper surfaces of the third and fourth source/drain layers 412 and 414 and the fourth isolation pattern 345 may be covered by the second insulating interlayer 420.

As illustrated above, the third width W3 in the first direction D1 of the portion of the third gate structure 472 overlapping the third active fin 305 in the third direction D3 may be greater than half the width in the first direction D1 of the third gate structure 472, and thus the NMOS transistor may have a decreased threshold voltage. Additionally, the fourth width W4 in the first direction D1 of the portion of the fourth gate structure 474 overlapping the fourth active fin 305 in the third direction D3 may be less than half the width in the first direction D1 of the fourth gate structure 474, and thus the PMOS transistor may have an increased threshold voltage.

Accordingly, the width of the portion of the gate structure overlapping the active fin in each transistor may be adjusted so that each transistor may have a desired threshold voltage.

FIGS. 38 to 49 are plan views and cross-sectional views illustrating a method of manufacturing a semiconductor device in accordance with example embodiments. Particularly, FIGS. 38, 40, 43 and 46 are the plan views, and FIGS. 39, 41-42, 44-45 and 47-49 are the cross-sectional views.

Figure 39:
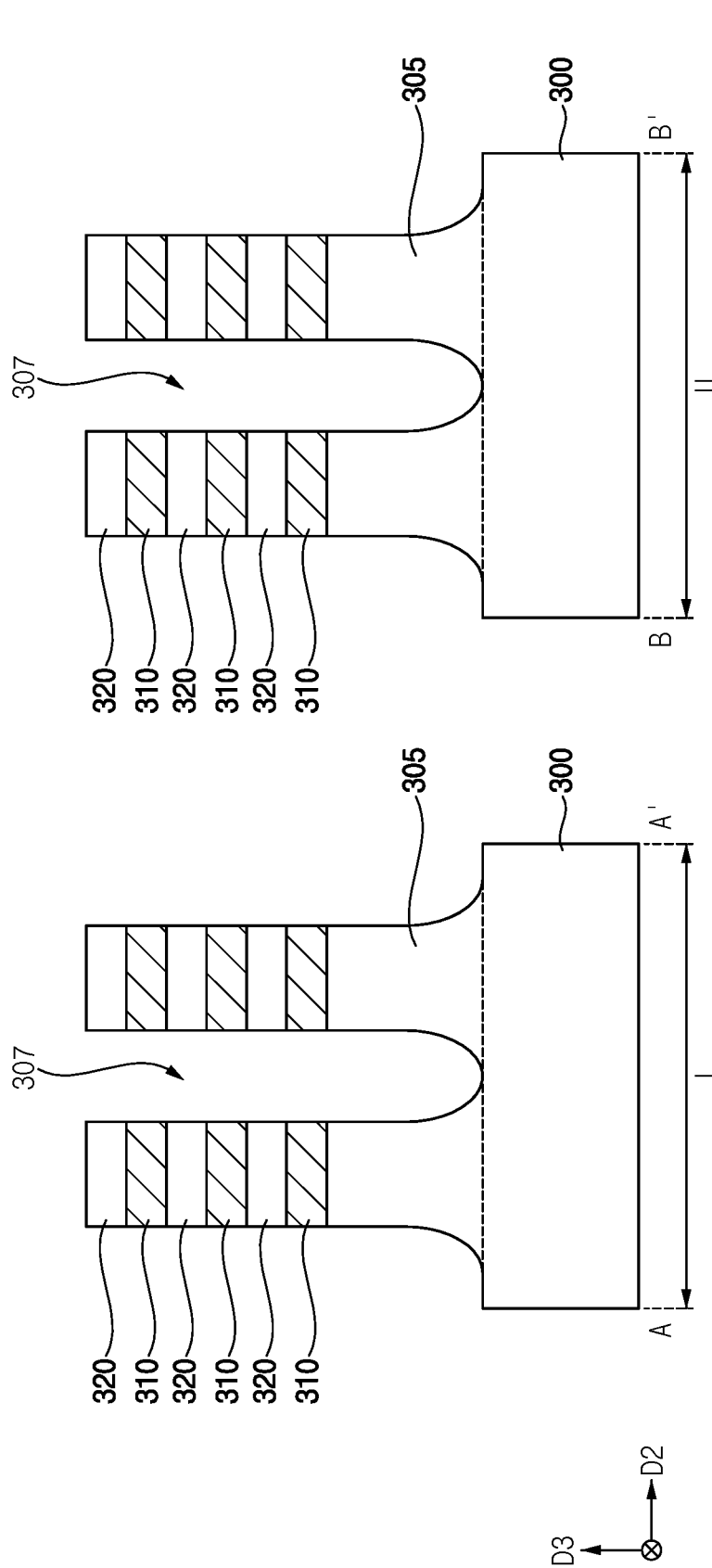
Figure 41:
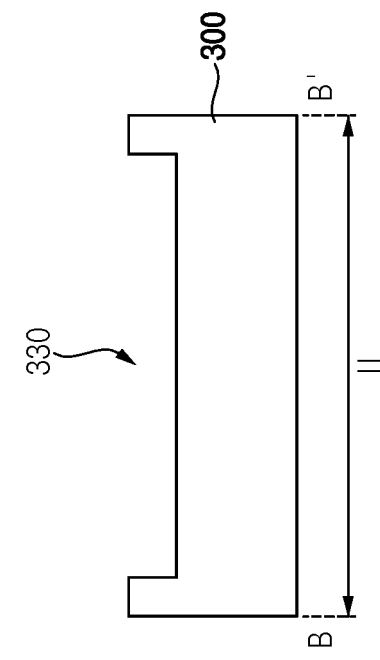
Figure 41:
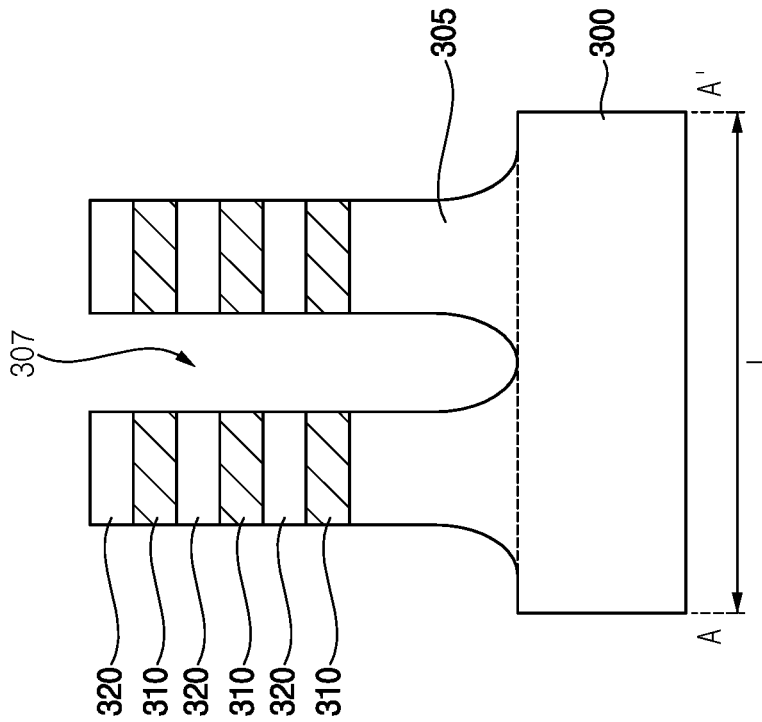
Figure 41:
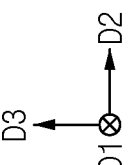
Figure 44:
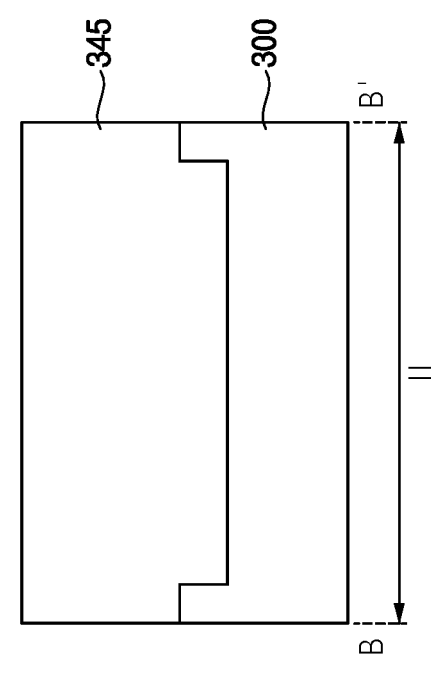
Figure 44:
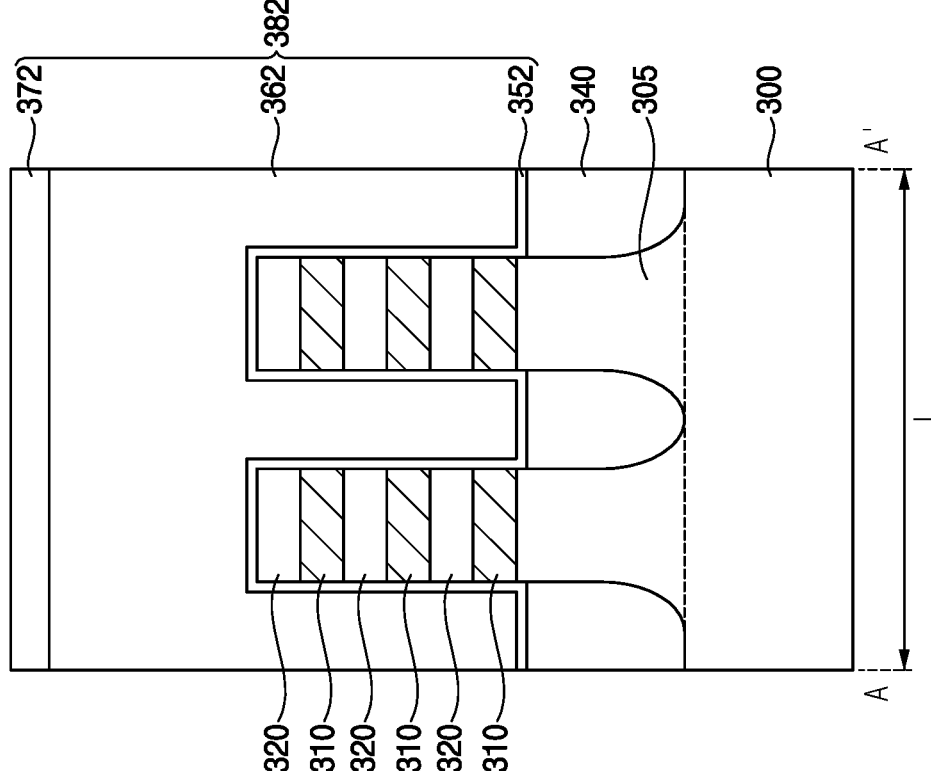
Figure 44:
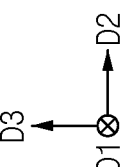
Figure 47:
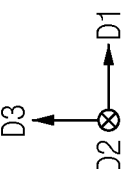
Figure 48:
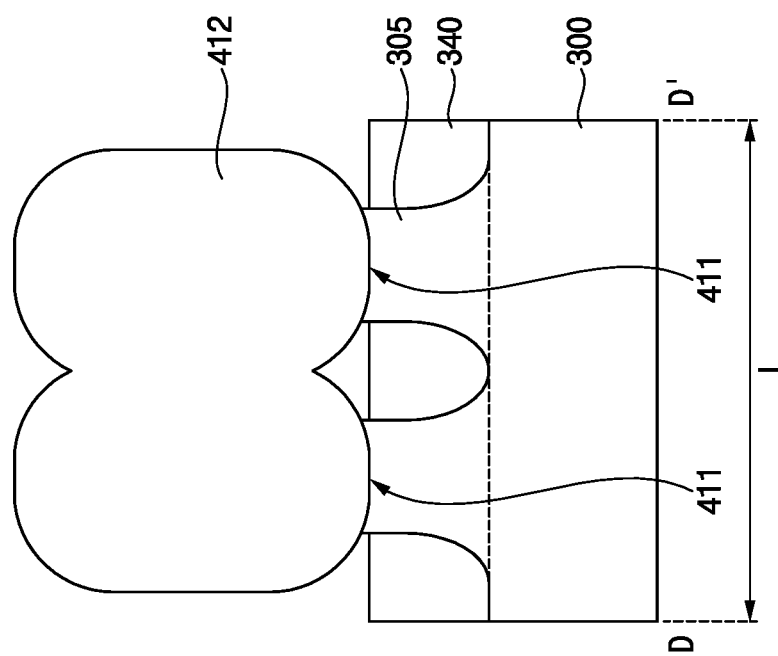
Figure 48:
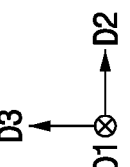

FIGS. 39, 41 and 44 include cross-sectional views taken along lines A-A' and B-B' of corresponding plan views, respectively, FIGS. 42, 45, 47 and 49 are cross-sectional views taken along lines C-C' of corresponding plan views, respectively, and FIG. 48 includes cross-sectional views taken along lines D-D' and E-E' of a corresponding plan view.

This method may include processes substantially the same as or similar to those illustrated with reference to FIGS. 5 to 16 and FIGS. 1 to 4, and thus repeated explanations thereof are omitted herein.

Figure 38:
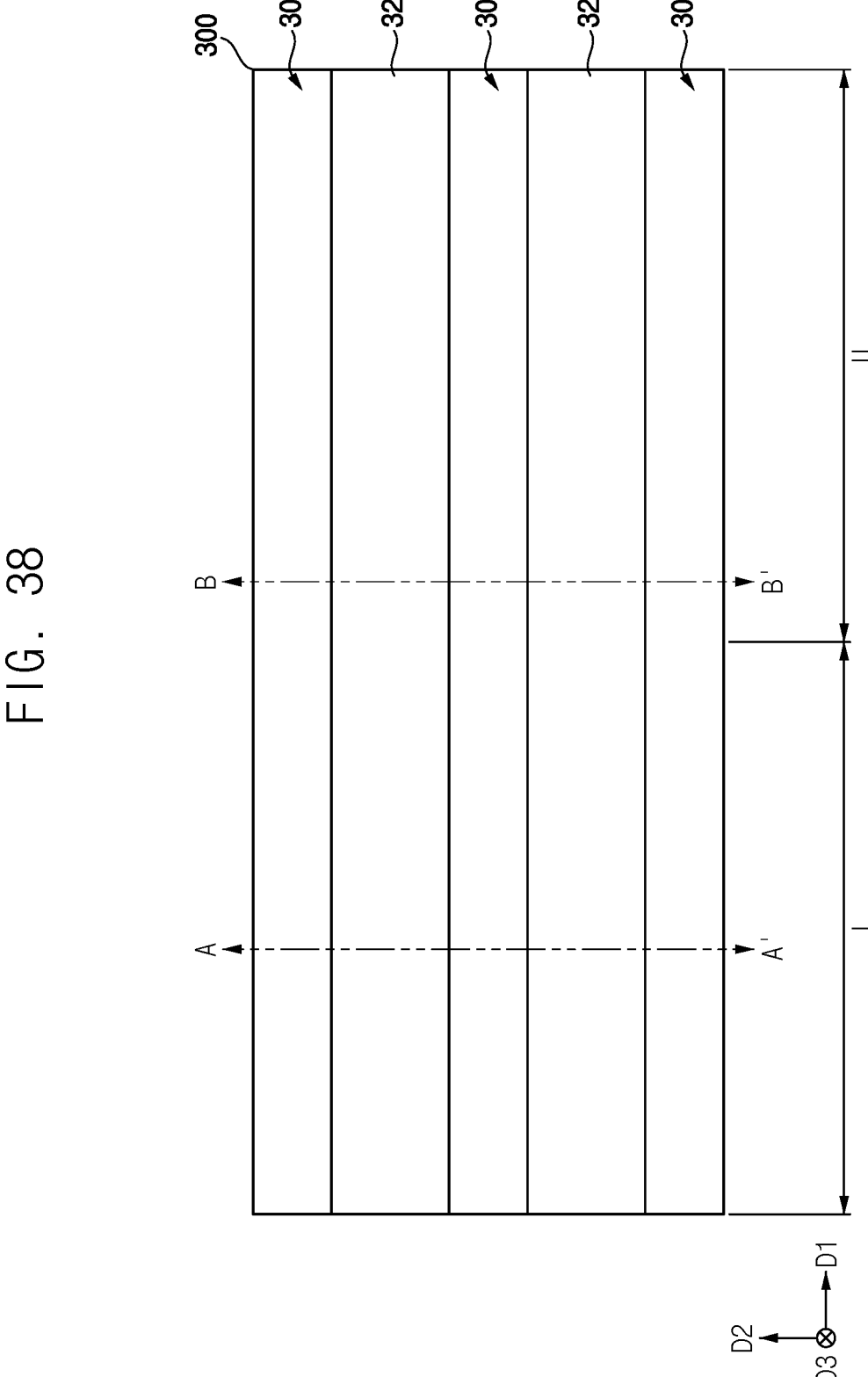

Referring to FIGS. 38 and 39, a sacrificial layer and a semiconductor layer may be alternately and repeatedly stacked on a second substrate 300 including first and second regions I and II, a first etching mask extending in the first direction D1 may be formed on an uppermost one of the semiconductor layers, and the semiconductor layers, the sacrificial layers and an upper portion of the second substrate 300 may be etched using the first etching mask to form a fourth trench 307.

Thus, an active pattern 305 extending in the first direction D1 may be formed on the second substrate 300, and sacrificial lines 310 and semiconductor lines 320 may be alternately and repeatedly stacked in the third direction D3 on the active pattern 305. The active pattern 305 may have a fin-like shape protruding from an upper surface of the second substrate 300, and thus may also be referred to as an active fin.

Hereinafter, the active fin 305 and the sacrificial lines 310 and the semiconductor lines 320 alternately and repeatedly stacked on the active fin 305 may be collectively referred to as a line structure. In example embodiments, the line structure may extend in the first direction D1 on the first and second regions I and II of the second substrate 300, and a plurality of line structures may be spaced apart from each other in the second direction D2.

FIG. 39 shows three sacrificial lines 310 and three semiconductor lines 320 at three levels, respectively, however, aspects of the inventive concept may not be limited thereto. The sacrificial lines 320 may include a material having an etching selectivity with respect to the second substrate 300 and the semiconductor lines 320, e.g., silicon-germanium.

US 12,672,348 B2

23

Figure 40:
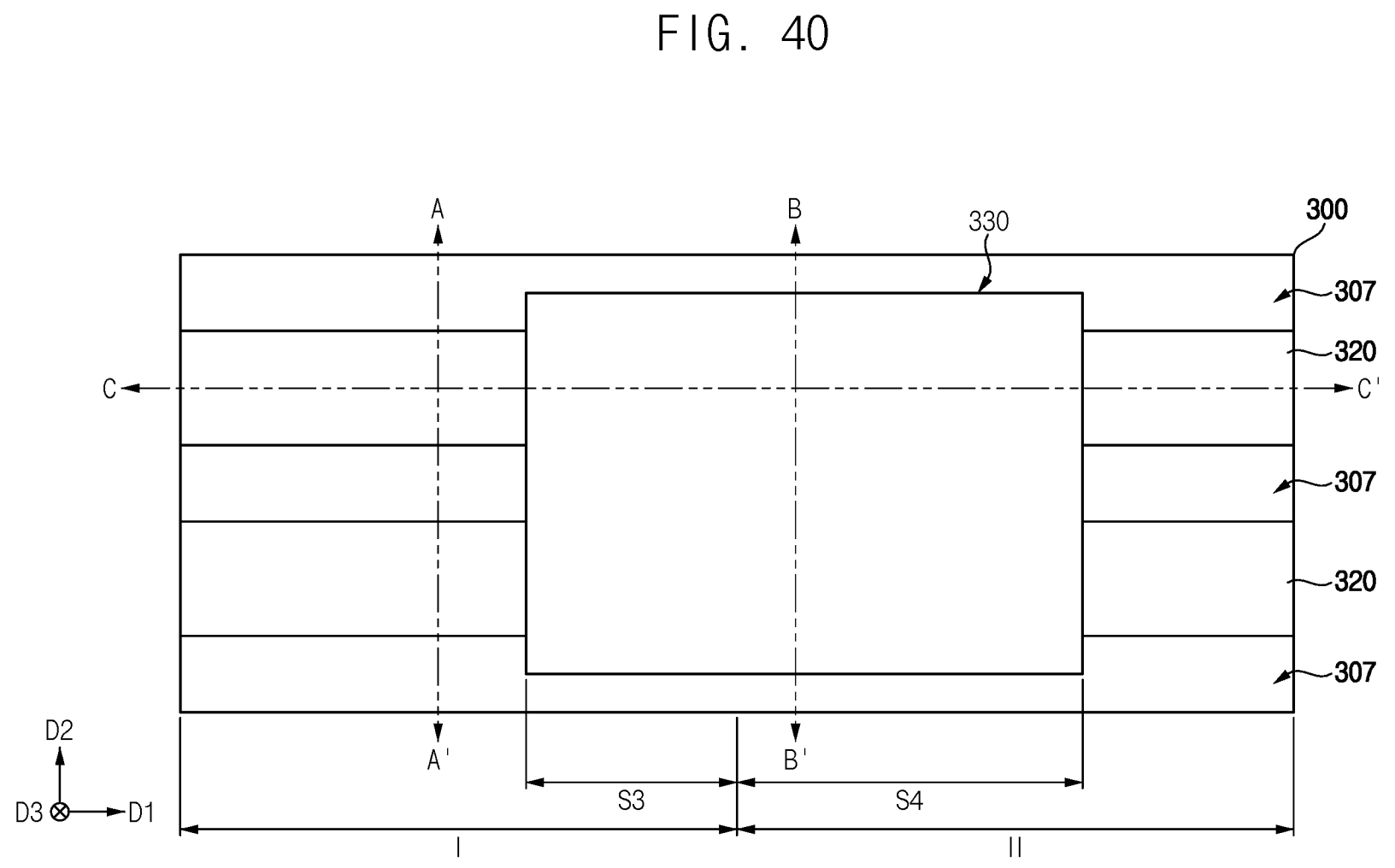
Figure 42:
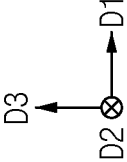

Referring to FIGS. 40 to 42, a portion of the line structure adjacent to a boundary between the first and second regions I and II of the second substrate 300 may be removed to form a fifth trench 330.

Thus, the line structure extending in the first direction D1 on the first and second regions I and II of the second substrate 300 may be divided into two portions on the first and second regions I and II, respectively, of the second substrate 300. If needed, a portion of the active fin 305 included in the line structure on the first region I of the second substrate 300 may be referred to as a third active fin, and a portion of the active fin 305 on the second region II of the second substrate 300 may be referred to as a fourth active fin.

The fifth trench 330 may be formed by removing one or a plurality of line structures disposed in the second direction D2 on the first and second regions I and II of the second substrate 300, and a lower surface of the fifth trench 330 may be lower or substantially coplanar with an upper surface of the second substrate 300.

In example embodiments, a third distance S3 from the boundary between the first and second regions I and II of the second substrate 300 to a first sidewall of the fifth trench 330 on the first region I of the second substrate 300 may be less than a fourth distance S4 from the boundary between the first and second regions I and II of the second substrate 300 to a second sidewall of the fifth trench 330 on the second region II of the second substrate 300.

In an example embodiment, a lower surface of a portion of the fifth trench 330 on the first region I of the second substrate 300 adjacent to the first sidewall may be lower than that of other portions of the fifth trench 330, which may be referred to as a sixth trench 335.

Figure 43:
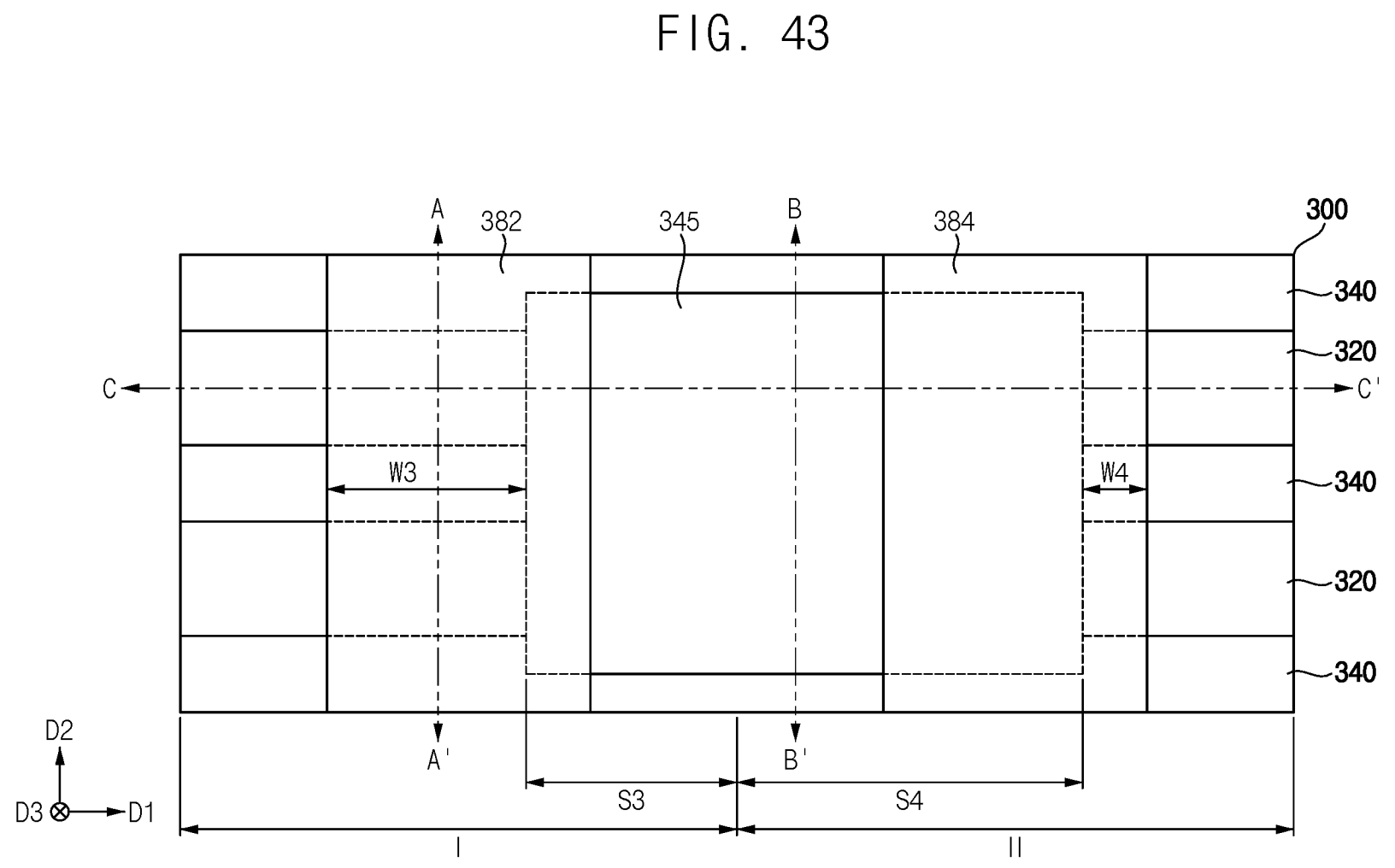
Figure 45:
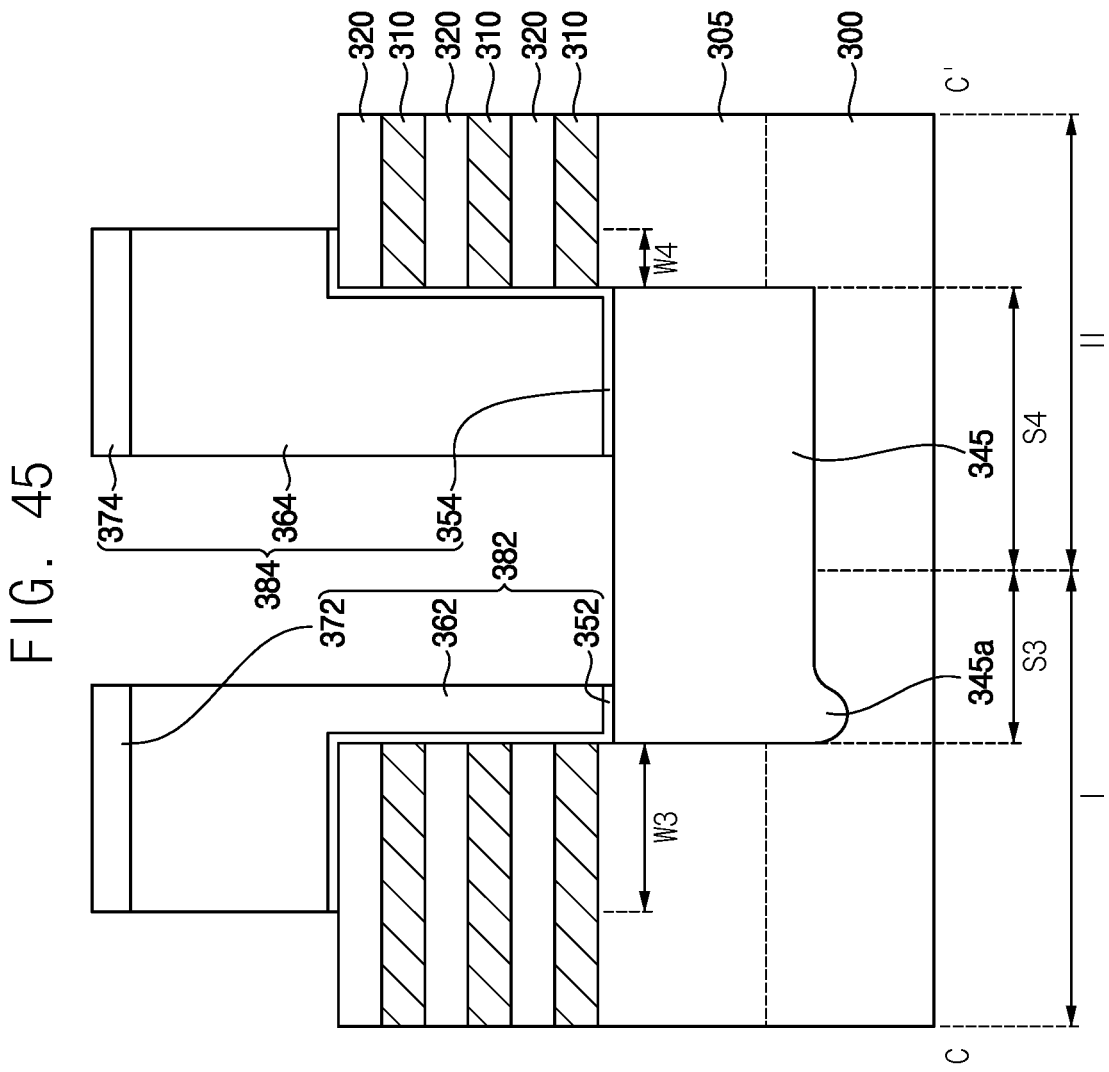
Figure 45:
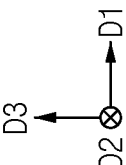

Referring to FIGS. 43 to 45, a second isolation layer may be formed on the second substrate 300 having the line structure thereon, and an upper portion of the second isolation layer may be removed to form third and fourth isolation patterns 340 and 345.

In example embodiments, the third isolation pattern 340 may be formed on an upper surface of the second substrate 300 between the line structures spaced apart from each other in the second direction D2 to fill a lower portion of the fourth trench 307. In an example embodiment, an upper surface of the third isolation pattern 340 may be lower than or substantially coplanar with an upper surface of the active fin 305.

Additionally, the fourth isolation pattern 345 may fill a lower portion of the fifth trench 330 and the sixth trench 335. In an example embodiment, an upper surface of the fourth isolation pattern 345 may be lower than or substantially coplanar with the upper surface of the active fin 305. A portion of the fourth isolation pattern 345 filling the sixth trench 335 may be referred to as a protrusion portion 345*a*.

In example embodiments, the upper surfaces of the third and fourth isolation patterns 340 and 345 may be substantially coplanar with each other, however, aspects of the inventive concept may not be limited thereto.

Third and fourth dummy gate structures 382 and 384 may be formed on the first and second regions I and II, respectively, of the second substrate 300 having the line structure and the third and fourth isolation patterns 340 and 345 thereon.

The third dummy gate structure 382 may include a third dummy gate insulation pattern 352, a third dummy gate electrode 362 and a third dummy gate mask 372 sequentially stacked in the third direction D3, and the fourth dummy gate structure 384 may include a fourth dummy gate insulation pattern 354, a fourth dummy gate electrode 364 and a fourth dummy gate mask 374 sequentially stacked in the third direction D3.

In example embodiments, each of the third and fourth dummy gate structures 382 and 384 may extend in the second direction D2. The third dummy gate structure 382 may be formed on the line structure and the third and fourth isolation patterns 340 and 345 on the first region I of the second substrate 300, and the fourth dummy gate structure 384 may be formed on the line structure and the third and fourth isolation patterns 340 and 345 on the second region II of the second substrate 300.

In example embodiments, a third width W3 in the first direction D1 of a portion of the third dummy gate structure 382 on the line structure on the first region I of the second substrate 300 may be greater than a fourth width W4 in the first direction D1 of a portion of the fourth dummy gate structure 384 on the line structure on the second region II of the second substrate 300. Thus, the third width W3 in the first direction D1 of the portion of the third dummy gate structure 382 overlapping the line structure in the third direction D3 may be greater than the fourth width W4 in the first direction D1 of the portion of the fourth dummy gate structure 384 overlapping the line structure in the third direction D3.

Figure 46:
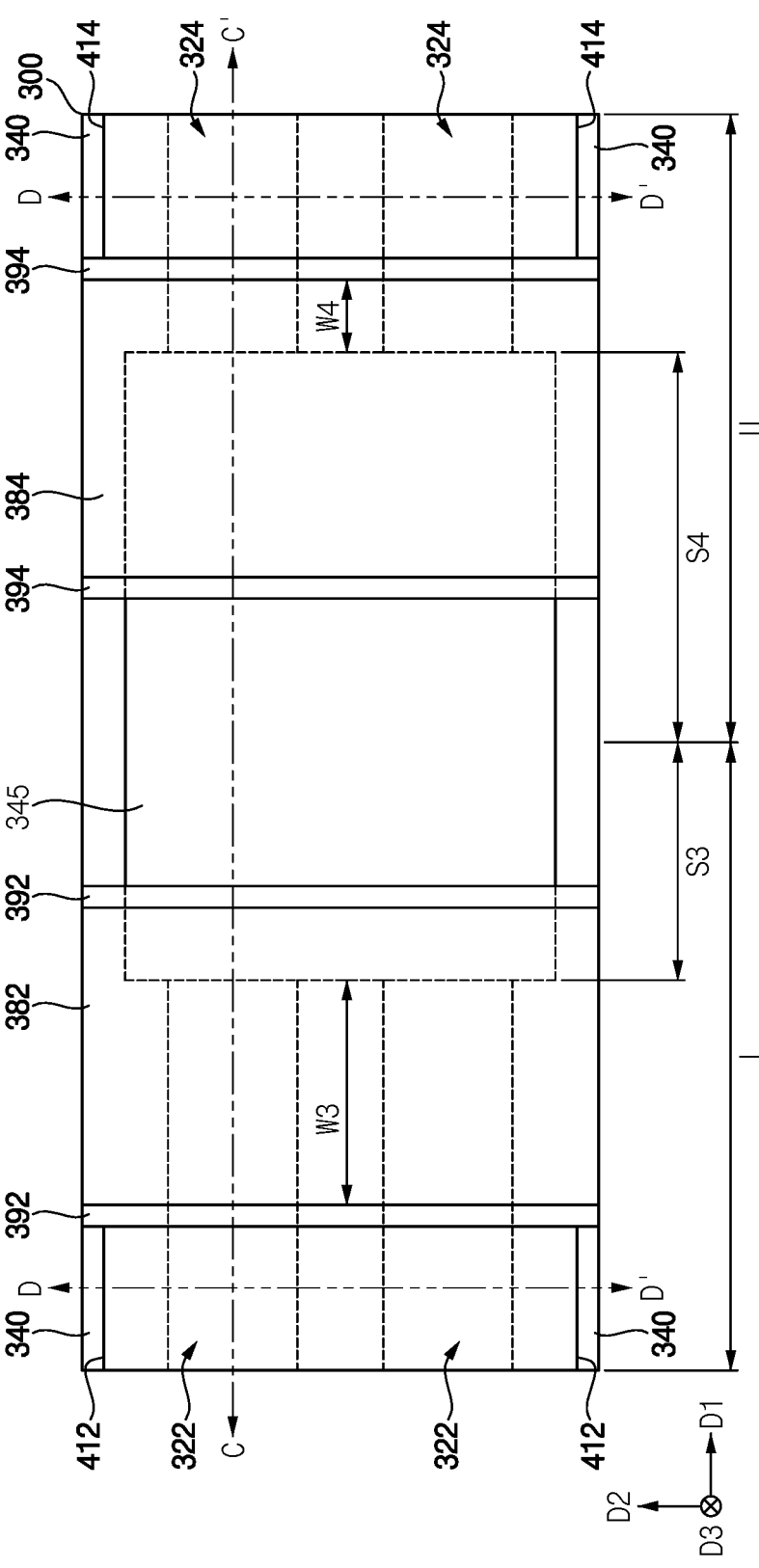

Referring to FIGS. 46 to 48, third and fourth gate spacers 392 and 394 may be formed on each of opposite sidewalls in the first direction D1 of the third and fourth dummy gate structures 382 and 384, respectively.

Upper portions of the line structure may be etched using the third and fourth dummy gate structures 382 and 384 and the third and fourth gate spacers 392 and 394 as an etching mask to form third and fourth openings 411 and 413, respectively, on the first and second regions I and II, respectively, of the second substrate 300.

During the etching process, an upper portion of the fourth isolation pattern 345 between the third and fourth dummy gate structures 382 and 384 may also be removed to form a fourth recess 415.

As the etching process is performed, the sacrificial lines 310 and the semiconductor lines 320 under the third and fourth dummy gate structures 382 and 384 and the third and fourth gate spacers 392 and 394 may be transformed into first and second sacrificial patterns 312 and 314 and first and second semiconductor patterns 322 and 324, respectively. The first sacrificial patterns 312 and the first semiconductor patterns 322 may be formed on the first region I of the second substrate 300, and the second sacrificial patterns 314 and the second semiconductor patterns 324 may be formed on the second region II of the second substrate 300.

Hereinafter, the third dummy gate structure 382, the third gate spacers 392 on opposite sidewalls of the third dummy gate structure 382, and the first semiconductor pattern 322 and the first sacrificial pattern 312 thereunder on the first region I of the second substrate 300 may be collectively referred to as a first stack structure, and the fourth dummy gate structure 384, the fourth gate spacers 394 on opposite sidewalls of the fourth dummy gate structure 384, and the second semiconductor pattern 324 and the second sacrificial pattern 314 thereunder on the second region II of the second substrate 300 may be collectively referred to as a second stack structure.

In example embodiments, the first and second stack structures may extend in the second direction D2 on the first and second regions I and II, respectively, of the second substrate 300.

A portion of each of the first sacrificial patterns 312 adjacent to the third opening 411 may be removed to form a first gap, and a first inner spacer 400 may be formed in the third opening 411. In some embodiments, a portion of each of the second sacrificial patterns 314 adjacent to the fourth opening 413 may also be removed to form a second gap, and a second inner spacer may be formed in the fourth opening 413.

Third and fourth SEG processes may be performed using upper surfaces of the third and fourth active patterns 305 exposed by the third and fourth openings 411 and 413, respectively, sidewalls of the first and second sacrificial patterns 312 and 314, and sidewalls of the first and second semiconductor patterns 322 and 324 as a seed to form third and fourth source/drain layers 412 and 414, respectively, on portions of the third and fourth active fins 305 on the first and second regions I and II, respectively, of the second substrate 300.

In an example embodiment, the third source/drain layer 412 may include a single crystalline silicon carbide layer doped with n-type impurities or a single crystalline silicon layer doped with n-type impurities, and the fourth source/drain layer 414 may include a single crystalline silicon-germanium layer doped with p-type impurities.

The third and fourth source/drain layers 412 and 414 may fill the third and fourth openings 411 and 413, respectively, and may further grow to contact lower sidewalls of the third and fourth gate spacers 392 and 394, respectively. In an example embodiment, a cross-section in the second direction D2 of the third source/drain layer 412 may have a shape of a rectangle with rounded corners or a circle, and a cross-section in the second direction D2 of the fourth source/drain layer 414 may have a shape of a pentagon or rhombus.

Figure 49:
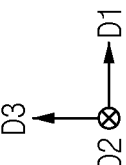

Referring to FIG. 49, a second insulating interlayer 420 may be formed on the second substrate 300 having the first and second stack structures, the third and fourth source/drain layers 412 and 414, and the third and fourth isolation patterns 340 and 345 thereon, and a planarization process may be performed until upper surfaces of the third and fourth dummy gate electrodes 362 and 364 included in each of the first and second stack structures are exposed to remove an upper portion of the second insulating interlayer 420 and the third and fourth dummy gate masks 372 and 374 included in each of the third and fourth dummy gate structures 382 and 384, and upper portions of the third and fourth gate spacers 392 and 394 may also be removed.

The third and fourth dummy gate electrodes 362 and 364, the third and fourth dummy gate insulation patterns 352 and 354, and the first and second sacrificial patterns 312 and 314 may be removed by, e.g., a wet etching process and/or a dry etching process.

Thus, a fifth opening 432 exposing an inner sidewall of the third gate spacer 392, an upper surface of an uppermost one of the first semiconductor patterns 322, sidewalls of the first semiconductor patterns 322, and upper surfaces of the third and fourth isolation patterns 340 and 345, and a third gap 442 between the first semiconductor patterns 322 and exposing lower and upper surfaces of the first semiconductor patterns 322 and a sidewall of the first inner spacer 400 may be formed on the first region I of the second substrate 300.

Additionally, a sixth opening 434 exposing an inner sidewall of the fourth gate spacer 394, an upper surface of an uppermost one of the second semiconductor patterns 324, sidewalls of the second semiconductor patterns 324, and upper surfaces of the third and fourth isolation patterns 340 and 345, and a fourth gap 444 between the second semiconductor patterns 324 and exposing lower and upper surfaces of the second semiconductor patterns 324 may be formed on the second region II of the second substrate 300.

Referring to FIGS. 34 to 37 again, a second gate insulation layer may be formed on the inner sidewalls and the upper surfaces of the third and fourth gate spacers 392 and 394, the surfaces of the first and second semiconductor patterns 322 and 324, the upper surfaces of the third and fourth isolation patterns 340 and 345 and an upper surface of the second insulating interlayer 420, a second gate electrode layer may be formed on the second gate insulation layer to fill remaining portions of the fifth and sixth openings 432 and 434 and the third and fourth gaps 442 and 444, and the second gate electrode layer and the second gate insulation layer may be planarized until the upper surface of the second insulating interlayer 420 is exposed.

Thus, a third gate structure 472 including a third gate electrode 462 and a third gate insulation pattern 452 covering a lower surface and a sidewall of the third gate electrode 462 may be formed in the fifth opening 432 and the third gap 442, and a fourth gate structure 474 including a fourth gate electrode 464 and a fourth gate insulation pattern 454 covering a lower surface and a sidewall of the fourth gate electrode 464 may be formed in the sixth opening 434 and the fourth gap 444.

In an example embodiment, the second gate electrode layer may include a barrier layer and a conductive layer, and in this case, each of the third and fourth gate electrodes 462 and 464 may include a barrier pattern and a conductive pattern.

Contact plugs and wirings may be further formed to be electrically connected to the third and fourth gate electrodes 462 and 464 and the third and fourth source/drain layers 412 and 414 to complete the fabrication of the semiconductor device.

Figure 50:
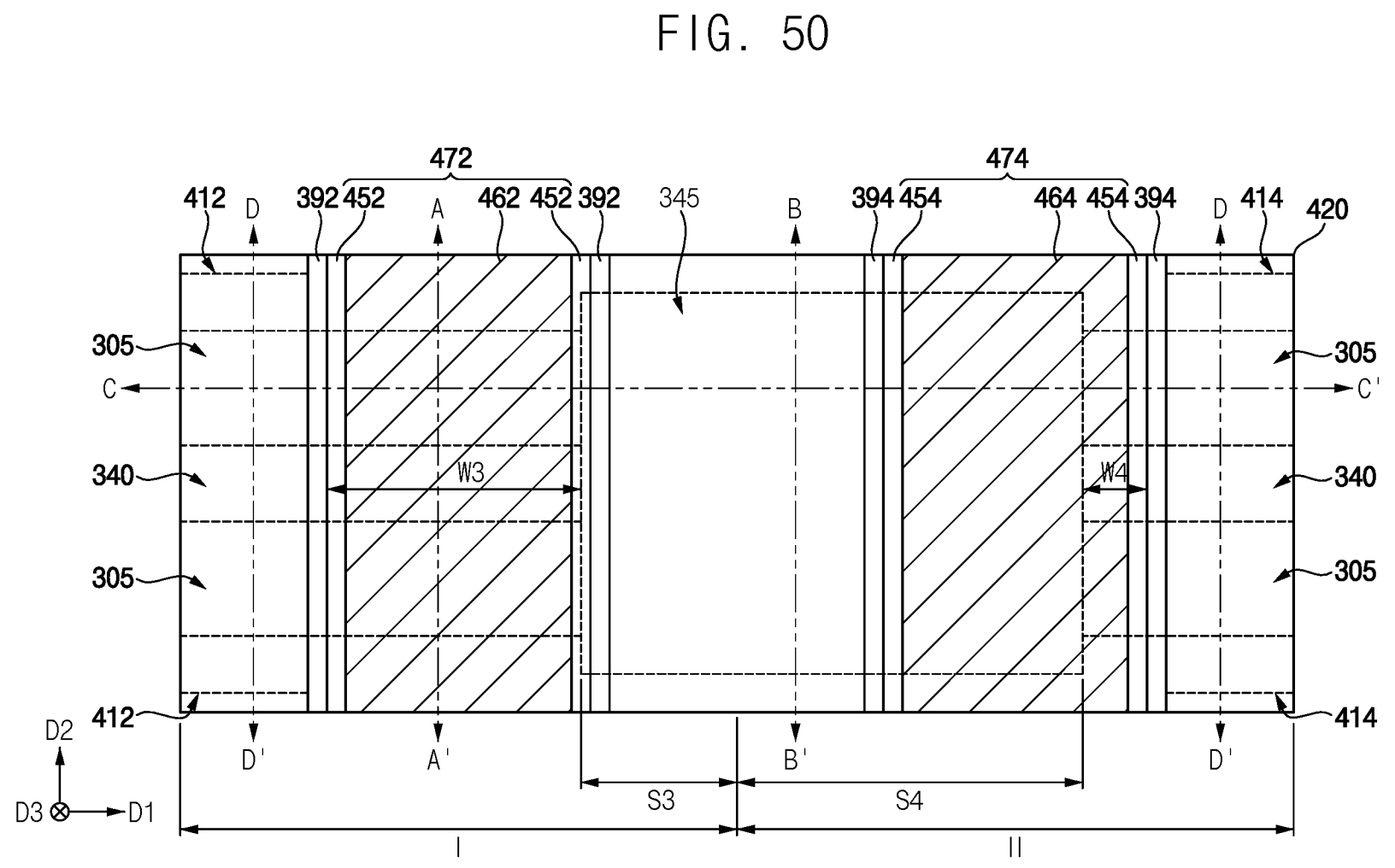
Figure 51:
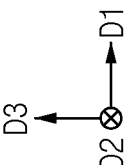

FIGS. 50 and 51 are a plan view and a cross-sectional view, respectively, illustrating a semiconductor device in accordance with example embodiments, and may correspond to FIGS. 34 and 36, respectively.

This semiconductor device may be substantially the same as or similar to that of FIGS. 34 to 37, except for the position and shape of the first gate structure 472, and thus repeated explanations thereof are omitted herein.

Referring to FIGS. 50 and 51, the third gate electrode 462 included in the third gate structure 472 may not cover the sidewall in the first direction D1 of the end portion in the first direction D1 of the third active fin 305, and thus the third gate electrode 462 may be formed only on the upper surface and the sidewall in the second direction D2 of the end portion of the third active fin 305.

Figure 52:
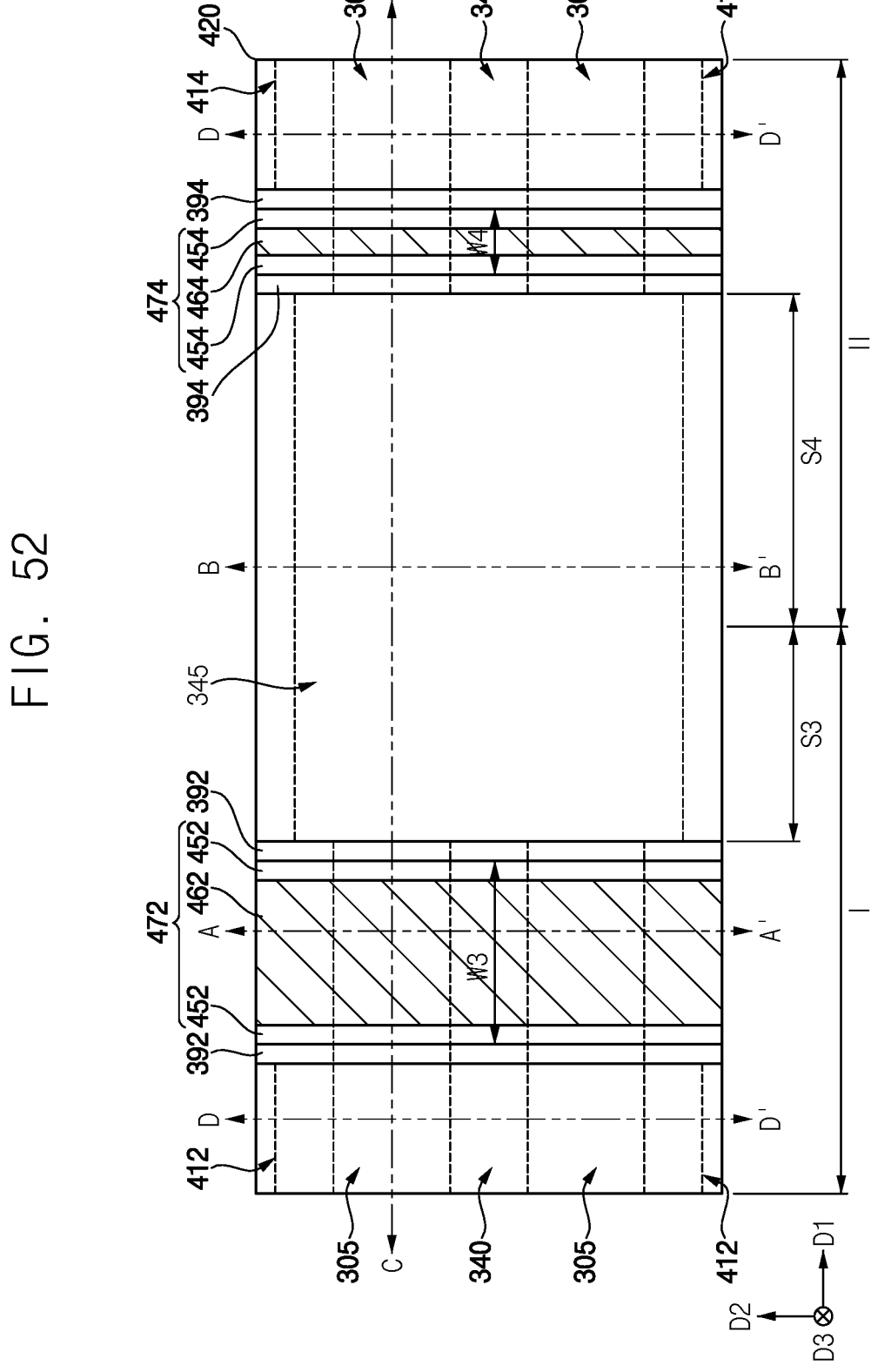
FIGS. 52 and 53 are a plan view and a cross-sectional view, respectively, illustrating a semiconductor device in accordance with example embodiments.
Figure 53:
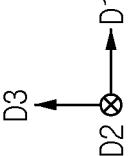

FIGS. 52 and 53 are a plan view and a cross-sectional view, respectively, illustrating a semiconductor device in accordance with example embodiments, and may correspond to FIGS. 34 and 36, respectively.

This semiconductor device may be substantially the same as or similar to that of FIGS. 34 to 37, except for the position and shape of the third and fourth gate structures 472 and 474, and thus repeated explanations thereof are omitted herein.

Referring to FIGS. 52 and 53, the third and fourth gate structures 472 and 474 may be formed on the upper surfaces and sidewalls in the second direction D2 of the third and fourth fins 305, respectively, on the first and second regions I and II, respectively, of the second substrate 300, and may not be formed on the sidewalls in the first direction D1 of the end portions in the first direction D1 of the third and fourth active fins 305, respectively.

In example embodiments, the width in the first direction D1 of the third gate structure 472 may be greater than the width in the first direction D1 of the fourth gate structure 474, and thus the third width W3 of the portion of the third gate structure 472 overlapping the third active fin 305 in the third direction D3 may be greater than the fourth width W4 in the first direction D1 of the fourth gate structure 474 overlapping the fourth active fin 305 in the third direction D3.

Figure 54:
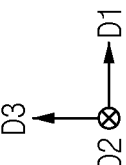
FIGS. 54 to 56 are cross-sectional views illustrating semiconductor devices in accordance with example embodiments.
Figure 55:
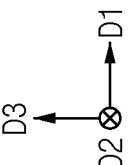
Figure 56:
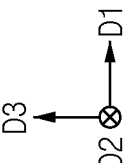

FIGS. 54 to 56 are cross-sectional views illustrating semiconductor devices in accordance with example embodiments, and may correspond to FIG. 36.

These semiconductor devices may be substantially the same as or similar to that of FIGS. 34 to 37, except for the protrusion portion, and thus repeated explanations thereof are omitted herein.

Referring to FIG. 54, the protrusion portion 345a may be formed at a portion of the fourth isolation pattern 345 adjacent to the second sidewall thereof on the second region II of the second substrate 300, and the lower surface of the protrusion portion 345a may be lower than that of other portions of the fourth isolation pattern 345.

Referring to FIG. 55, the protrusion portions 345a may be formed at respective portions of the fourth isolation pattern 345 adjacent to the first sidewall thereof on the first region I of the second substrate 300 and the second sidewall thereof on the second region II of the second substrate 300, and the lower surface of each of the protrusion portions 345a may be lower than that of other portions of the fourth isolation pattern 345.

In example embodiments, the lower surfaces of the protrusion portions 345a on the first and second regions I and II, respectively, of the second substrate 300 may be substantially coplanar with each other.

Alternatively, referring to FIG. 56, the lower surface of the protrusion portion 345a on the first region I of the second substrate 300 may be lower than that of the protrusion portion 345a on the second region II of the second substrate 300.

Figure 57:
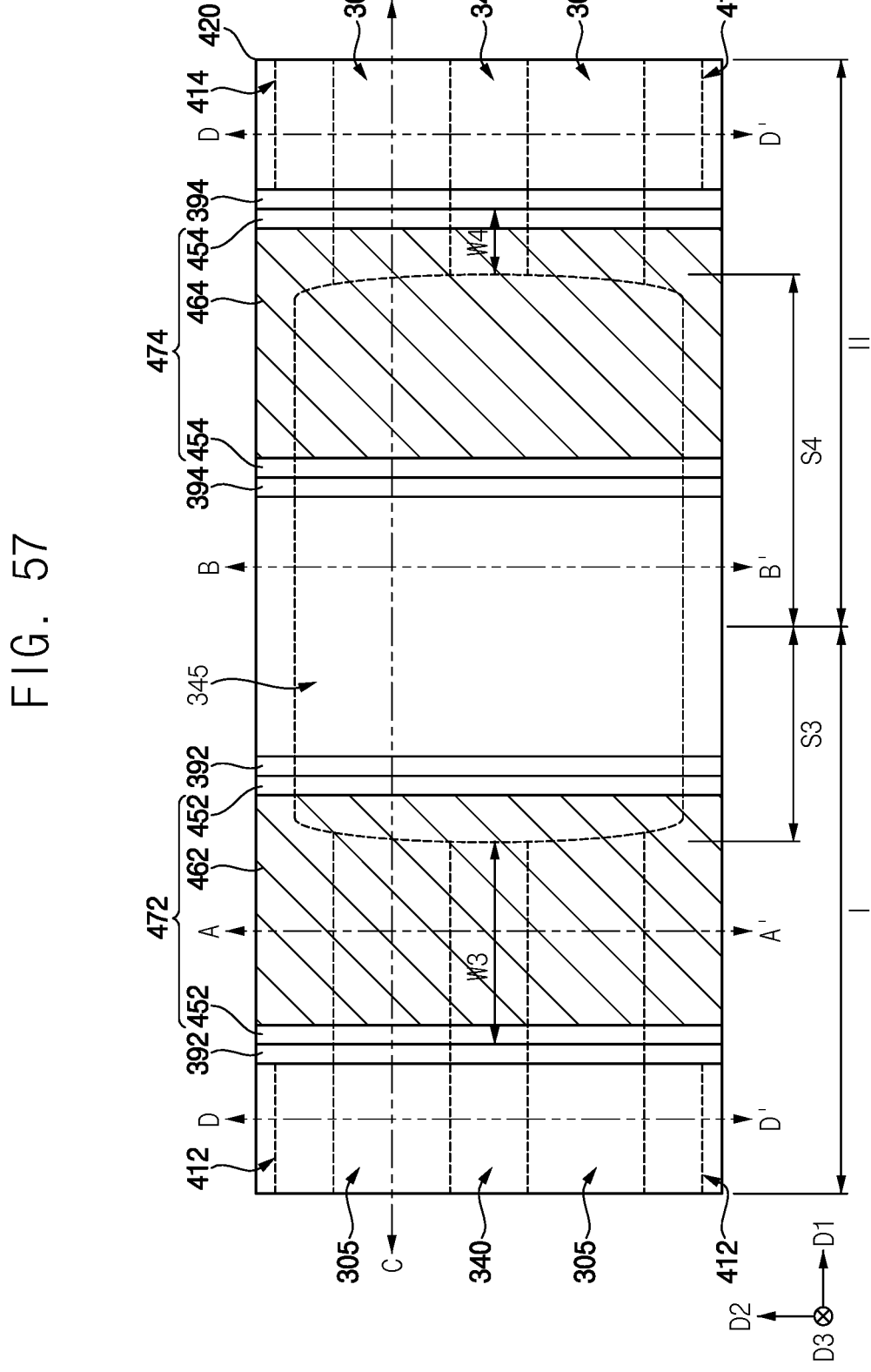
FIG. 57 is a plan view illustrating a semiconductor device in accordance with example embodiments.

FIG. 57 is a plan view illustrating a semiconductor device in accordance with example embodiments, and may correspond to FIG. 34.

This semiconductor device may be substantially the same as or similar to that of FIGS. 34 to 37, except for the shape of the second isolation pattern, and thus repeated explanations thereof are omitted herein.

Referring to FIG. 57, each of the sidewalls in the first direction D1 of the fourth isolation pattern 345 may have a shape of a convex shape from the boundary between the first and second regions I and II of the second substrate 300 toward a central portion of the first region I or the second region II of the second substrate 300, instead of a line shape, in a plan view.

Figure 58:
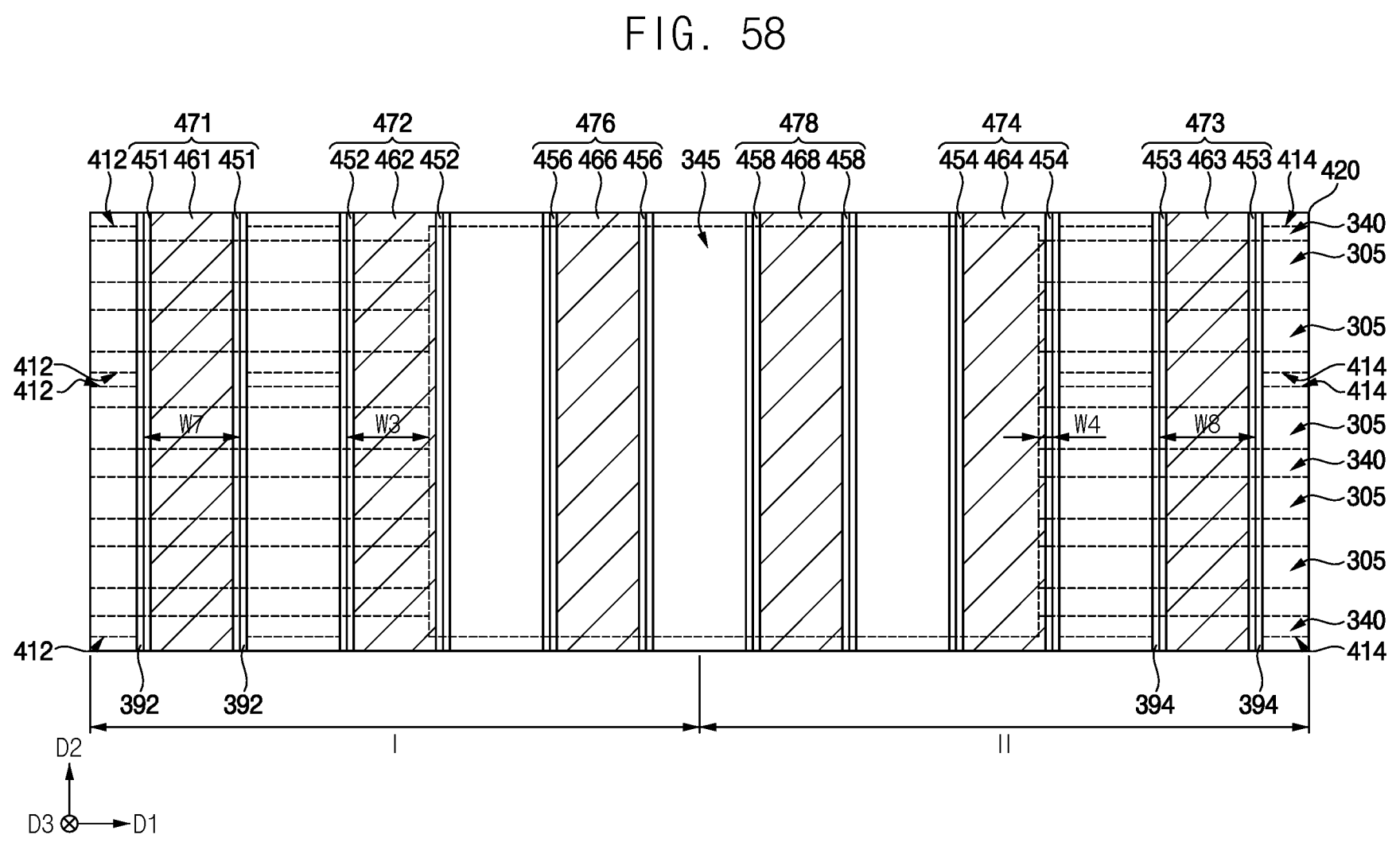
Figure 59:
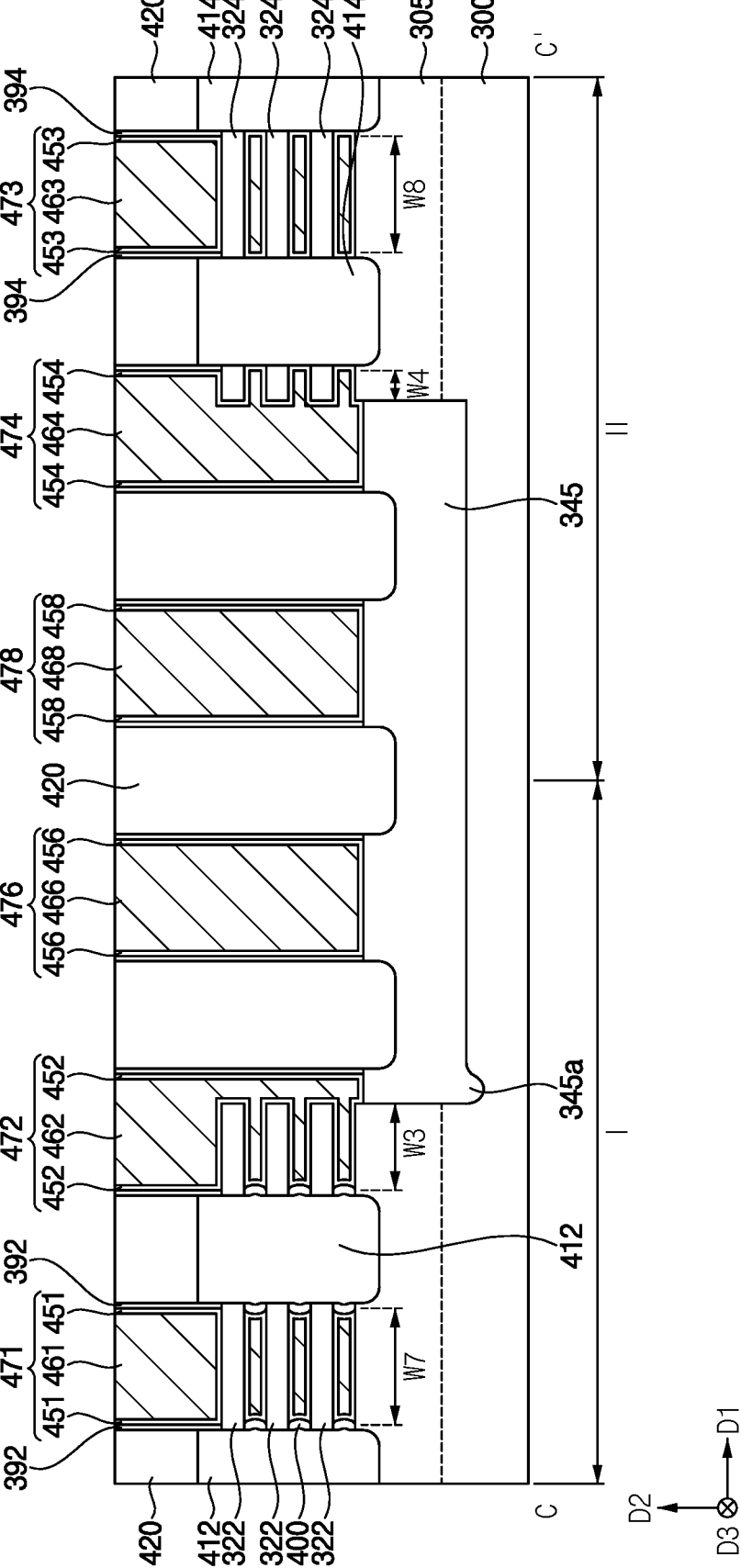

FIGS. 58 and 59 are a plan view and a cross-sectional view, respectively, illustrating a semiconductor device in accordance with example embodiments, and may correspond to FIGS. 34 and 36, respectively.

This semiconductor device may be substantially the same as or similar to that of FIGS. 34 to 37, except for further comprising gate structures, and thus repeated explanations thereof are omitted herein.

Referring to FIGS. 58 and 59, the semiconductor device may further include a seventh gate structure 471 and a seventh dummy gate structure 476 on the first region I of the second substrate 300, and an eighth gate structure 473 and an eighth dummy gate structure 478 on the second region II of the second substrate 300, in addition to the third and fourth gate structures 472 and 474.

FIGS. 58 and 59 show one of a seventh gate structure 471 and one of a seventh dummy gate structure 476 on the first region I of the second substrate 300, however, aspects of the inventive concept may not be limited thereto, and a plurality of seventh gate structures 471 and a plurality of seventh dummy gate structures 476 may be disposed on the first region I of the second substrate 300.

Likewise, FIGS. 58 and 59 show one of a eighth gate structure 473 and one of a eighth dummy gate structure 478 on the second region II of the second substrate 300, however, aspects of the inventive concept may not be limited thereto, and a plurality of eighth gate structures 473 and a plurality of eighth dummy gate structures 478 may be disposed on the second region II of the second substrate 300.

The seventh gate structure 471 may include a seventh gate insulation pattern 451 and a seventh gate electrode 461 stacked on the third active fin 305 and the third isolation pattern 340, and the eighth gate structure 233 may include an eighth gate insulation pattern 453 and an eighth gate electrode 463 stacked on the fourth active fin 305 and the third isolation pattern 340.

Additionally, the seventh dummy gate structure 476 may include a seventh dummy gate insulation pattern 456 and a seventh dummy gate electrode 466 stacked on the third and fourth isolation patterns 340 and 345, and the eighth dummy gate structure 478 may include an eighth dummy gate insulation pattern 458 and an eighth dummy gate electrode 468 stacked on the third and fourth isolation patterns 340 and 345.

In example embodiments, the seventh gate insulation pattern 451 may be formed on the upper surface and the sidewall in the second direction D2 of third active fin 305 on the first region I of the second substrate 300, the upper surface of the portion of the third isolation pattern 340 on the first region I of the second substrate 300, and the inner sidewall of the third gate spacer 392, and a lower surface and a sidewall of the seventh gate electrode 461 may be covered by the seventh gate insulation pattern 451.

Additionally, the eighth gate insulation pattern 453 may be formed on the upper surface and the sidewall in the second direction D2 of the fourth active fin 305 on the second region II of the second substrate 300, the upper surface of the portion of the third isolation pattern 340 on the second region II of the second substrate 300, and the inner sidewall of the fourth gate spacer 394, and a lower surface and a sidewall of the eighth gate electrode 453 may be covered by the eighth gate insulation pattern 453.

In example embodiments, the seventh dummy gate insulation pattern 456 may be formed on the upper surfaces of the portions of the third and fourth isolation patterns 340 and 345 on the first region I of the second substrate 300 and the inner sidewall of the third gate spacer 392, and a lower surface and a sidewall of the seventh dummy gate electrode 466 may be covered by the seventh dummy gate insulation pattern 456.

Additionally, the eighth dummy gate insulation pattern 458 may be formed on the upper surfaces of the portions of the third and fourth isolation patterns 340 and 345 on the second region II of the second substrate 300 and the inner sidewall of the fourth gate spacer 394, and a lower surface and a sidewall of the eighth dummy gate electrode 468 may be covered by the eighth dummy gate insulation pattern 458.

The seventh and eighth gate structures 471 and 473 on the first and second regions I and II, respectively, of the second substrate 300 may overlap the third and fourth active fins 305, respectively, in the third direction D3 by seventh and eighth widths W7 and W8, respectively, when compared to the third and fourth gate structures 472 and 474 on the portions of the first and second regions I and II, respectively, of the second substrate 300 adjacent to the boundary between the first and second regions I and II of the second substrate 300, which may overlap the third and fourth active fins 305 in the third direction D3 by the third and fourth widths W3 and W4, respectively.

In example embodiments, the seventh and eighth widths W7 and W8 may be substantially equal to each other, however, aspects of the inventive concept may not be limited thereto. The third width W3 may be less than or equal to the seventh width W7 and greater than half the seventh width W7. The fourth width W4 may be less than half the eighth width W8.

Figure 60:
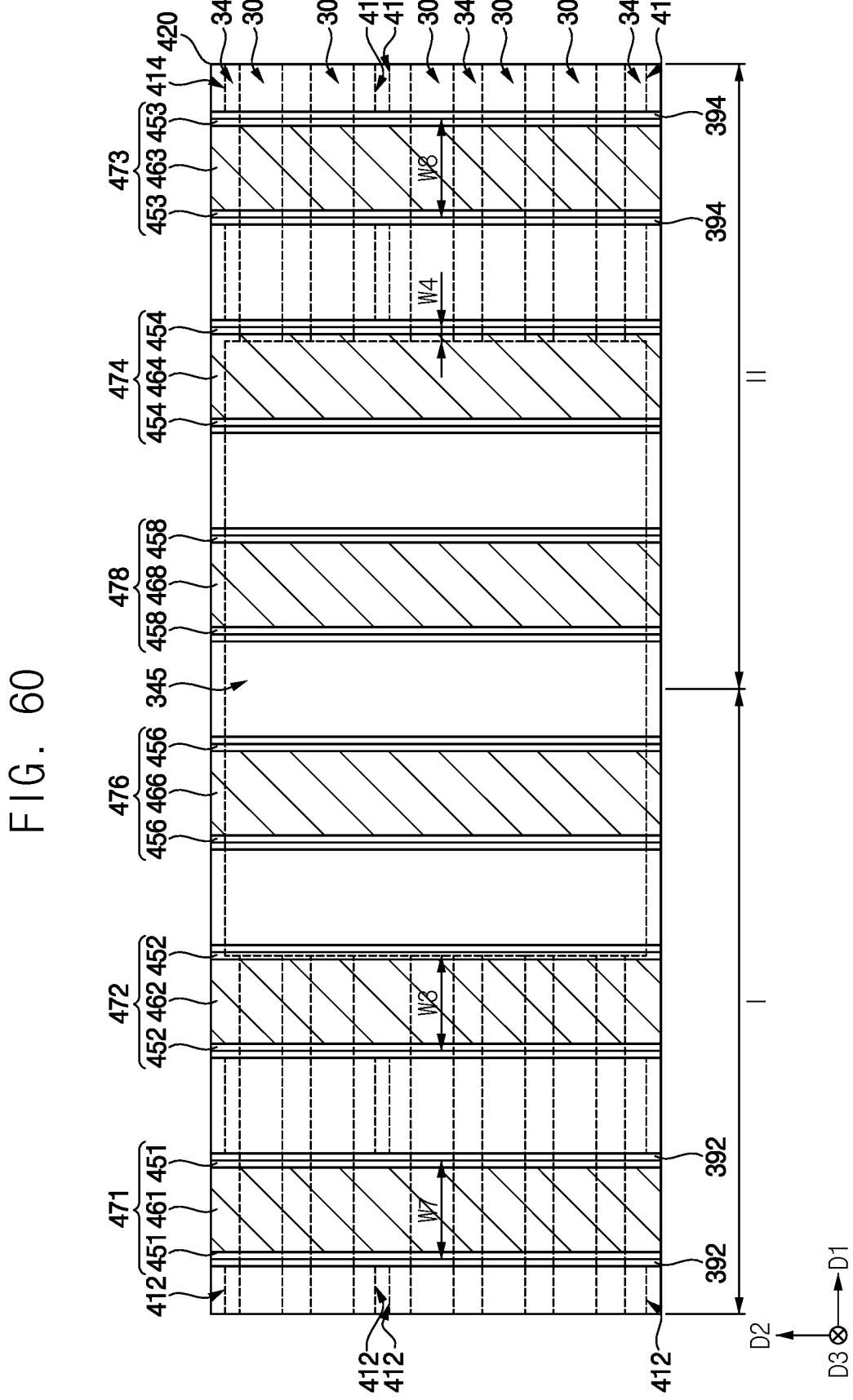
Figure 61:
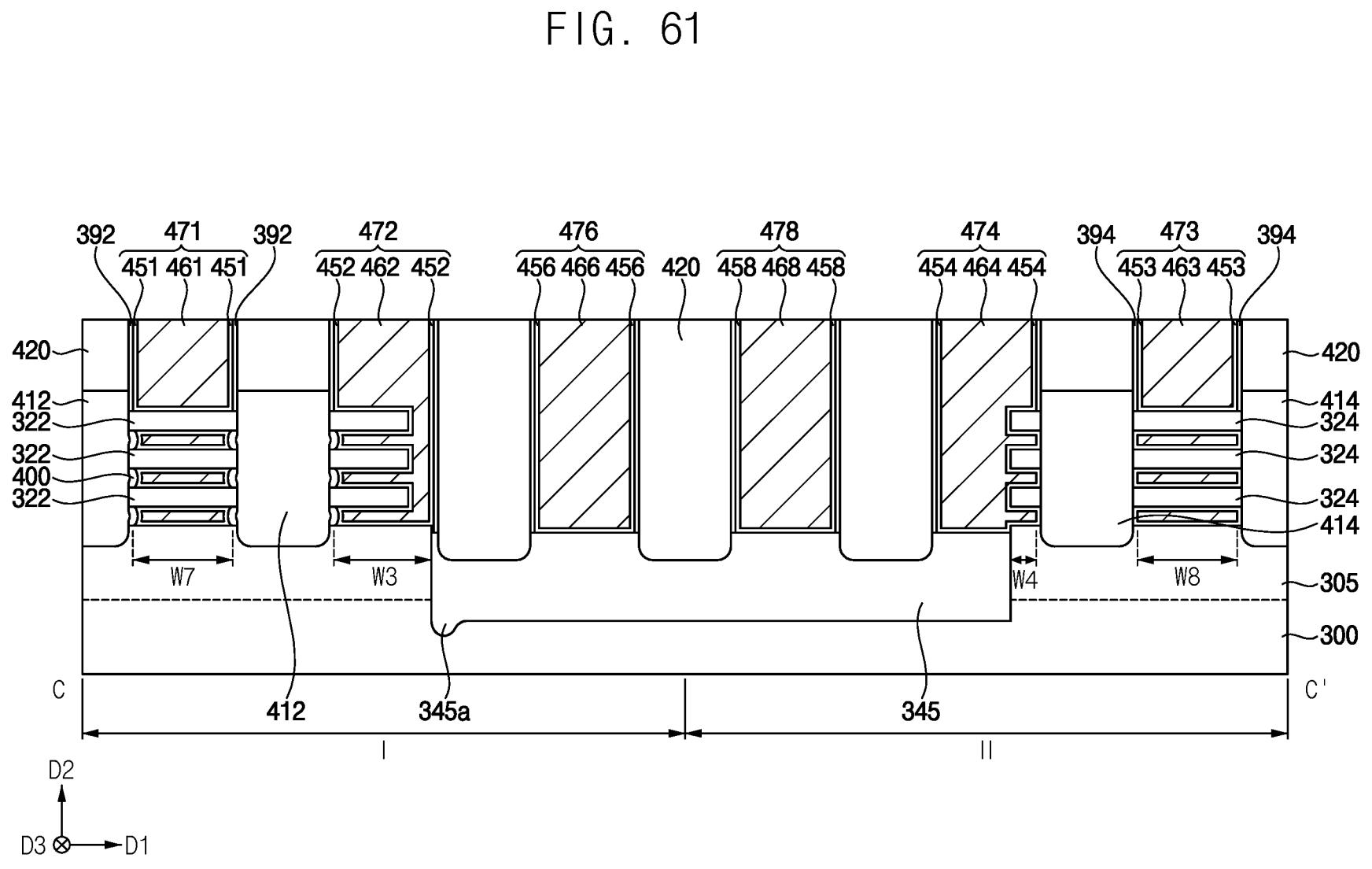

FIGS. 60 and 61 are a plan view and a cross-sectional view, respectively, illustrating a semiconductor device in accordance with example embodiments, and may correspond to FIGS. 58 and 59, respectively.

This semiconductor device may be substantially the same as or similar to that of FIGS. 25 to 26, except for the position and shape of the third gate structure 472, and thus repeated explanations thereof are omitted herein.

Referring to FIGS. 60 and 61, as in the semiconductor device illustrated with reference to FIGS. 50 and 51, the third gate electrode 462 included in the third gate structure 472 may not cover the sidewall in the first direction D1 of the end portion in the first direction D1 of the third active fin 305, and thus the third gate electrode 462 may be formed only on the upper surface and the sidewall in the second direction D2 of the end portion of the third active fin 305.

Figure 62:
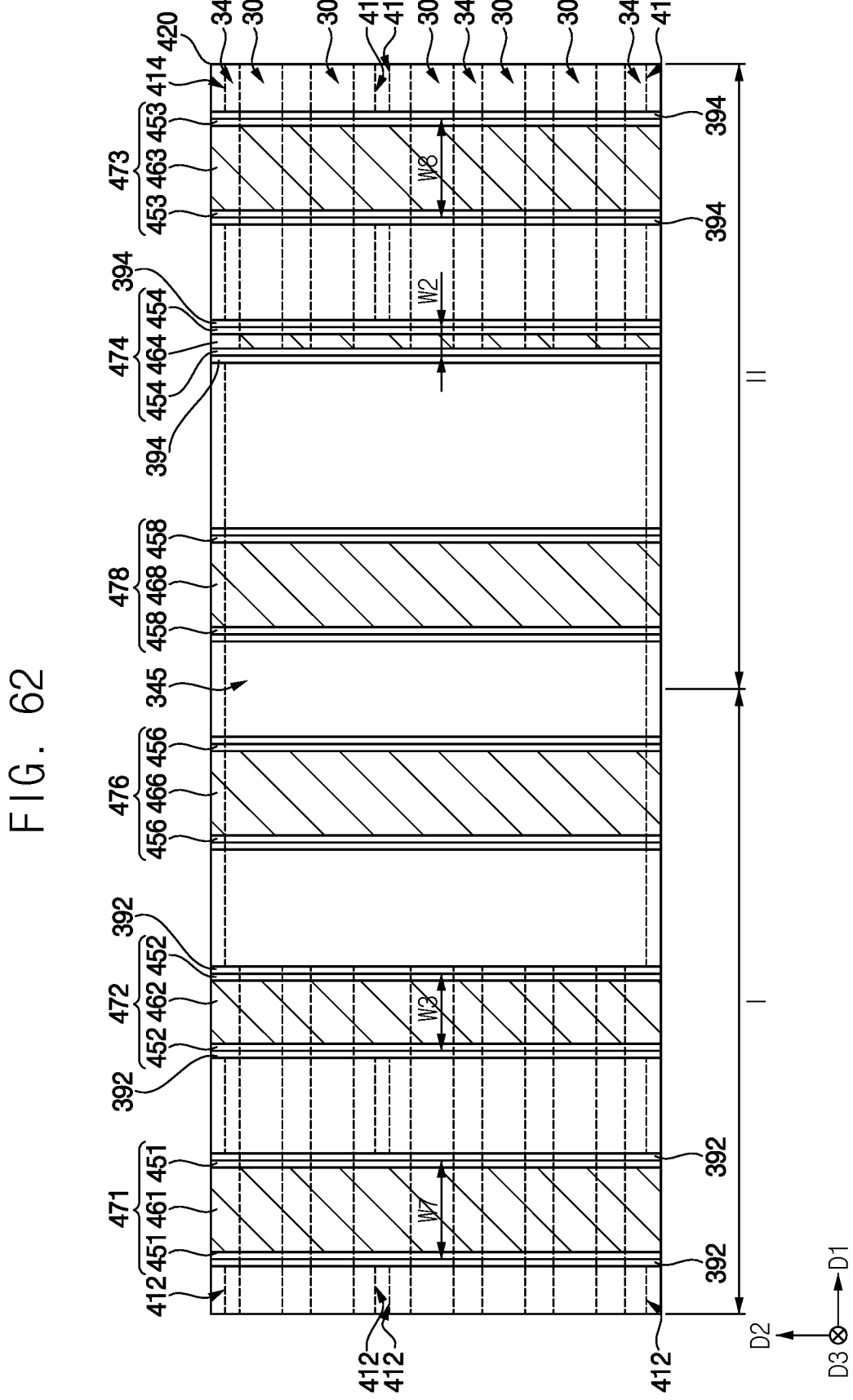
FIGS. 62 and 63 are a plan view and a cross-sectional view, respectively, illustrating a semiconductor device in accordance with example embodiments.
Figure 63:
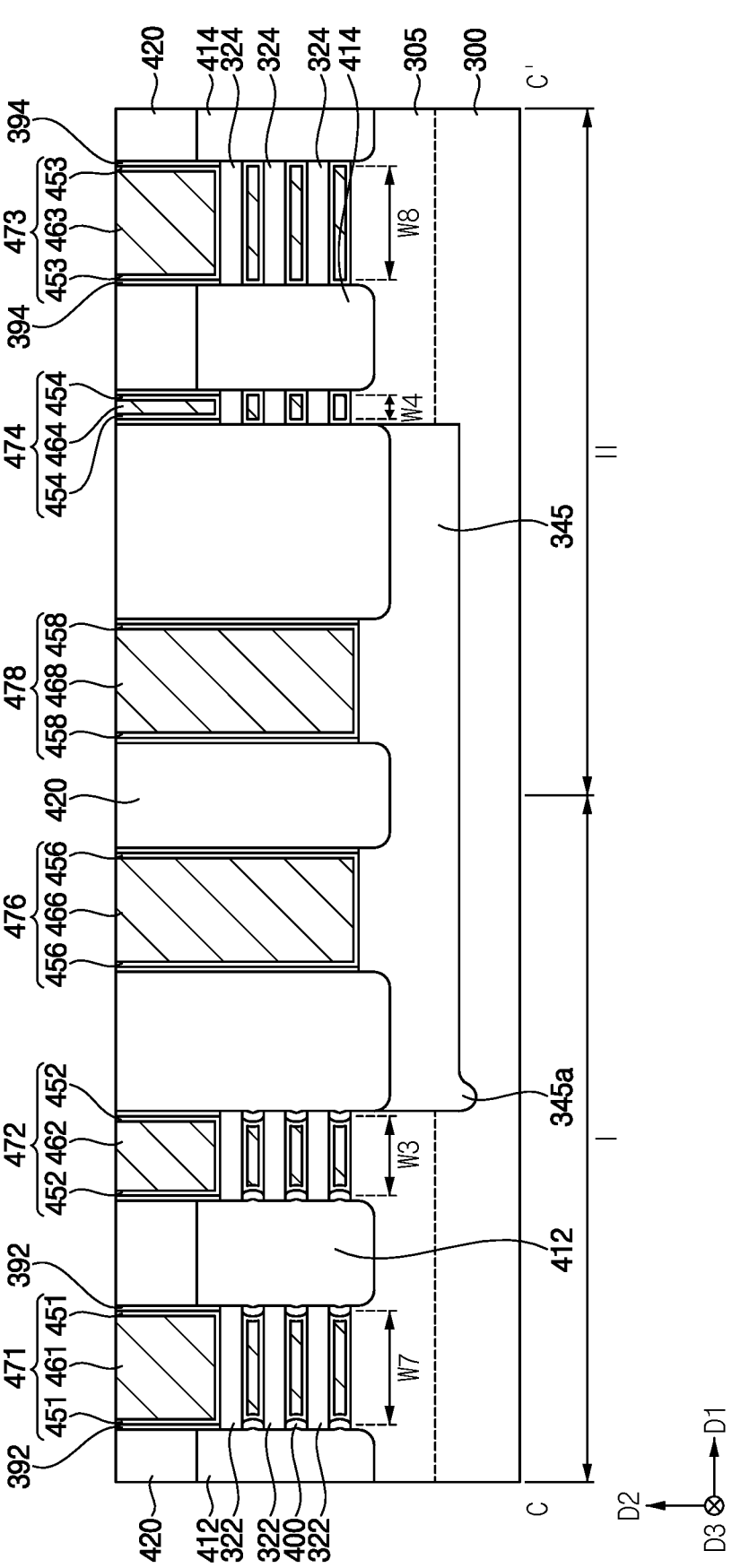

FIGS. 62 and 63 are a plan view and a cross-sectional view, respectively, illustrating a semiconductor device in accordance with example embodiments, and may correspond to FIGS. 58 and 59, respectively.

This semiconductor device may be substantially the same as or similar to that of FIGS. 58 to 59, except for the position and shape of the third and fourth gate structures 472 and 474, and thus repeated explanations thereof are omitted herein.

Referring to FIGS. 62 and 63, as in the semiconductor device illustrated with reference to FIGS. 52 and 53, the third and fourth gate structures 472 and 474 may be formed on the upper surfaces and sidewalls in the second direction D2 of the third and fourth fins 305, respectively, on the first and second regions I and II, respectively, of the second substrate 300, and may not be formed on the sidewalls in the first direction D1 of the end portions in the first direction D1 of the third and fourth active fins 305, respectively.

The width in the first direction D1 of the third gate structure 472 may be greater than the width in the first direction D1 of the fourth gate structure 474, and thus the third width W3 of the portion of the third gate structure 472 overlapping the third active fin 305 in the third direction D3 may be greater than the fourth width W4 in the first direction D1 of the fourth gate structure 474 overlapping the fourth active fin 305 in the third direction D3.

Figure 64:
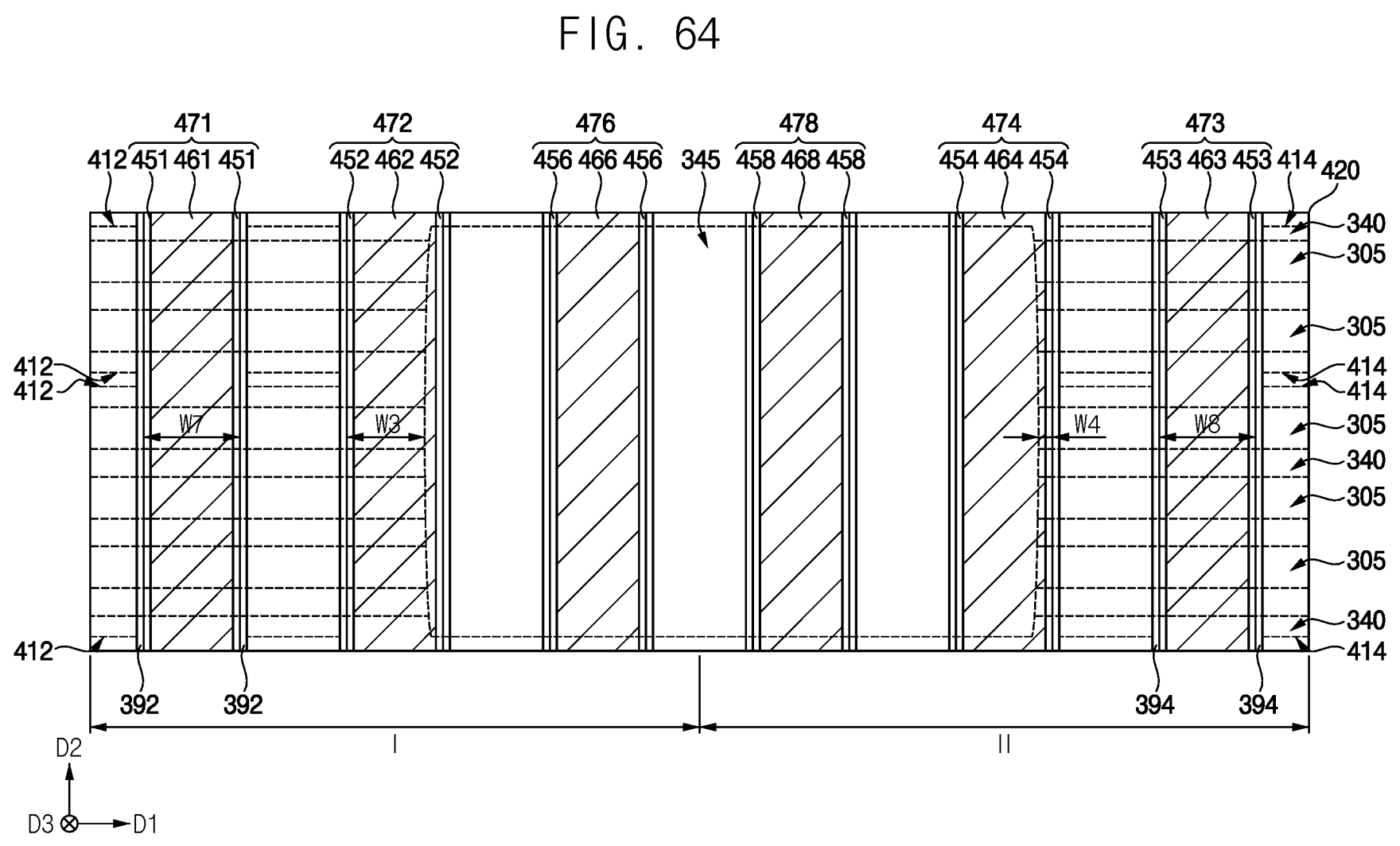

FIG. 64 is a plan view illustrating a semiconductor device in accordance with example embodiments, and may correspond to FIG. 58.

This semiconductor device may be substantially the same as or similar to that of FIGS. 58 to 59, except for the shape of the fourth isolation pattern, and thus repeated explanations thereof are omitted herein.

Referring to FIG. 64, each of the sidewalls in the first direction D1 of the fourth isolation pattern 345 may have a shape of a convex shape from the boundary between the first and second regions I and II of the second substrate 300 toward a central portion of the first region I or the second region II of the second substrate 300, instead of a line shape, in a plan view.

In an example embodiment, a curvature of each of the first and second sidewalls of the fourth isolation pattern 345 shown in FIG. 64 may be less than a curvature of each of the first and second sidewalls of the fourth isolation pattern 345 shown in FIG. 57.

FIG. 64 shows the fourth isolation pattern 345 extends through five active fins 305 disposed in the second direction D2, however, aspects of the inventive concept may not be limited thereto, and the fourth isolation pattern 345 may extend through a plurality of active fins 305 less than or more than five active fins 305. In an example embodiment, as the number of the active fins 305 through which the fourth isolation pattern 345 increases, the curvature of each of the first and second sidewalls of the fourth isolation pattern 345 may decrease.

Figure 65:
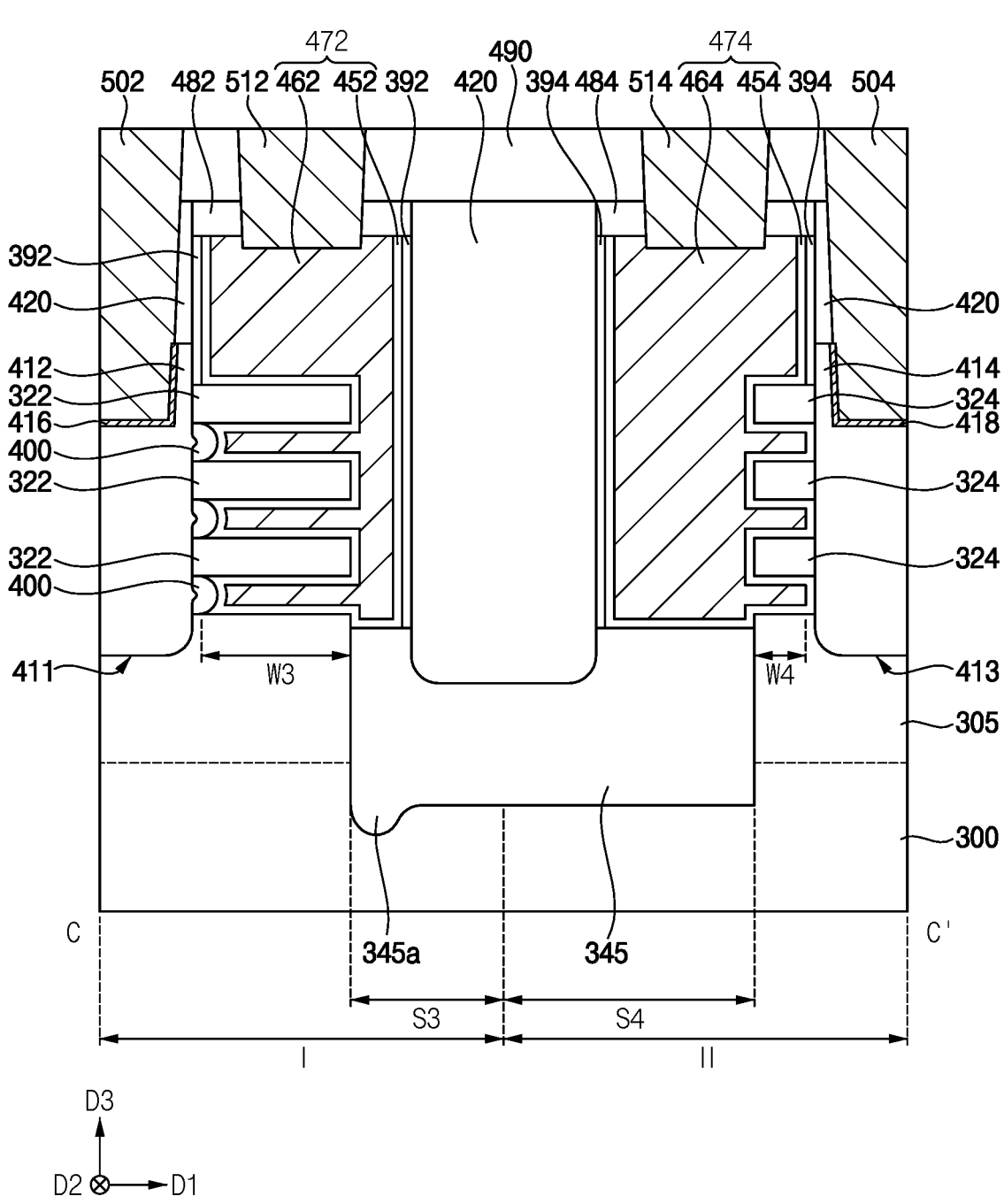
FIGS. 65 and 66 are cross-sectional views illustrating a semiconductor device in accordance with example embodiments.
Figure 66:
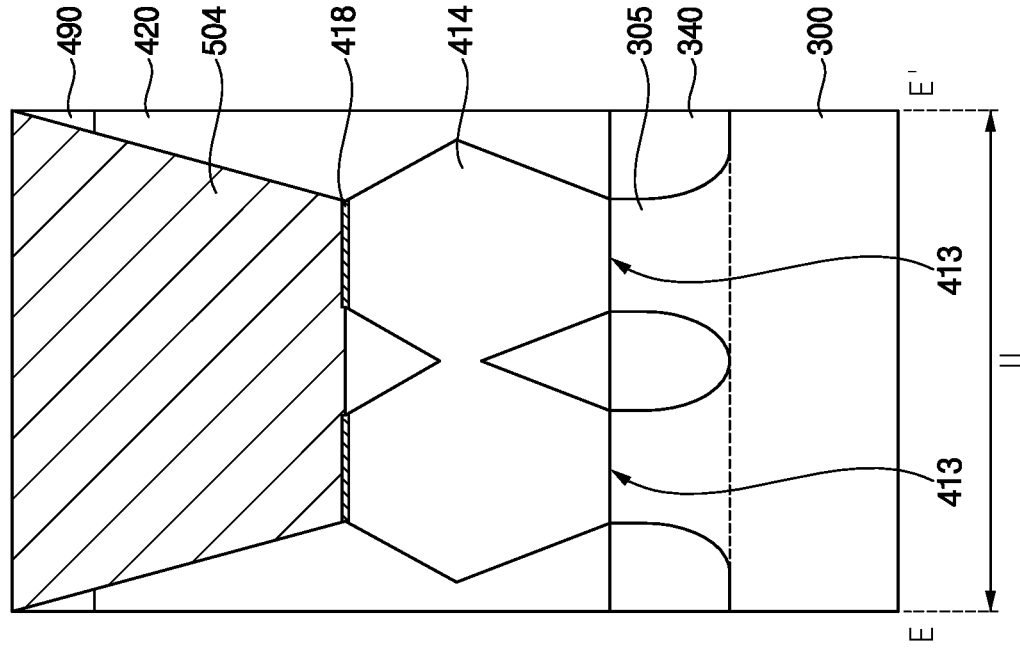
Figure 66:
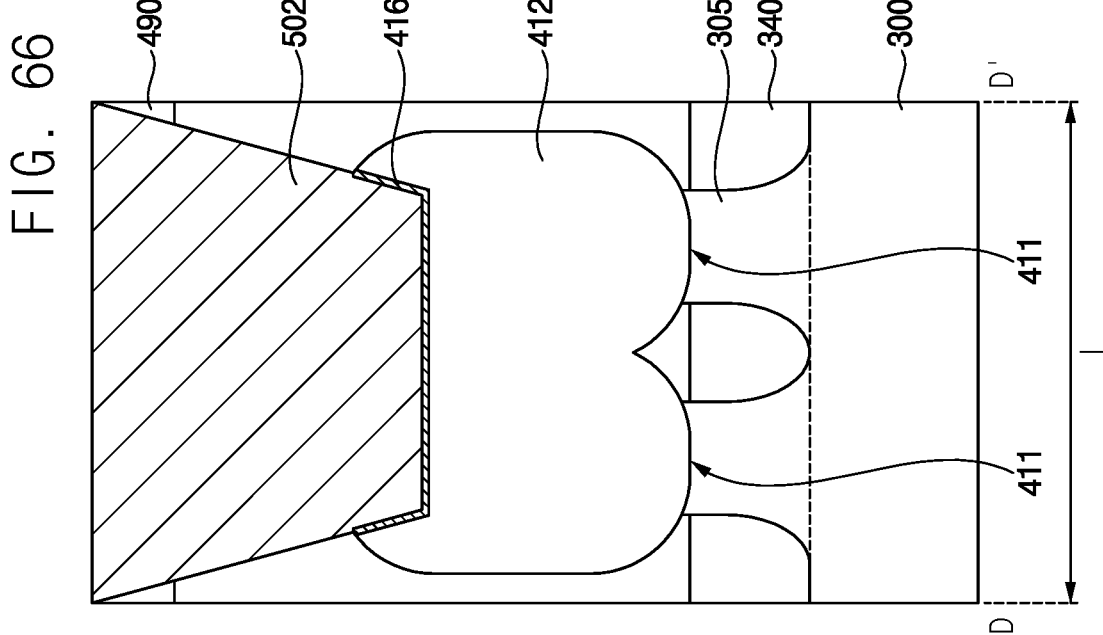
Figure 66:
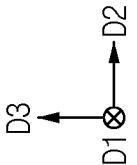

FIGS. 65 and 66 are cross-sectional views illustrating a semiconductor device in accordance with example embodiments, and may correspond to FIGS. 36 and 37, respectively.

This semiconductor device may be substantially the same as or similar to that of FIGS. 34 to 37, except for further comprising capping patterns, contact plugs, ohmic contacts and an insulating interlayer, and thus repeated explanations thereof are omitted herein.

Referring to FIGS. 65 and 66, the semiconductor device may further include a third capping pattern 482 on the third gate structure 472 and the third gate spacer 392 and a fourth capping pattern 484 on the fourth gate structure 474 and the fourth gate spacer 394.

Each of the third and fourth capping patterns 482 and 484 may include an insulating nitride, e.g., silicon nitride, silicon oxynitride, etc.

Additionally, the semiconductor device may further include a fourth insulating interlayer 490 on the second insulating interlayer 420, fifth and sixth contact plugs 502 and 504 extending through the second and fourth insulating interlayers 420 and 490 to contact the third and fourth source/drain layers 412 and 414, respectively, and seventh and eighth contact plugs 512 and 514 extending through the fourth insulating interlayer 490 and the third and fourth capping patterns 482 and 484, respectively, to contact the third and fourth gate electrodes 462 and 464, respectively.

Each of the fifth to eighth contact plugs 502, 504, 512 and 514 may include a conductive pattern and a barrier pattern covering a lower surface and a sidewall of the conductive pattern.

A third ohmic contact pattern 416 may be formed between the third source/drain layer 412 and the fifth contact plug 502, and a fourth ohmic contact pattern 418 may be formed between the fourth source/drain layer 414 and the sixth contact plug 504. Each of the third and fourth ohmic contact patterns 416 and 418 may include a metal silicide, e.g., cobalt silicide, nickel silicide, titanium silicide, etc.

The fourth insulating interlayer 490 may include an oxide, e.g., silicon oxide, and each of the fifth to eighth contact plugs 502, 504, 512 and 514 may include, e.g., a metal, a metal nitride, a metal silicide, etc.

Figure 67:
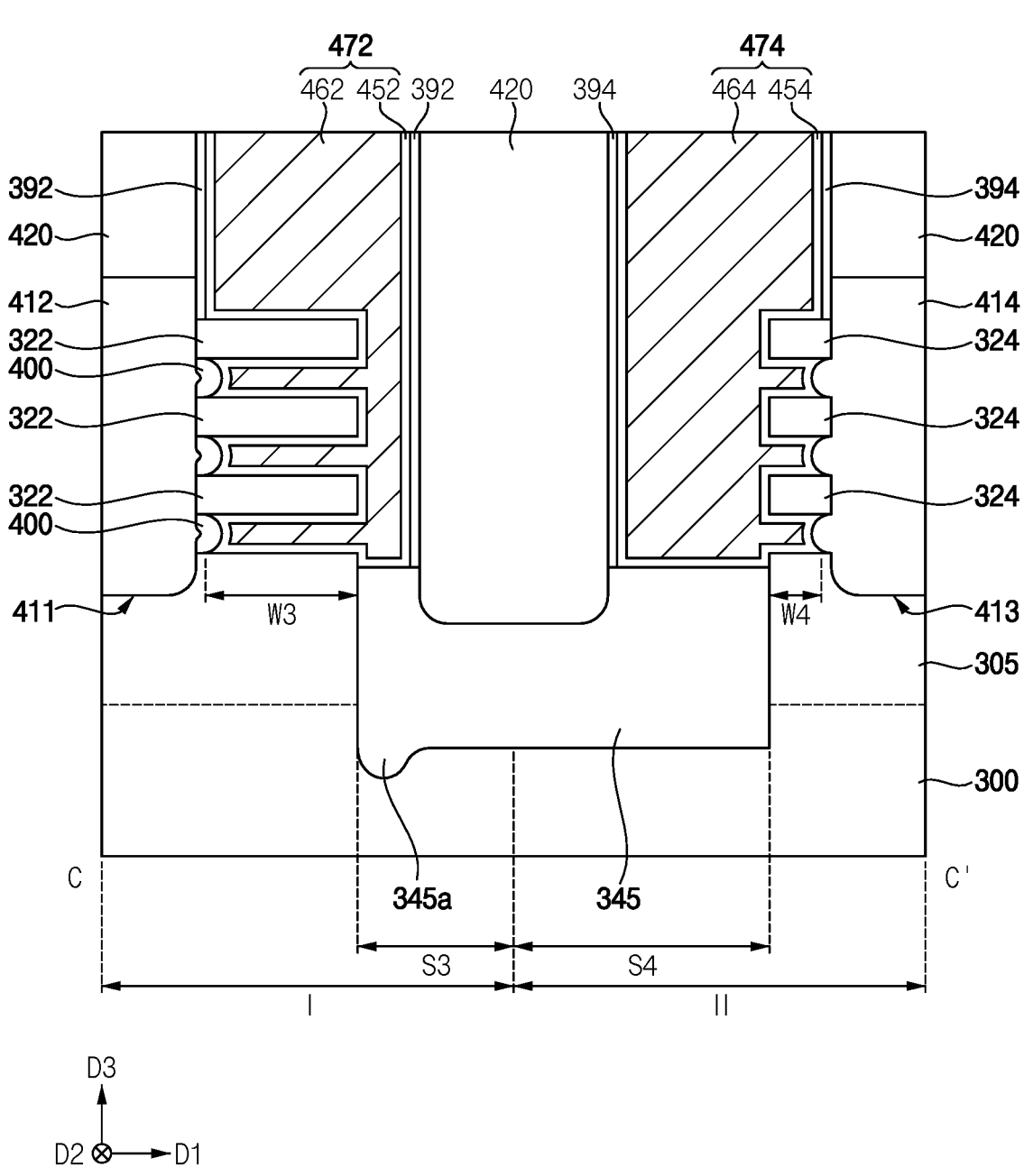
Figure 68:
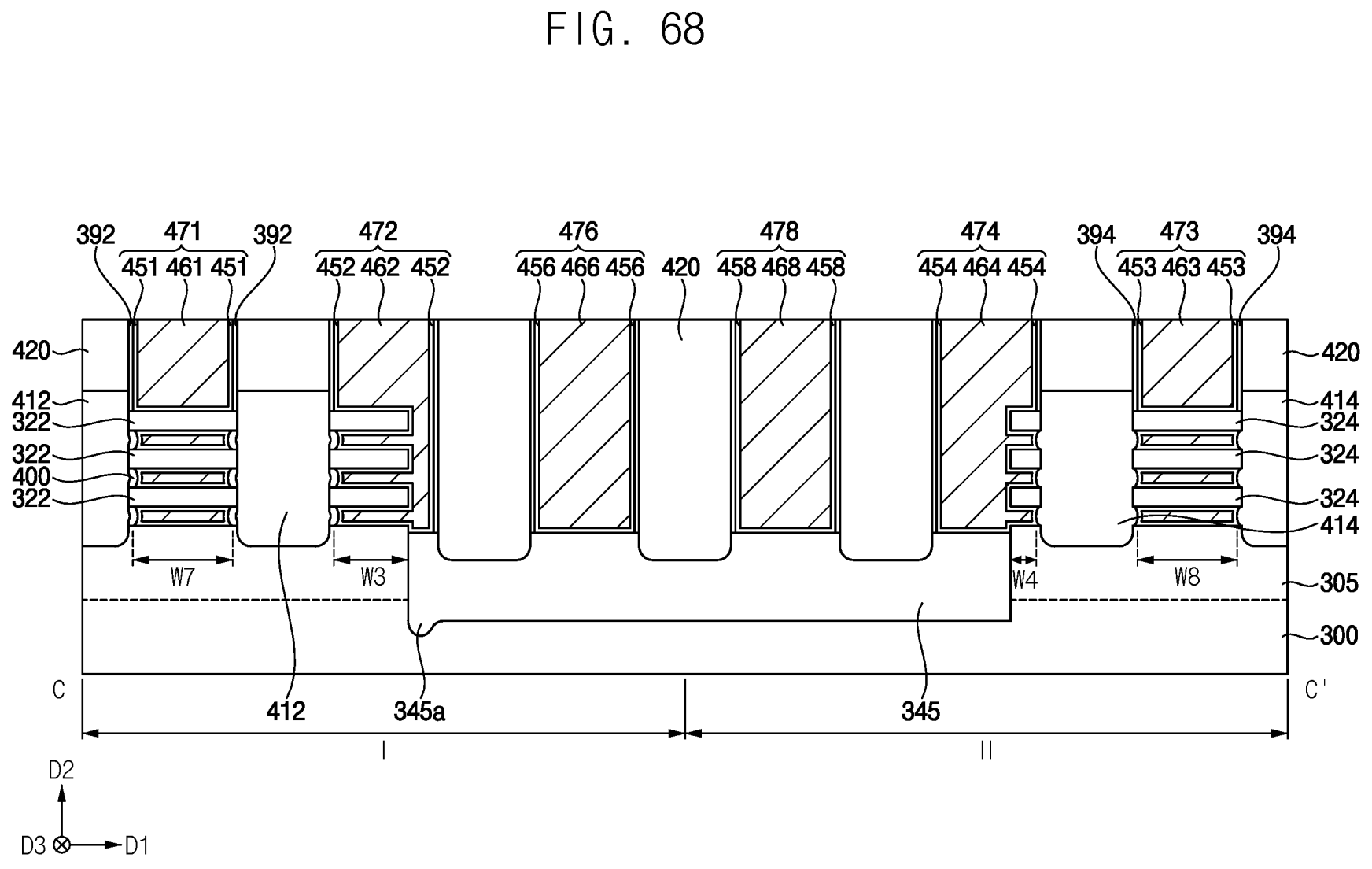

FIGS. 67 and 68 are cross-sectional views illustrating semiconductor devices in accordance with example embodiments, and may correspond to FIGS. 36 and 59, respectively.

This semiconductor device may be substantially the same as or similar to that of FIGS. 58 to 59, except for the shapes of the gate structure and the source/drain layer, and thus repeated explanations thereof are omitted herein.

Referring to FIG. 67, a portion of the fourth gate structure 474 between the second semiconductor patterns 324 may have a sidewall facing the fourth source/drain layer 414, which may be concave, and correspondingly, a sidewall of the fourth source/drain layer 414 facing the portion of the fourth gate structure 474 may be convex.

Thus, a sidewall in the first direction D1 of the fourth source/drain layer 414 may have an embossing shape in the third direction D3, and a width in the first direction D1 of the fourth source/drain layer 414 may vary in the third direction D3.

Referring to FIG. 68, a portion of the eighth gate structure 473 between the second semiconductor patterns 324 may have opposite sidewalls facing the fourth source/drain layers 414, respectively, which may be concave, and correspondingly, a sidewall of each of the fourth source/drain layers 414 facing the portion of the eighth gate structure 473 may be convex.

Thus, each of opposite sidewalls in the first direction D1 of the fourth source/drain layer 414 may have an embossing shape in the third direction D3, and a width in the first direction D1 of the fourth source/drain layer 414 may vary in the third direction D3.

Figure 69:
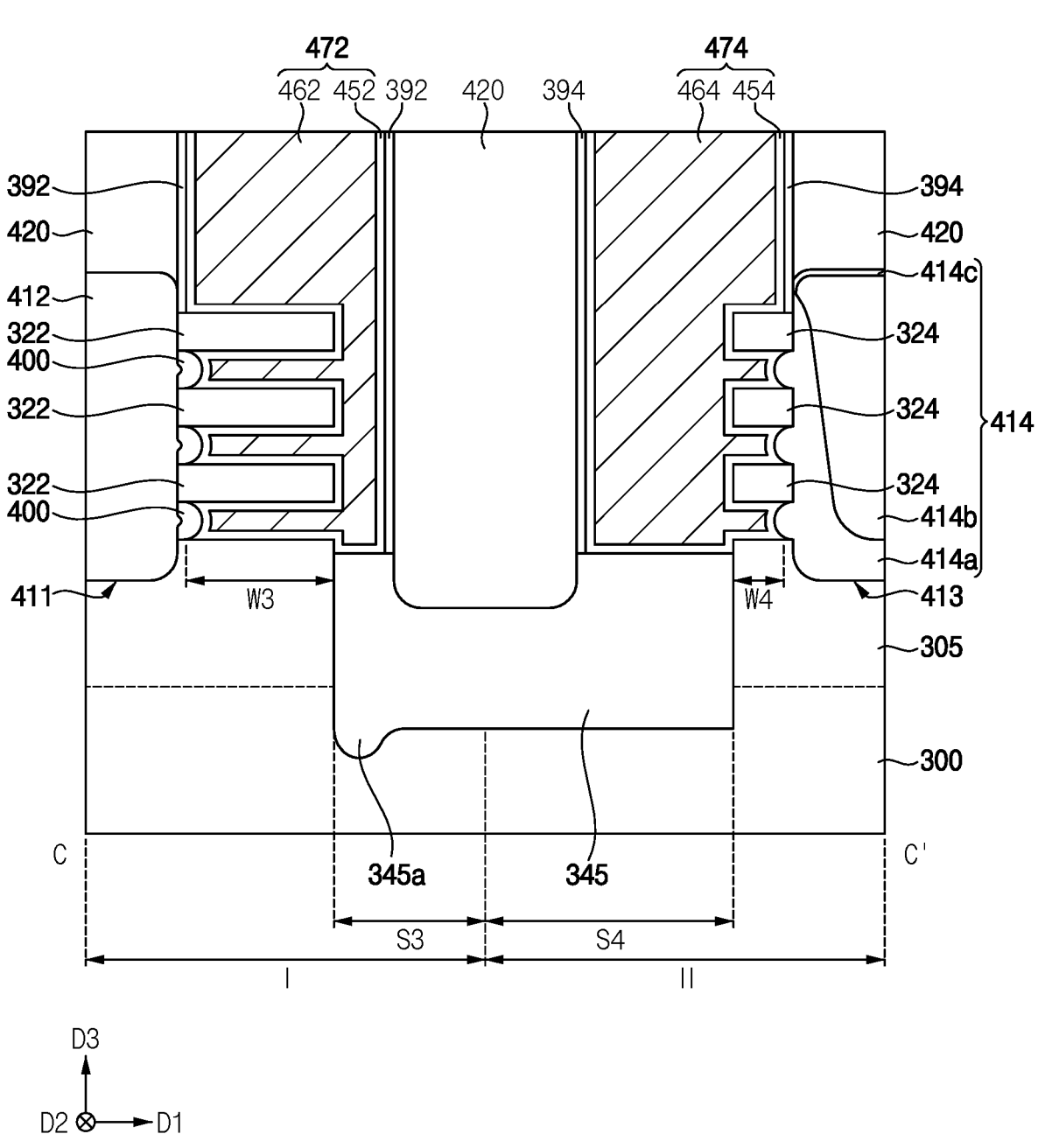
FIGS. 69 and 70 are cross-sectional views illustrating semiconductor devices in accordance with example embodiments.
Figure 70:
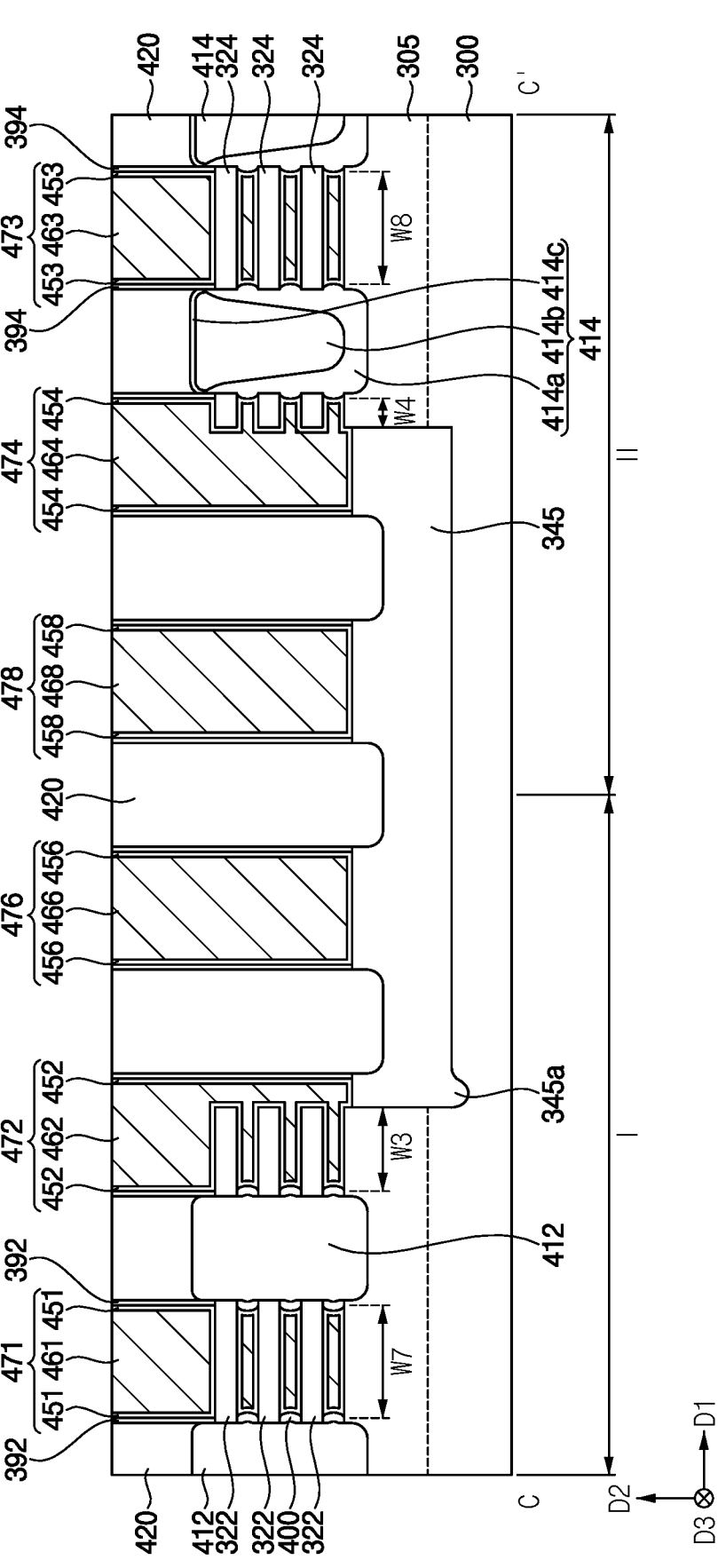

FIGS. 69 and 70 are cross-sectional views illustrating semiconductor devices in accordance with example embodiments, and may correspond to FIGS. 67 and 68, respectively.

These semiconductor devices may be substantially the same as or similar to that of FIGS. 67 to 68, except for the shape and structure of the source/drain layer, and thus repeated explanations thereof are omitted herein.

Referring to FIGS. 69 and 70, a cross-section in the first direction D1 of each of the third and fourth source/drain layers 412 and 414 may have a convex upper surface, and thus an upper surface of a central portion in the first direction D1 of each of the third and fourth source/drain layers 412 and 414 may be higher than upper surfaces of edge portions in the first direction D1 of each of the third and fourth source/drain layers 412 and 414.

In an example embodiment, the upper surface of the central portion of each of the third and fourth source/drain layers 412 and 414 may be substantially flat (e.g., planar), and a height of the upper surface of each of the edge portions of each of the third and fourth source/drain layers 412 and 414 may gradually decrease from the central portion toward an end thereof.

In example embodiments, the fourth source/drain layer 414 may include first, second and third epitaxial layers 414a, 414b and 414c sequentially stacked in the third direction D3. Each of the first and second epitaxial layers 414a and 414b may include silicon-germanium doped with p-type impurities, and the third epitaxial layer 414c may include undoped silicon or silicon doped with p-type impurities.

In an example embodiment, a concentration of germanium included in the second epitaxial layer 414b may be higher than a concentration of germanium included in the first epitaxial layer 414a, and a concentration of impurities included in the second epitaxial layer 414b may be higher than a concentration of impurities included in the first epitaxial layer 414a, however, aspects of the inventive concept may not be limited thereto.

Figure 71:
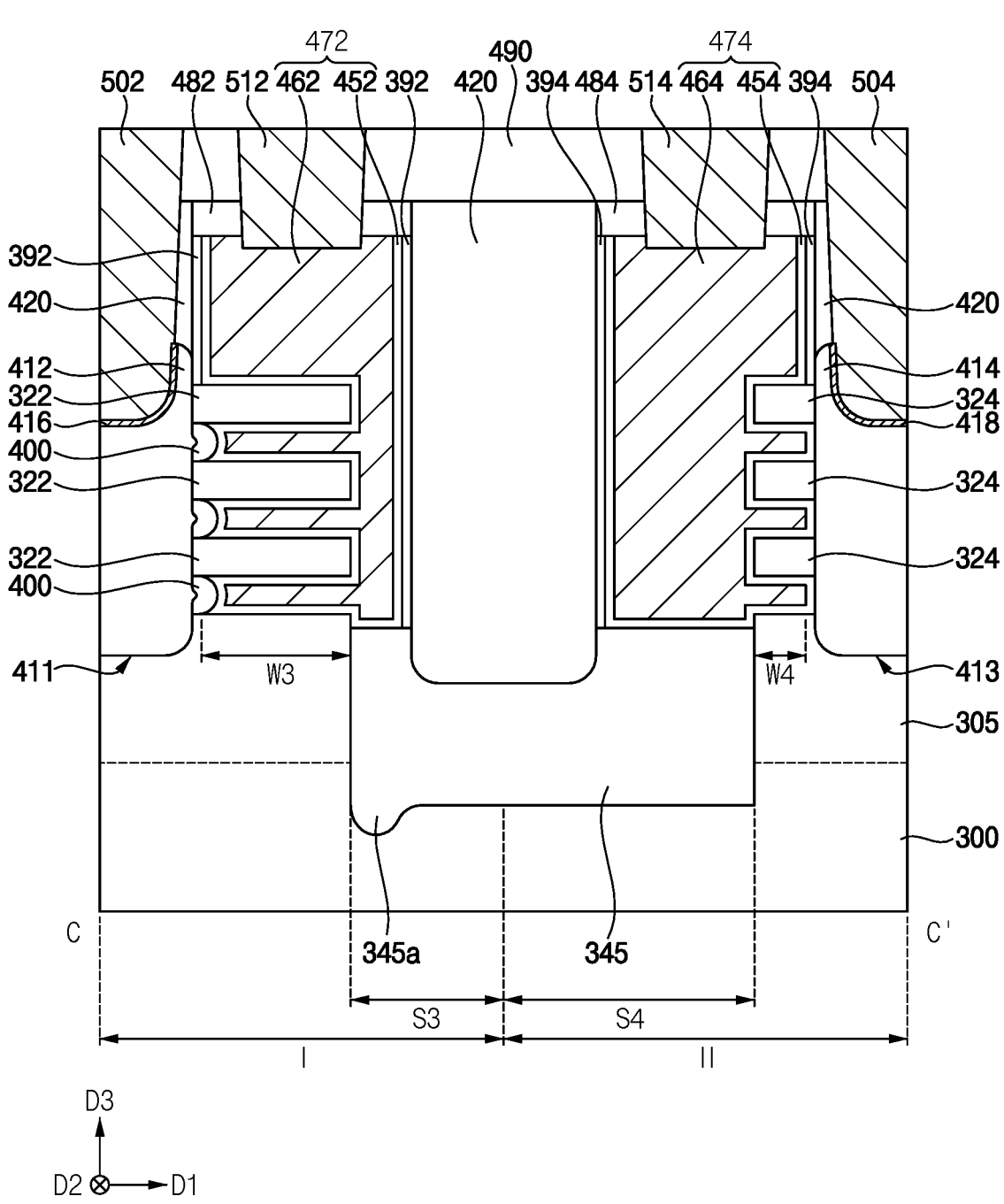
FIG. 71 is across-sectional view illustrating a semiconductor device in accordance with example embodiments.

FIG. 71 is a cross-sectional view illustrating a semiconductor device in accordance with example embodiments, and may correspond to FIG. 65.

This semiconductor device may be substantially the same as or similar to that of FIG. 65, except for the shape of the source/drain layer, and thus repeated explanations thereof are omitted herein.

Referring to FIG. 71, as in the semiconductor device shown in FIGS. 69 and 70, a cross-section in the first direction D1 of each of the third and fourth source/drain layers 412 and 414 may have a convex upper surface, and thus an upper surface of a central portion in the first direction D1 of each of the third and fourth source/drain layers 412 and 414 may be higher than upper surfaces of edge portions in the first direction D1 of each of the third and fourth source/drain layers 412 and 414.

The fifth and sixth contact plugs 502 and 504 may extend through upper portions, e.g., upper portions of the central portions in the first direction D1 of the third and fourth source/drain layers 412 and 414, respectively, and thus other upper portions, e.g., upper portions of at least one of opposite edge portions in the first direction D1 of the third and fourth source/drain layers 412 and 414 may be higher than bottom surfaces of the fifth and sixth contact plugs 502 and 504, respectively.

That is, an upper portion of the third source/drain layer 412 protruding from other portions thereof may be disposed between the third gate structure 472 and the fifth contact plug 502, and an upper portion of the fourth source/drain layer 414 protruding from other portions thereof may be disposed between the fourth gate structure 474 and the sixth contact plug 504.

In an example embodiment, a lower surface of each of the fifth and sixth contact plugs 502 and 504 may have a convex shape.

The semiconductor device in accordance with example embodiments may be used in various types of memory devices and systems. For example, the semiconductor device may be applied to CMOS transistors in logic devices, e.g., CPUs, MPUs, APs, etc. The semiconductor device may also be applied to CMOS transistors in volatile memory devices, e.g., DRAM devices, SRAM devices, etc., or non-volatile memory devices, e.g., flash memory devices, PRAM devices, MRAM devices, RRAM devices, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the aspects of the present inventive concept. Accordingly, all such modifications are intended to be included within the scope of the aspects of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:

first and second active fins on first and second regions, respectively, of a substrate;

an isolation pattern on a boundary between the first and second regions of the substrate and portions of the first and second regions of the substrate adjacent to the boundary, the isolation pattern separating the first and second active fins from each other;

a first gate structure on the first active fin and the isolation pattern on the first region of the substrate;

a second gate structure on the second active fin and the isolation pattern on the second region of the substrate;

a first source/drain layer on a portion of the first active fin adjacent to the first gate structure; and a second source/drain layer on a portion of the second active fin adjacent to the second gate structure, wherein a width of a portion of the first gate structure overlapping the first active fin in a vertical direction perpendicular to an upper surface of the substrate is greater than a width of a portion of the second gate structure overlapping the second active fin in the vertical direction.

2. The semiconductor device as claimed in claim 1, wherein the width of the portion of the first gate structure overlapping the first active fin in the vertical direction is greater than half a total width of the first gate structure.

3. The semiconductor device as claimed in claim 1, wherein the width of the portion of the second gate structure overlapping the second active fin in the vertical direction is less than half a total width of the second gate structure.

4. The semiconductor device as claimed in claim 1, wherein a first distance from the boundary to a first sidewall of a portion of the isolation pattern on the first region of the substrate is less than a second distance from the boundary to a second sidewall of a portion of the isolation pattern on the second region of the substrate.

5. The semiconductor device as claimed in claim 1, wherein a distance from the boundary to the first gate structure is equal to a distance from the boundary to the second gate structure.

6. The semiconductor device as claimed in claim 1, wherein the first source/drain layer includes silicon doped with n-type impurities or silicon carbide doped with n-type impurities, and the second source/drain layer includes silicon-germanium doped with p-type impurities.

7. The semiconductor device as claimed in claim 1, wherein a lowermost surface of a portion of the isolation pattern on the first region of the substrate is lower than a lowermost surface of a portion of the isolation pattern on the second region of the substrate.

8. The semiconductor device as claimed in claim 1, wherein a lowermost surface of a portion of the isolation pattern on the second region of the substrate is lower than a lowermost surface of a portion of the isolation pattern on the first region of the substrate.

9. The semiconductor device as claimed in claim 1, wherein a lowermost surface of a portion of the isolation pattern overlapping each of the first and second gate structures in the vertical direction is lower than a lowermost surface of a portion of the isolation pattern not overlapping each of the first and second gate structures in the vertical direction.

10. The semiconductor device as claimed in claim 1, wherein:

the first and second regions of the substrate are disposed in a first direction parallel to the upper surface of the substrate, the first and second active fins extend in the first direction on the first and second regions, respectively, of the substrate, and each of the first and second gate structures extends in a second direction parallel to the upper surface of the substrate and crossing the first direction.

11. The semiconductor device as claimed in claim 10, further comprising:

a third gate structure on the first active fin on the first region of the substrate, the third gate structure extending in the second direction; and a fourth gate structure on the second active fin on the second region of the substrate, the fourth gate structure extending in the second direction, wherein a width of a portion of the third gate structure overlapping the first active fin in the vertical direction is equal to a total width of the third gate structure, and wherein a width of a portion of the fourth gate structure overlapping the second active fin in the vertical direction is equal to a total width of the fourth gate structure.

12. The semiconductor device as claimed in claim 10, further comprising:

a first dummy gate structure on the isolation pattern on the first region of the substrate, the first dummy gate structure extending in the second direction; and a second dummy gate structure on the isolation pattern on the second region of the substrate, the second dummy gate structure extending in the second direction.

13. The semiconductor device as claimed in claim 10, wherein each of opposite sidewalls in the first direction of the isolation pattern has a convex shape from the boundary toward a central portion of each of the first and second regions of the substrate, in a plan view.

14. A semiconductor device, comprising:

first and second active fins on first and second regions, respectively, of a substrate, each of the first and second active fins extending in a first direction parallel to an upper surface of the substrate;

an isolation pattern on a boundary between the first and second regions of the substrate and portions of the first and second regions of the substrate adjacent to the boundary, the isolation pattern separating the first and second active fins from each other and having first and second sidewalls on the first and second regions, respectively, of the substrate, and the first and second sidewalls facing each other in the first direction;

a first gate structure extending in a second direction on the first active fin and the isolation pattern on the first region of the substrate, the second direction parallel to the upper surface of the substrate and crossing the first direction;

a second gate structure extending in the second direction on the second active fin and the isolation pattern on the second region of the substrate;

a first source/drain layer on a portion of the first active fin adjacent to the first gate structure; and a second source/drain layer on a portion of the second active fin adjacent to the second gate structure, wherein a distance in the first direction from the boundary to the first sidewall of the isolation pattern is less than a distance in the first direction from the boundary to the second sidewall of the isolation pattern.

15. The semiconductor device as claimed in claim 14, wherein a distance in the first direction from the boundary to the first gate structure is equal to a distance in the first direction from the boundary to the second gate structure.

16. The semiconductor device as claimed in claim 14, wherein widths in the first direction of the first and second gate structures are equal to each other.

17. The semiconductor device as claimed in claim 14, wherein a width of a portion of the first gate structure overlapping the first active fin in a vertical direction perpendicular to the upper surface of the substrate is greater than a width of a portion of the second gate structure overlapping the second active fin in the vertical direction.

18. The semiconductor device as claimed in claim 14, wherein the first source/drain layer includes silicon doped with n-type impurities or silicon carbide doped with n-type impurities, and the second source/drain layer includes silicon-germanium doped with p-type impurities.

19. A semiconductor device, comprising:

first and second active fins on first and second regions, respectively, of a substrate, each of the first and second active fins extending in a first direction parallel to an upper surface of the substrate;

an isolation pattern on a boundary between the first and second regions of the substrate and portions of the first and second regions of the substrate adjacent to the boundary, the isolation pattern separating the first and second active fins from each other and having first and second sidewalls on the first and second regions, respectively, of the substrate, and the first and second sidewalls facing each other in the first direction;

a first gate structure extending in a second direction on the first active fin and the isolation pattern on the first region of the substrate, the second direction parallel to the upper surface of the substrate and crossing the first direction;

a second gate structure extending in the second direction on the second active fin and the isolation pattern on the second region of the substrate;

a first source/drain layer on a portion of the first active fin adjacent to the first gate structure;

a second source/drain layer on a portion of the second active fin adjacent to the second gate structure;

36 a third gate structure on the first active fin on the first region of the substrate, the third gate structure extending in the second direction and being spaced apart from the first gate structure in the first direction;

a fourth gate structure on the second active fin on the second region of the substrate, the fourth gate structure extending in the second direction and being spaced apart from the second gate structure in the first direction;

a third source/drain layer on a portion of the first active fin adjacent to the third gate structure; and a fourth source/drain layer on a portion of the second active fin adjacent to the fourth gate structure, wherein a width of a portion of the first gate structure overlapping the first active fin in a vertical direction perpendicular to an upper surface of the substrate is greater than a width of a portion of the second gate structure overlapping the second active fin in the vertical direction.

20. The semiconductor device as claimed in claim 1, wherein:

the first gate structure is an active gate structure and wherein a portion of the first gate structure overlaps the isolation pattern in the vertical direction, the second gate structure is an active gate structure and wherein a portion of the second gate structure overlaps the isolation pattern in the vertical direction.

* * * * *